US009705069B2

(12) United States Patent
Matsuzawa et al.

(10) Patent No.: US 9,705,069 B2
(45) Date of Patent: Jul. 11, 2017

(54) SENSOR DEVICE, FORCE DETECTING DEVICE, ROBOT, ELECTRONIC COMPONENT CONVEYING APPARATUS, ELECTRONIC COMPONENT INSPECTING APPARATUS, AND COMPONENT MACHINING APPARATUS

(71) Applicant: Seiko Epson Corporation, Tokyo (JP)

(72) Inventors: Akira Matsuzawa, Shiojiri (JP); Toshiyuki Kamiya, Fujimi (JP); Hiroki Kawai, Matsumoto (JP)

(73) Assignee: Seiko Epson Corporation (JP)

( * ) Notice: Subject to any disclaimer, the term of this patent is extended or adjusted under 35 U.S.C. 154(b) by 281 days.

(21) Appl. No.: 14/522,902

(22) Filed: Oct. 24, 2014

(65) Prior Publication Data
US 2015/0120051 A1  Apr. 30, 2015

(30) Foreign Application Priority Data

Oct. 31, 2013 (JP) .................. 2013-226535
Mar. 18, 2014 (JP) .................. 2014-054501

(51) Int. Cl.
*H01L 41/113* (2006.01)
*G01L 1/16* (2006.01)
(Continued)

(52) U.S. Cl.
CPC ......... *H01L 41/1132* (2013.01); *B25J 13/085* (2013.01); *G01L 1/16* (2013.01); *G01L 5/226* (2013.01); *H01L 41/083* (2013.01)

(58) Field of Classification Search
CPC .............. H01L 41/0477; H01L 41/047; H01L 41/0472; H01L 41/0471; H01L 41/0475;
(Continued)

(56) References Cited

U.S. PATENT DOCUMENTS 2,636,134 A * 4/1953 Arons ................... G01L 1/16
                                                            257/417
4,786,837 A * 11/1988 Kalnin ................. B06B 1/0688
                                                            310/330

(Continued)

FOREIGN PATENT DOCUMENTS

JP     06-152307 A     5/1994
JP     2005-283587 A    10/2005
(Continued)

*Primary Examiner* — Michael A Lyons
*Assistant Examiner* — Philip Cotey
(74) *Attorney, Agent, or Firm* — Harness, Dickey & Pierce, P.L.C.

(57) ABSTRACT

A sensor device includes a charge output element including a plurality of piezoelectric bodies and an internal electrode formed between the piezoelectric bodies, a package that houses the charge output element, first conductive paste electrically connected to a plurality of the internal electrodes, and second conductive paste that electrically connects the first conductive paste and an output terminal and has a modulus of elasticity lower than a modulus of elasticity of the first conductive paste. A Young's modulus of the first conductive paste is equal to or higher than 3.4 GPa and equal to or lower than 5.0 GPa and a Young's modulus of the second conductive paste is equal to or higher than 0.1 GPa and equal to or lower than 0.2 GPa.

10 Claims, 24 Drawing Sheets

(51) Int. Cl.
*H01L 41/083* (2006.01)
*B25J 13/08* (2006.01)
*G01L 5/22* (2006.01)

(58) Field of Classification Search
CPC ..... H01L 41/1132; H01L 41/083; H01L 1/16; H01L 5/226; B25J 13/085; B25J 13/084
USPC .......... 700/258; 310/363, 338; 73/777, 767, 73/769
See application file for complete search history.

(56) References Cited

U.S. PATENT DOCUMENTS

| | | | |
|---|---|---|---|
| 4,802,371 A | 2/1989 | Calderara et al. | |
| 5,297,430 A | 3/1994 | Sonderegger et al. | |
| 5,365,140 A * | 11/1994 | Ohya | H01L 41/083 310/328 |
| 5,955,824 A * | 9/1999 | Saito | H04R 17/00 310/324 |
| 6,512,255 B2 | 1/2003 | Aoki et al. | |
| 8,436,514 B2 * | 5/2013 | Fukano | H03H 9/059 310/313 R |
| 2005/0200243 A1 * | 9/2005 | Spangler | F16F 15/005 310/338 |
| 2005/0229691 A1 * | 10/2005 | Shaw | B60C 23/0488 73/146 |
| 2006/0232164 A1 * | 10/2006 | Kondo | G10K 11/02 310/322 |
| 2007/0008642 A1 * | 1/2007 | Kuwahata | G01P 15/0891 360/75 |
| 2007/0199376 A1 * | 8/2007 | Cavalloni | G01L 1/16 73/167 |
| 2008/0192584 A1 * | 8/2008 | Yamazaki | H01L 41/0906 368/168 |
| 2009/0200471 A1 * | 8/2009 | Kawakubo | G01J 5/02 250/338.3 |
| 2010/0060966 A1 * | 3/2010 | Cheong | G02B 26/0858 359/221.2 |
| 2011/0182450 A1 * | 7/2011 | Chung | H04R 17/005 381/190 |
| 2011/0193363 A1 * | 8/2011 | Nishiwaki | B25J 13/083 294/86.4 |
| 2012/0055257 A1 * | 3/2012 | Shaw-Klein | H01L 41/081 73/780 |
| 2012/0147708 A1 * | 6/2012 | Lee | G01S 15/04 367/180 |
| 2012/0204656 A1 * | 8/2012 | Suzuki | G01L 1/162 73/862.59 |
| 2012/0319418 A1 * | 12/2012 | Nishiwaki | B66C 1/445 294/207 |
| 2013/0112010 A1 | 5/2013 | Matsumoto et al. | |
| 2013/0265371 A1 * | 10/2013 | Yazaki | B41J 2/14274 347/70 |

FOREIGN PATENT DOCUMENTS

| | | |
|---|---|---|
| JP | 2008-066921 A | 3/2008 |
| JP | 2008-295031 A | 12/2008 |
| JP | 2009-010153 A | 1/2009 |
| JP | 2010-073907 A | 4/2010 |
| JP | 2010-219876 A | 9/2010 |
| JP | 2013-038672 A | 2/2013 |
| JP | 2013-101020 A | 5/2013 |
| JP | 2013-181788 A | 9/2013 |
| JP | 2013-257267 A | 12/2013 |

* cited by examiner

SENSOR DEVICE, FORCE DETECTING DEVICE, ROBOT, ELECTRONIC COMPONENT CONVEYING APPARATUS, ELECTRONIC COMPONENT INSPECTING APPARATUS, AND COMPONENT MACHINING APPARATUS

The entire disclosures of Japanese Patent Application Nos. 2013-226535, filed Oct. 31, 2013 and 2014-054501, filed Mar. 18, 2014 are expressly incorporated by reference herein.

BACKGROUND

1. Technical Field

The present invention relates to a sensor device, a force detecting device, a robot, an electronic component conveying apparatus, an electronic component inspecting apparatus, and a component machining apparatus.

2. Related Art

In recent years, for the purpose of improvement of productivity, industrial robots have been introduced into production facilities such as factories. Such an industrial robot includes an arm movable in one axial direction or a plurality of axial directions and an end effector such as a hand, an instrument for component inspection, or an instrument for component conveyance attached to an arm distal end side. The industrial robot can execute component assembly work, component machining work, component manufacturing work, component conveyance work, component inspection work, and the like.

In the industrial robot, for example, a force detecting device is provided between the arm and the end effector. As the force detecting device used in the industrial robot, for example, a force detecting device disclosed in JP-A-2013-101020 is used. An element of the force detecting device described in JP-A-2013-101020 includes a laminated body configured by a plurality of piezoelectric boards and a plurality of internal electrodes provided among the piezoelectric boards. On a side surface of the laminated body, a wire electrically connected to side surfaces of the internal electrodes is provided. The wire is formed of, for example, conductive paste and connected to an external circuit or the like.

For example, some industrial robot (machine tool) that applies machining to a base material such as an aluminum plate incorporates a force detecting device that detects force applied to the base material when the machining is applied (see, for example, JP-A-2013-257267. JP-A-2013-257267 describes a force detecting device including a piezoelectric element and a housing that houses the piezoelectric element. The piezoelectric element is sandwiched by two pressurizing plates included in the housing.

In the force detecting device described in JP-A-2013-257267, when an external force is applied to the pressurizing plates, the external force is transmitted to the piezoelectric element. The piezoelectric element can output charges corresponding to the external force and detect the applied external force on the basis of the charges. In the force detecting device, in general, the piezoelectric element and the housing are connected by wire bonding using a copper wire or the like and the piezoelectric element is earthed.

However, in the element of the force detecting device described in JP-A-2013-101020, since the internal electrodes are relatively thin, it is likely that the internal electrodes are not sufficiently electrically connected to the wire.

Further, it is likely that, when stress occurs, the conductive paste is ruptured (disconnected) by the stress.

Further, in the connection by the wire bonding in the force detecting device described in JP-A-2013-257267, in particular, when the copper wire and the like is soldered and joined, it is likely that the copper wire is ruptured (disconnected) by vibration or the like caused by an external force applied to the force detecting device to cause a connection failure.

In this way, it is likely that the disconnection of the conductive paste, the disconnection of a portion connected by the wire bonding, and the like occur. Therefore, it is difficult to provide a sensor device, a force detecting device, a robot, an electronic component conveying apparatus, an electronic component inspecting apparatus, and a component machining apparatus having high reliability.

SUMMARY

An advantage of some aspects of the invention is to solve at least a part of the problems described above, and the invention can be implemented as the following forms or application examples.

Application Example 1

A sensor device according to this application example includes: a plurality of piezoelectric bodies; an internal electrode formed between the plurality of piezoelectric bodies; a package including an output terminal and configured to house the piezoelectric bodies; a first conductive member electrically connected to a plurality of the internal electrodes; and a second conductive member configured to electrically connect the first conductive member and the output terminal and having a modulus of elasticity lower than the modulus of elasticity of the first conductive member.

With this configuration, even when stress occurs in the conductive members, the second conductive member having the low modulus of elasticity can absorb the stress. Therefore, it is possible to suppress or prevent the conductive members from being ruptured. As a result, it is possible to obtain the sensor device having high reliability.

Application Example 2

In the sensor device according to the application example described above, it is preferable that the Young's modulus of the first conductive member is equal to or higher than 3.4 GPa and equal to or lower than 5.0 GPa, and the Young's modulus of the second conductive member is equal to or higher than 0.1 GPa and equal to or lower than 0.2 GPa.

With this configuration, even when stress occurs in the conductive members, the second conductive member having the low modulus of elasticity can absorb the stress. Therefore, it is possible to effectively suppress or prevent the conductive members from being ruptured.

Application Example 3

In the sensor device according to the application example described above, it is preferable that the first conductive member and the second conductive member are formed of paste like materials including fillers having electric conductivity, and the content percentage of the filler of the first conductive member is larger than the content percentage of the filler of the second conductive member.

With this configuration, it is possible to surely electrically connect the first conductive member and the internal electrode.

Application Example 4

In the sensor device according to the application example described above, it is preferable that the internal electrode is formed in a film shape, and the thickness of the internal electrode is equal to or larger than 20 nm and equal to or smaller than 100 nm.

With this configuration, it is possible to attain a reduction in the size of the sensor device.

Application Example 5

In the sensor device according to the application example described above, it is preferable that the package includes a recess in which the piezoelectric bodies are housed and the depth of which changes stepwise, the recess including a step section in which the output terminal is provided, and the second conductive member is connected to the step section.

With this configuration, it is possible to increase a contact area of the second conductive member and the package as much as possible. Therefore, it is possible to surely bond the second conductive member and the package.

Application Example 6

A force detecting device according to this application example includes: a sensor device including: a plurality of piezoelectric bodies; an internal electrode formed between the plurality of piezoelectric bodies; a package including an output terminal and configured to house the piezoelectric bodies; a first conductive member electrically connected to a plurality of the internal electrodes; and a second conductive member configured to electrically connect the first conductive member and the output terminal and having a modulus of elasticity lower than the modulus of elasticity of the first conductive member; and an external-force detection circuit configured to detect, on the basis of a voltage output from the sensor device, an external force applied to the sensor device.

With this configuration, even when stress occurs in the conductive members, the second conductive member having the low modulus of elasticity can absorb the stress. Therefore, it is possible to suppress or prevent the conductive members from being ruptured. As a result, it is possible to obtain the force detecting device having high reliability.

Application Example 7

A robot according to this application example includes: at least one arm coupling body including a plurality of arms and configured by turnably coupling the arms adjacent to one another of the plurality of arms; an end effector provided on the distal end side of the arm coupling body; and the force detecting device according to the application example 6 provided between the arm coupling body and the end effector and configured to detect an external force applied to the end effector.

With this configuration, it is possible to obtain effects same as the effects of the force detecting device according to the application example 6. It is possible to feed back the external force detected by the force detecting device and more precisely execute work. Further, it is possible to detect, according to the external force detected by the force detecting device, for example, contact of the end effector with an obstacle. Therefore, it is possible to easily perform an obstacle avoiding operation, an obstacle damage avoiding operation, and the like, which are difficult in position control in the past, and more safely execute work.

Application Example 8

An electronic component conveying apparatus according to this application example includes: a gripping section configured to grip an electronic component; and the force detecting device according to the application example 6 configured to detect an external force applied to the gripping section.

With this configuration, it is possible to obtain effects same as the effects of the force detecting device according to the application example 6. It is possible to feed back the external force detected by the force detecting device and more precisely execute work. Further, it is possible to detect, according to the external force detected by the force detecting device, for example, contact of the gripping section with an obstacle. Therefore, it is possible to easily perform an obstacle avoiding operation, an obstacle damage avoiding operation, and the like, which are difficult in position control in the past, and more safely execute electronic component conveyance work.

Application Example 9

An electronic component inspecting apparatus according to this application example includes: a griping section configured to grip an electronic component; an inspecting section configured to inspect the electronic component; and the force detecting device according to the application example 6 configured to detect an external force applied to the gripping section.

With this configuration, it is possible to obtain effects same as the effects of the force detecting device according to the application example 6. It is possible to feed back the external force detected by the force detecting device and more precisely execute work. Further, it is possible to detect, according to the external force detected by the force detecting device, for example, contact of the gripping section with an obstacle. Therefore, it is possible to easily perform an obstacle avoiding operation, an obstacle damage avoiding operation, and the like, which are difficult in position control in the past, and more safely execute electronic component inspection work.

Application Example 10

A component machining apparatus according to this application example includes: a tool displacing section configured to be mounted with a tool and displace the tool; and the force detecting device according to the application example 6 configured to detect an external force applied to the tool.

With this configuration, it is possible to obtain effects same as the effects of the force detecting device according to the application example 6. By feeding back the external force detected by the force detecting device, the component machining apparatus can more precisely execute component machining work. Further, the component machining apparatus can detect, according to the external force detected by the force detecting device, for example, contact of the tool with an obstacle. Therefore, the component machining apparatus can immediately stop when an obstacle or the like comes into contact with the tool. The component machining apparatus can execute safer electronic component machining work.

Application Example 11

A force detecting device according to this application example includes: a first base section (a first board) having electric conductivity; a piezoelectric element configured to output charges according to an external force; a conductive section located between the piezoelectric element and the first base section and having electric conductivity; a ground electrode provided in the piezoelectric element; and a wiring section configured to electrically connect the ground electrode and the conductive section.

With this configuration, for example, even if the piezoelectric element is deformed (varies), it is possible to suitably prevent or suppress the wiring section from being ruptured (disconnected) and reduce occurrence of a connection failure.

Application Example 12

In the force detecting device according to the application example described above, it is preferable that the wiring section includes a portion provided between the piezoelectric element and the conductive section.

With this configuration, even if the piezoelectric element is deformed, it is possible to suitably prevent or suppress the wiring section from being ruptured and reduce, in particular, occurrence of a connection failure.

Application Example 13

In the force detecting device according to the application example described above, it is preferable that the force detecting device further includes a second base section (a second board), and the piezoelectric element includes a pressurizing member having electric conductivity located between the first base section and the second base section and configured to fix the first base section and the second base section to pressurize the piezoelectric element.

With this configuration, it is possible to more surely protect the piezoelectric element. Further, for example, even if the piezoelectric element is deformed, it is possible to suitably prevent or suppress the wiring section from being ruptured and further reduce occurrence of a connection failure.

Application Example 14

In the force detecting device according to the application example described above, it is preferable that the second base section has electric conductivity.

With this configuration, it is possible to set the potential of the other board (the first base section) as reference potential of the piezoelectric element.

Application Example 15

In the force detecting device according to the application example described above, it is preferable that the piezoelectric element includes quartz.

With this configuration, the force detecting device is configured as an apparatus that is less easily affected by fluctuation in temperature and stable for a long period. Therefore, it is possible to accurately detect an external force.

Application Example 16

In the force detecting device according to the application example described above, it is preferable that the force detecting device further includes a supporting section including a recess in which the piezoelectric element is arranged, and the conductive section is joined to the supporting section to seal the recess.

With this configuration, it is possible to more surely protect the piezoelectric element. Further, even if the piezoelectric element is deformed, it is possible to suitably prevent or suppress the wiring section from being ruptured and reduce occurrence of a connection failure.

Application Example 17

In the force detecting device according to the application example described above, it is preferable that the wiring section includes a portion provided in the supporting section.

With this configuration, for example, even if the piezoelectric element is deformed, it is possible to suitably prevent or suppress the wiring section from being ruptured and further reduce occurrence of a connection failure.

Application Example 18

In the force detecting device according to the application example described above, it is preferable that the force detecting device further includes a wiring board including a grounding wire, and the wiring section is electrically connected to the grounding wire.

With this configuration, it is possible to earth both of the piezoelectric element and the wiring board through one route and attain simplification of structure.

Application Example 19

A robot according to this application example includes: an arm; an end effector provided in the arm; and a force detecting device provided between the arm and the end effector and detecting an external force applied to the end effector. The force detecting device includes: a first base section having electric conductivity; a piezoelectric element configured to output charges according to an external force; a conductive section located between the piezoelectric element and the first base section and having electric conductivity; a ground electrode provided in the piezoelectric element; and a wiring section configured to electrically connect the ground electrode and the conductive section.

With this configuration, it is possible to provide the robot in which likelihood of occurrence of a connection failure is reduced. Therefore, with such a robot, it is possible to accurately detect an external force and properly perform work by the end effector.

BRIEF DESCRIPTION OF THE DRAWINGS

The invention will be described with reference to the accompanying drawings, wherein like numbers reference like elements.

FIGS. 6A and 6B are plan views showing the electrode layer and a ground electrode layer of the charge output element shown in FIG. 1, wherein FIG. 6A is a plan view showing the electrode layer and FIG. 6B is a plan view showing the ground electrode layer.

DESCRIPTION OF EXEMPLARY EMBODIMENTS

A sensor device, a force detecting device, a robot, an electronic component conveying apparatus, an electronic component inspecting apparatus, and a component machining apparatus in embodiments of the invention are explained below with reference to the drawings.

First Embodiment

Figure 1:
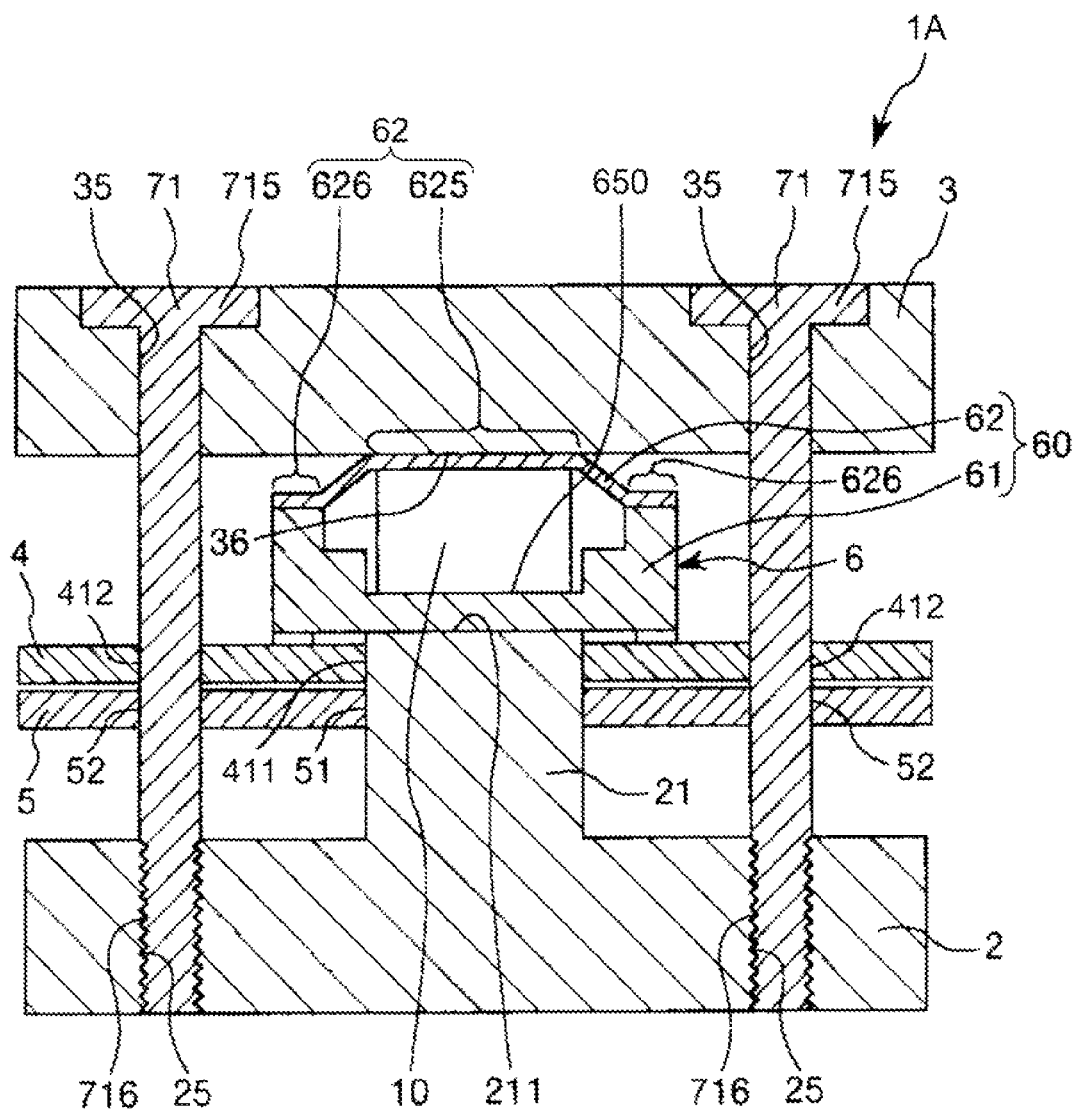
FIG. 1 is a sectional view showing a force detecting device (a sensor device) in a first embodiment of the invention.
Figure 2:
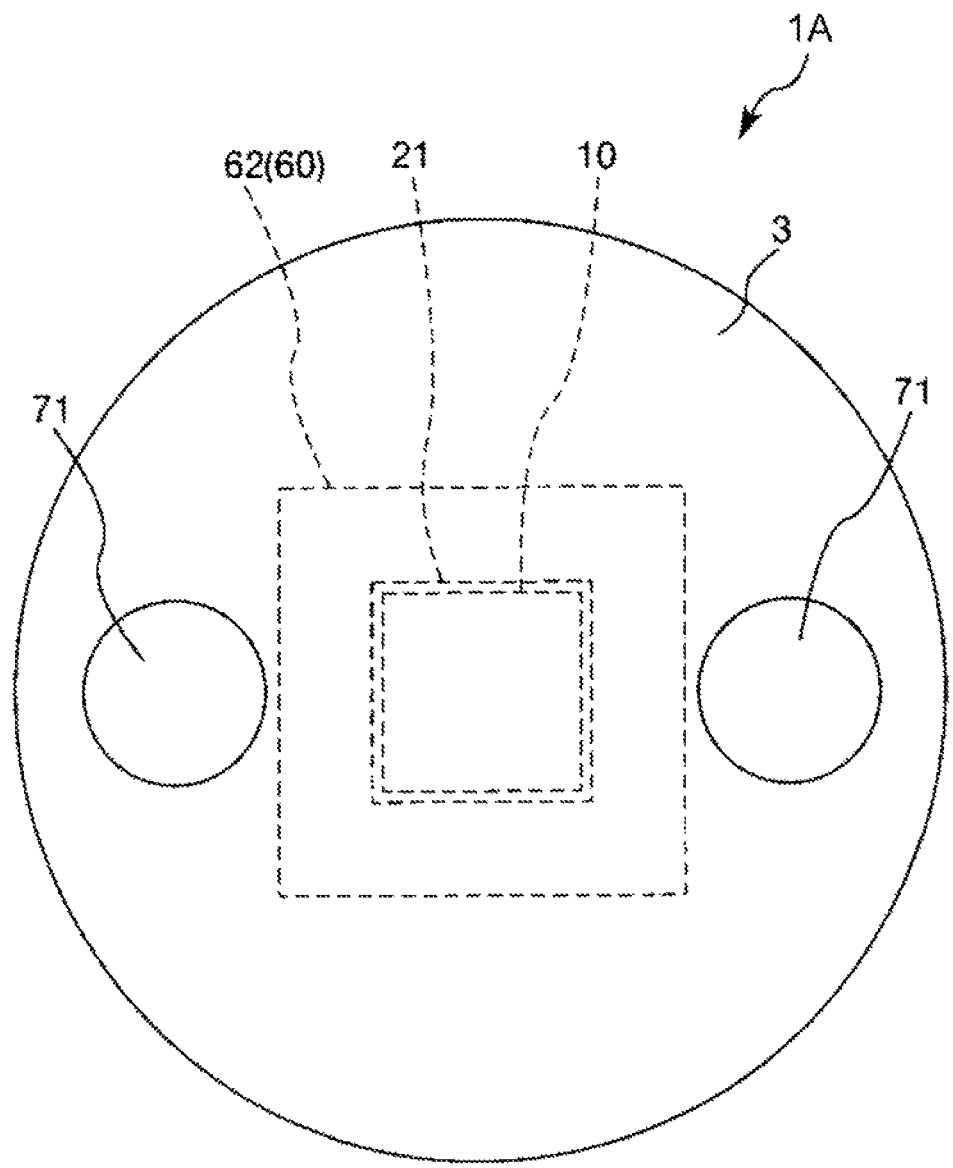
FIG. 2 is a plan view of the force detecting device shown in FIG. 1.
Figure 3:
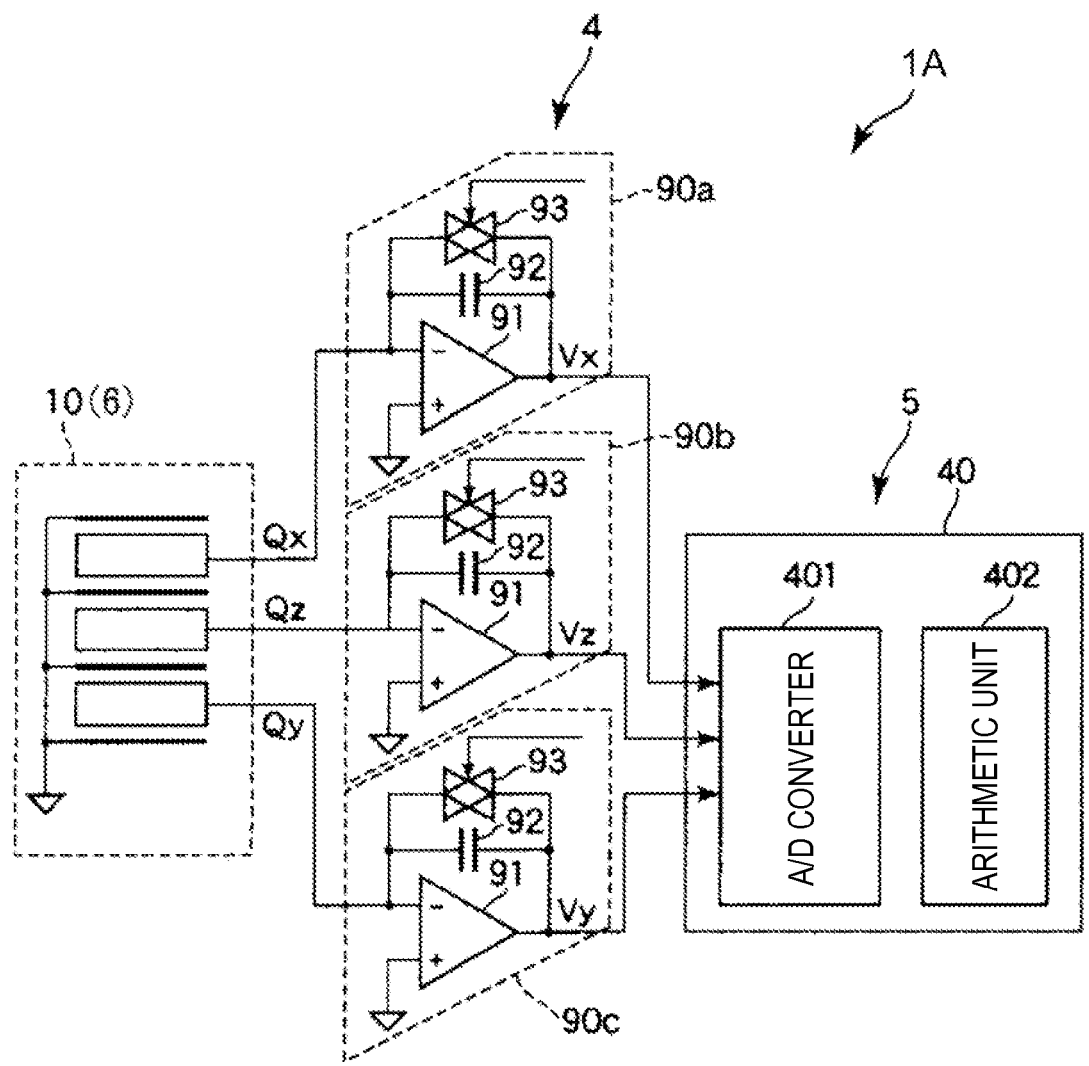
FIG. 3 is a circuit diagram schematically showing the force detecting device shown in FIG. 1.
Figure 4:
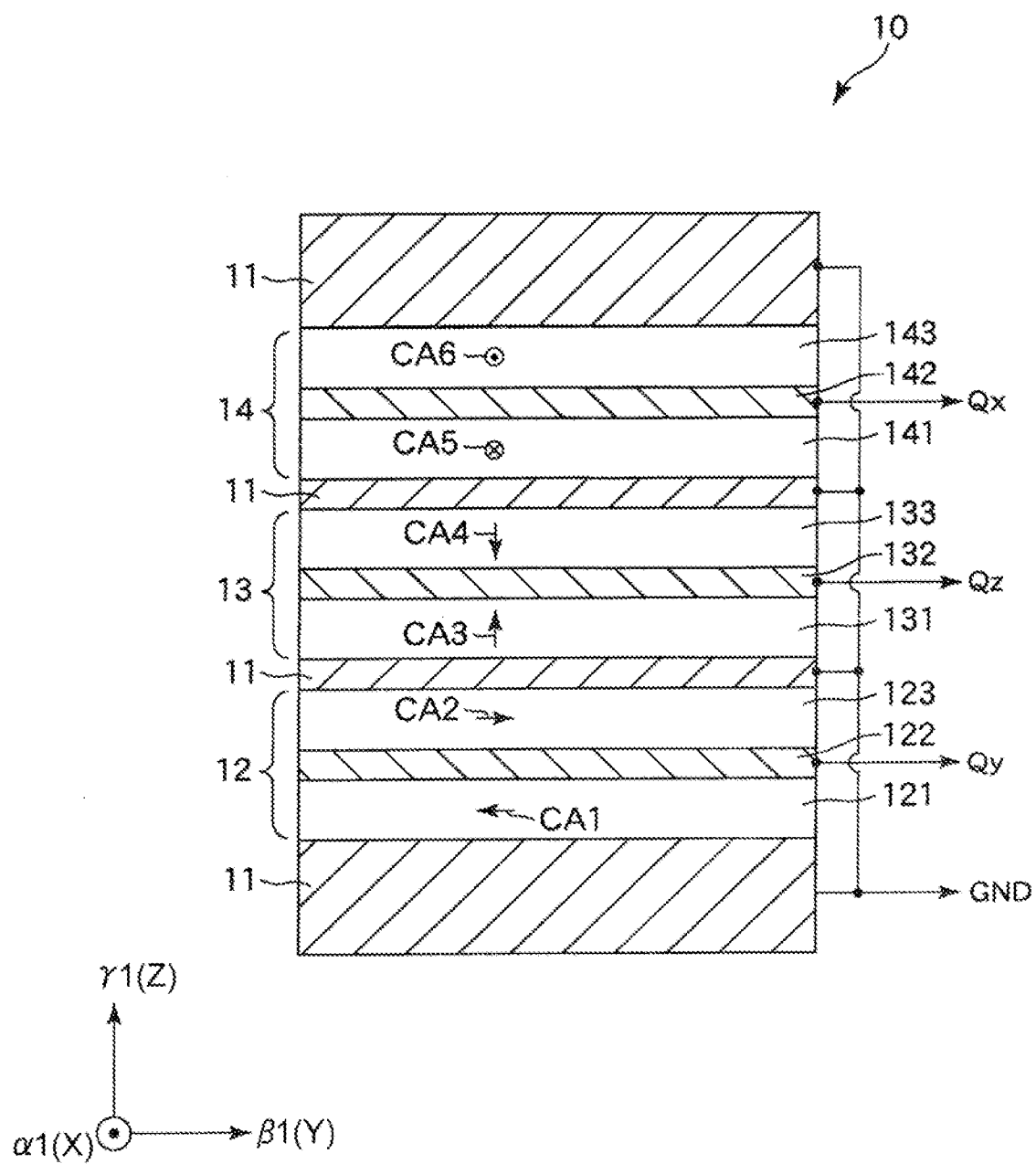
FIG. 4 is a sectional view schematically showing a charge output element of the force detecting device shown in FIG. 1.
Figure 5A:
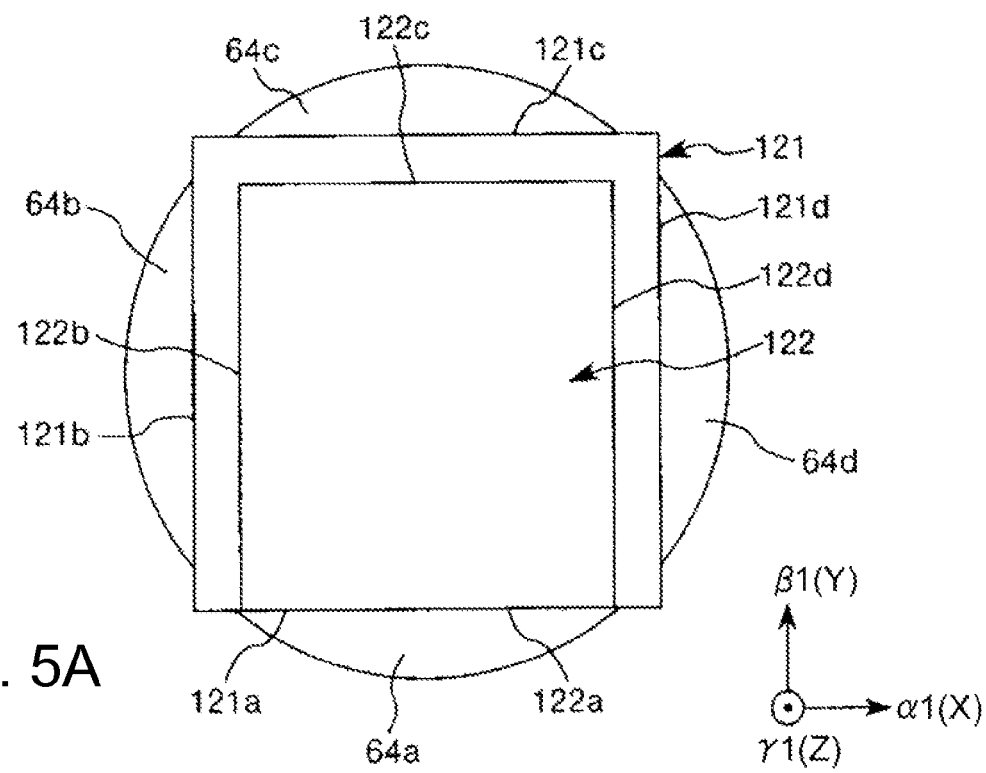
FIGS. 5A and 5B are plan views showing an output electrode layer of the charge output element shown in FIG. 1.
Figure 5B:
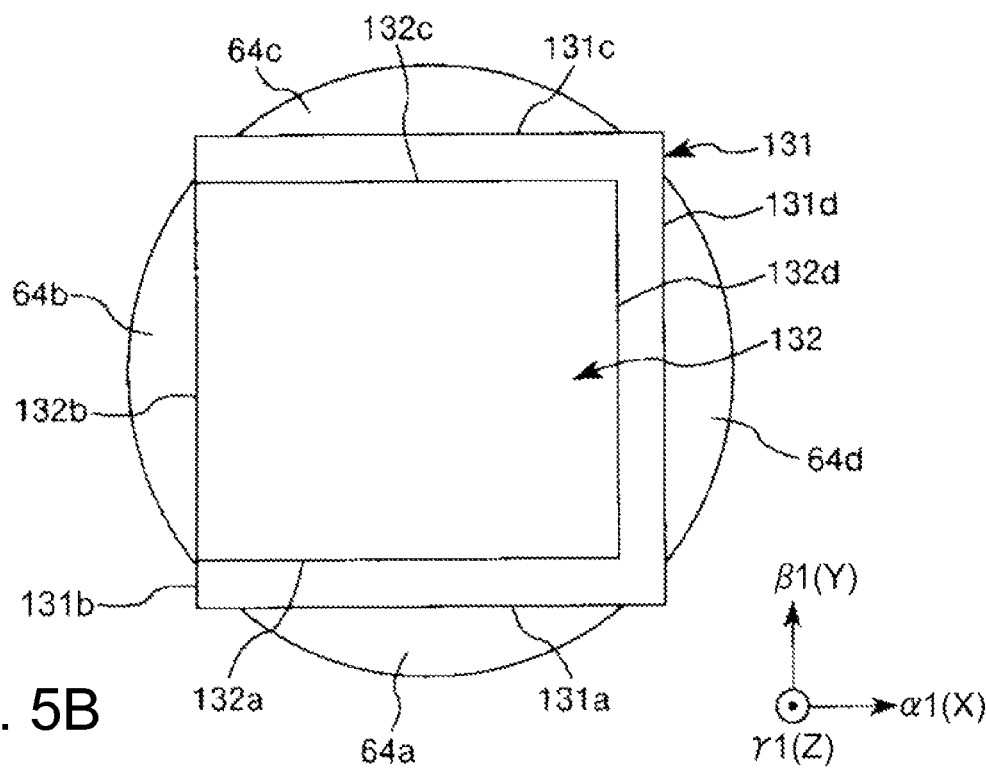
Figure 6A:
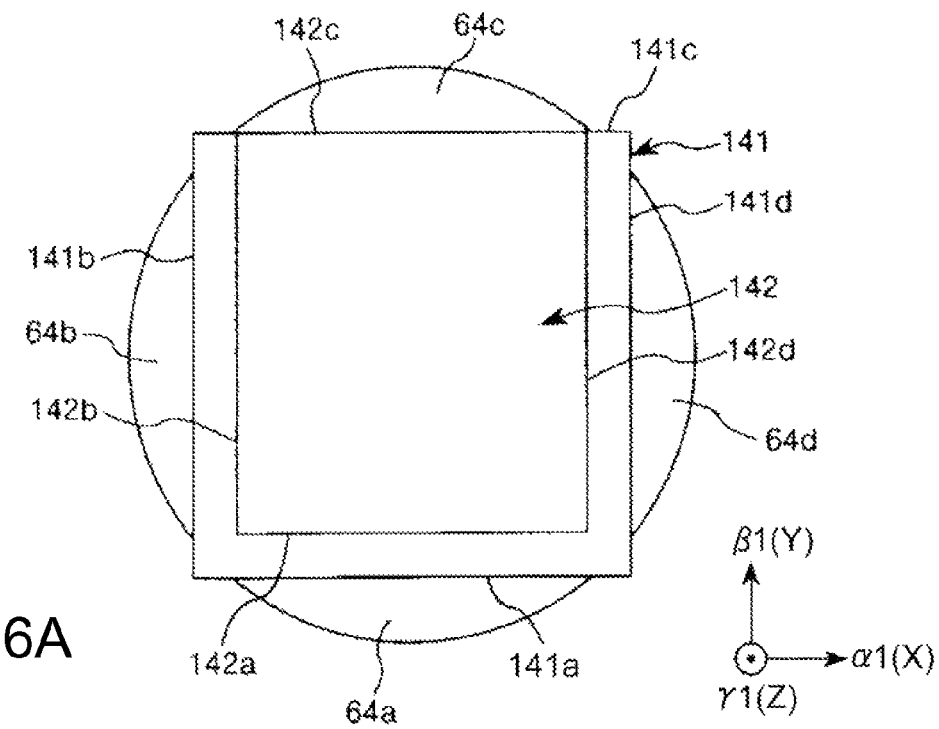
Figure 6B:
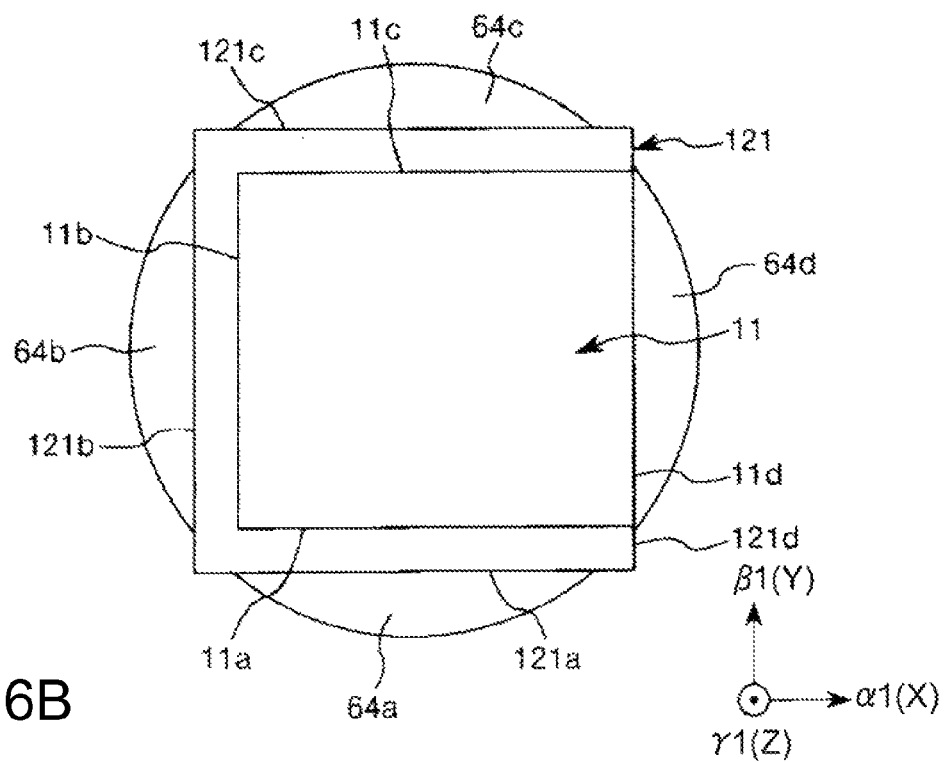
Figure 7:
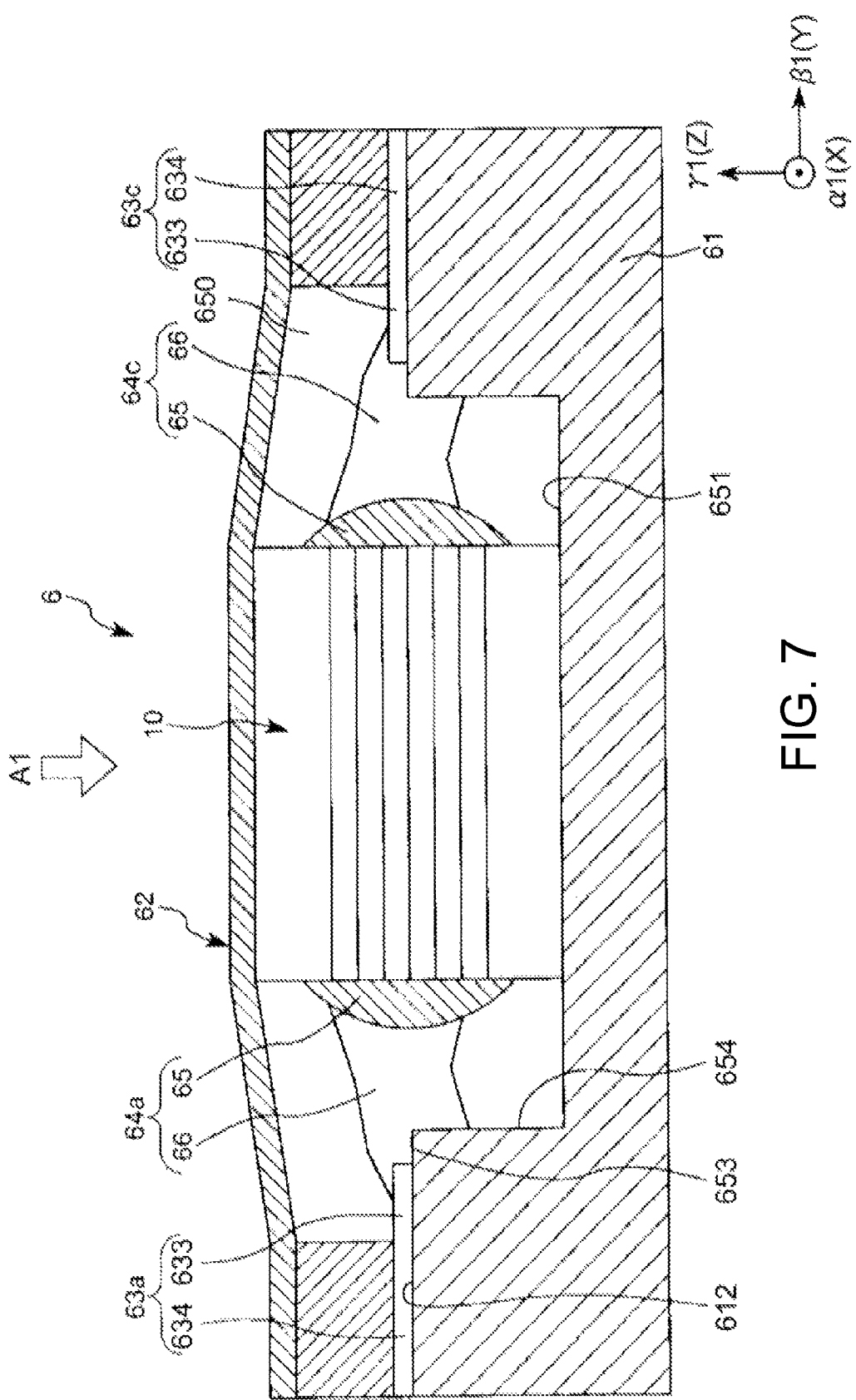
FIG. 7 is a sectional view showing the sensor device shown in FIG. 1.
Figure 8:
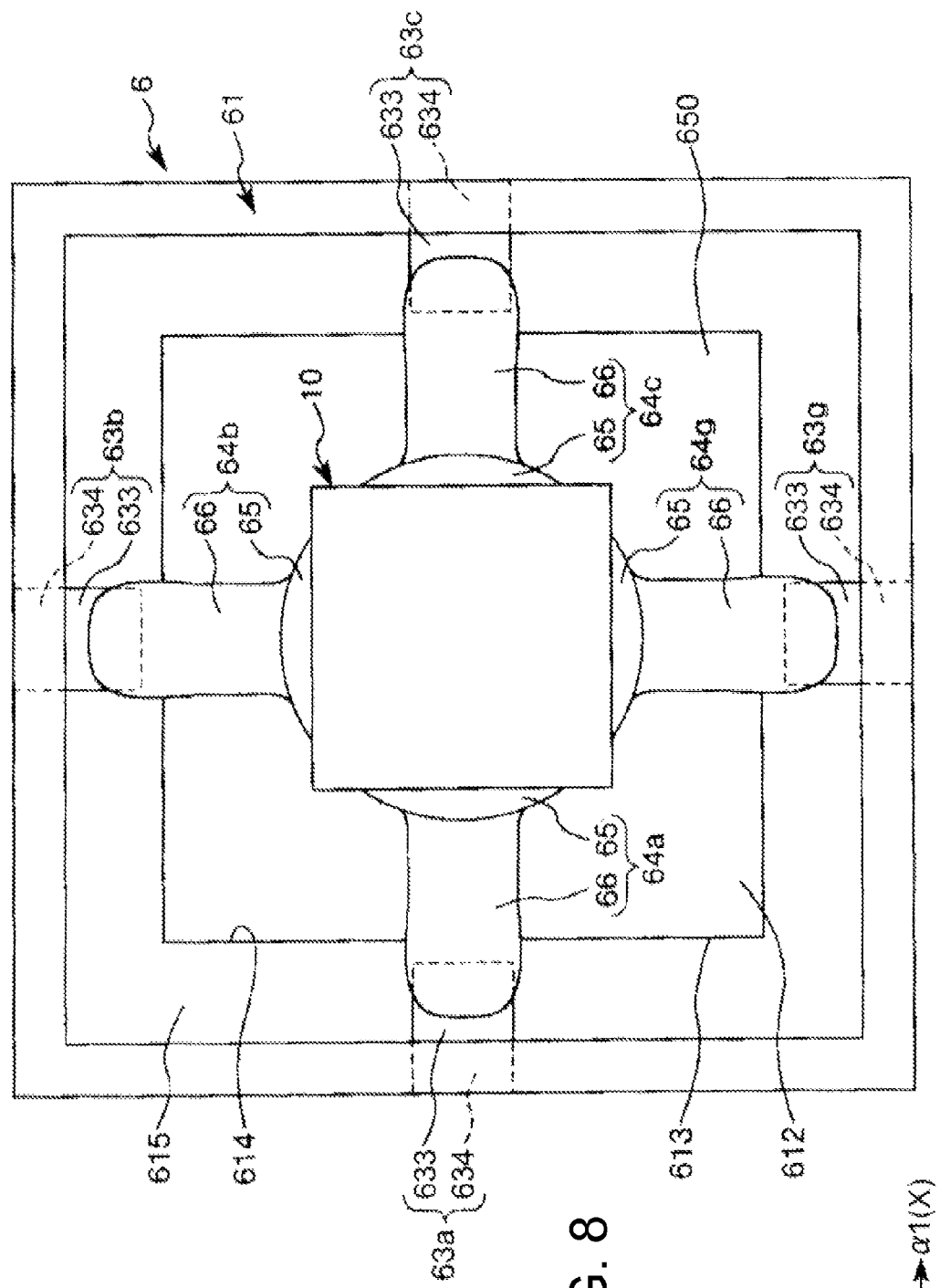
FIG. 8 is a diagram of the sensor device viewed from an arrow A1 direction in FIG. 7.

FIG. 1 is a sectional view showing a force detecting device (a sensor device) in a first embodiment of the invention. FIG. 2 is a plan view of the force detecting device shown in FIG. 1. FIG. 3 is a circuit diagram schematically showing the force detecting device shown in FIG. 1. FIG. 4 is a sectional view schematically showing a charge output element of the force detecting device shown in FIG. 1. FIGS. 5A and 5B are plan views showing an electrode layer of the charge output element shown in FIG. 1. FIGS. 6A and 6B are plan views showing the electrode layer and a ground electrode layer of the charge output element shown in FIG. 1, wherein FIG. 6A is a plan view showing the electrode layer and FIG. 6B is a plan view showing the ground layer. FIG. 7 is a sectional view showing the sensor device shown in FIG. 1. FIG. 8 is a diagram of the sensor device viewed from an arrow A1 direction in FIG. 7.

Note that, in the following explanation, for convenience of explanation, the upper side in FIGS. 1, 4, and 7 is referred to as "up" or "upward" and the lower side in the figures is referred to as "down" or "downward".

Overview of the Force Detecting Device

A force detecting device 1A shown in FIGS. 1 and 2 has a function of detecting an external force (including a moment), that is, a function of detecting external forces applied along three axes (an α1 (X) axis, a β1 (Y) axis, and a γ1 (Z) axis) orthogonal to one another.

The force detecting device 1A includes a first board 2, a second board 3 arranged a predetermined space apart from the first board 2 to be opposed to the first board 2, an analog circuit board (a circuit board) 4 provided between the first board 2 and the second board 3, a digital circuit board 5 provided between the first board 2 and the second board 3 and electrically connected to the analog circuit board 4, a sensor device 6 mounted on the analog circuit board 4 and including a charge output element (a sensor element) 10 that outputs a signal according to an applied external force and a package that houses the charge output element 10, and two pressurizing bolts (fixing members) 71.

As shown in FIG. 3, the analog circuit board 4 includes a conversion output circuit 90a that converts a charge Qx output from the charge output element 10 of the mounted sensor device 6 into a voltage Vx, a conversion output circuit 90b that converts a charge Qz output from the charge output element 10 into a voltage Vz, and a conversion output circuit 90c that converts a charge Qy output from the charge output element 10 into a voltage Vy. The digital circuit board 5 includes an external-force detection circuit 40 that detects an applied external force. The digital circuit board 5 is arranged further on the first board 2 side than the analog circuit board 4, that is, between the analog circuit board 4 and the first board 2.

As shown in FIG. 1, the sensor device 6 is arranged on the surface of the analog circuit board 4 on the second board 3 side and sandwiched by a projection 21 provided on the first board 2 and the second board 3. That is, the charge output element 10 is sandwiched by the projection 21 and the second board 3 via the package 60 and pressurized. Note that whichever of the first board 2 and the second board 3 may be used as a board on a force applied side. However, in this embodiment, the second board 3 is explained as the board on the force applied side. The charge output element 10 may be arranged on the surface of the analog circuit board 4 on the first board 2 side.

The shapes of the first board 2, the second board 3, the analog circuit board 4, and the digital circuit board 5 are not particularly limited. However, in this embodiment, the external shapes of the first board 2, the second board 3, the analog circuit board 4, and the digital circuit board 5 are formed in circular shapes in plan view thereof. Note that examples of other external shapes of the first board 2, the second board 3, the analog circuit board 4, and the digital circuit board 5 in plan view include polygonal shapes such as square shapes and pentagonal shapes and elliptical shapes. Constituent materials of parts other than elements and wires of the first board 2, the second board 3, and the analog circuit board 4 and parts other than elements and wires of the digital circuit board 5 are not particularly limited. For example, various resin materials, various metal materials, and the like can be used.

Charge Output Element

The charge output element 10 has a function of outputting three charges Qx, Qy, and Qz according to respective external forces applied (received) along the three axes (the α1 (X) axis, the β1 (Y) axis, and the γ1 (Z) axis) orthogonal to one another.

The shape of the charge output element 10 is not particularly limited. However, in this embodiment, the charge output element 10 is formed in a square shape in plan view of the first board 2, that is, viewed from a direction perpendicular to the first board 2. Note that examples of other external shapes of the charge output element 10 in plan view include other polygonal shapes such as a pentagonal shape, a circular shape, and an elliptical shape.

As shown in FIG. 4, the charge output element 10 includes four ground electrode layers 11 earthed to the ground (a reference potential point), a first sensor 12 that outputs the charge Qy according to an external force (a shearing force) parallel to the β1 axis, a second sensor 13 that outputs the charge Qz according to an external force (a compressing/tensile force) parallel to the γ1 axis, and a third sensor 14 that outputs the charge Qx according to an external force (a shearing force) parallel to the α1 axis. The ground electrode layers 11 and the sensors 12, 13, and 14 are alternately laminated. Note that, in FIG. 4, a laminating direction of the ground electrode layers 11 and the sensors 12, 13, and 14 is represented as γ1-axis direction and directions orthogonal to the γ1-axis direction and orthogonal to each other are respectively represented as α1-axis direction and β1-axis direction.

In the configuration shown in the figure, the first sensor 12, the second sensor 13, and the third sensor 14 are laminated in this order from the lower side in FIG. 4. However, the invention is not limited to this. The laminating order of the sensors 12, 13, and 14 may be any order.

The ground electrode layers 11 are electrodes earthed to the ground (the reference potential point). A material forming the ground electrode layers 11 is not particularly limited. However, for example, gold, titanium, aluminum, copper, iron, or alloys containing these kinds of metal is preferable. Among these materials, in particular, it is preferable to use stainless steel, which is an iron alloy. The ground electrode layers 11 formed of the stainless steel have excellent durability and corrosion resistance.

The first sensor 12 has a function of outputting the charge Qy according to an external force (a shearing force) applied (received) along the β1 axis. The first sensor 12 is configured to output positive charges according to an external force applied along a positive direction of the β1 axis and output negative charges according to an external force applied along a negative direction of the β1 axis.

The first sensor 12 includes a first piezoelectric layer (piezoelectric body) 121 including a first crystal axis CA1, a second piezoelectric layer (piezoelectric body) 123 provided to be opposed to the first piezoelectric layer 121 and including a second crystal axis CA2, and an output electrode layer (an internal layer) 122 provided between the first piezoelectric layer 121 and the second piezoelectric layer 123 and configured to output the charge Qy.

The first piezoelectric layer 121 is configured by a piezoelectric body including the first crystal axis CA1 oriented in the negative direction of the β1 axis. When an external force is applied to the surface of the first piezoelectric layer 121 along the positive direction of the β1 axis, charges are induced in the first piezoelectric layer 121 by a piezoelectric effect. As a result, positive charges concentrate near the surface of the first piezoelectric layer 121 on the output electrode layer 122 side. Negative charges concentrate near the surface of the first piezoelectric layer 121 on the ground electrode layer 11 side. Similarly, when an external force along the negative direction of the β1 axis is applied to the surface of the first piezoelectric layer 121, negative charges concentrate near the surface of the first piezoelectric layer 121 on the output electrode layer 122 side. Positive charges concentrate near the surface of the first piezoelectric layer 121 on the ground electrode layer 11 side.

The second piezoelectric layer 123 is configured by a piezoelectric body including the second crystal axis CA2 oriented in the positive direction of the β1 axis. When an external force along the positive direction of the β1 axis is applied to the surface of the second piezoelectric layer 123, charges are induced in the second piezoelectric layer 123 by the piezoelectric effect. As a result, positive charges concentrate near the surface of the second piezoelectric layer 123 on the output electrode layer 122 side. Negative charges concentrate near the surface of the second piezoelectric layer 123 on the ground electrode layer 11 side. Similarly, when an external force along the negative direction of the β1 axis is applied to the surface of the second piezoelectric layer 123, negative charges concentrate near the surface of the second piezoelectric layer 123 on the output electrode layer 122 side. Positive charges concentrate near the surface of the second piezoelectric layer 123 on the ground electrode layer 11 side.

In this way, the first crystal axis CA1 of the first piezoelectric layer 121 faces a direction opposite to the direction of the second crystal axis CA2 of the second piezoelectric layer 123. Consequently, compared with when the first sensor 12 is configured by only any one of the first piezoelectric layer 121 and the second piezoelectric layer 123 and the output electrode layer 122, it is possible to increase the positive charges or the negative charges concentrating near the output electrode layer 122. As a result, it is possible to increase the charge Qy output from the output electrode layer 122.

Note that examples of a constituent material of the first piezoelectric layer 121 and the second piezoelectric layer 123 include quartz, topaz, barium titanate, lead titanate, lead zirconate titanate (PZT: $Pb(Zr, Ti)O_3$), lithium niobate, and lithium tantalate. Among the materials, in particular, quartz is preferable. This is because a piezoelectric layer formed of quartz has excellent characteristics such as a wide dynamic range, high rigidity, a high specific frequency, and high load resistance. A piezoelectric layer that generates charges according to an external force (a shearing force) applied along the surface direction of the layer such as the first piezoelectric layer 121 and the second piezoelectric layer 123 can be formed of Y-cut quartz.

The output electrode layer 122 has a function of outputting, as the charge Qy, positive charges or negative charges generated in the first piezoelectric layer 121 and the second piezoelectric layer 123. As explained above, when an external force along the positive direction of the β1 axis is applied to the surface of the first piezoelectric layer 121 or the surface of the second piezoelectric layer 123, the positive charges concentrate near the output electrode layer 122. As a result, a positive charge Qy is output from the output electrode layer 122. On the other hand, when an external force along the negative direction of the β1 axis is applied to the surface of the first piezoelectric layer 121 or the surface of the second piezoelectric layer 123, the negative charges concentrate near the output electrode layer 122. As a result, a negative charge Qy is output from the output electrode layer 122.

The width of the output electrode layer 122 is preferably equal to or larger than the width of the first piezoelectric layer 121 and the second piezoelectric layer 123. When the width of the output electrode layer 122 is equal to or smaller than the width of the first piezoelectric layer 121 or the second piezoelectric layer 123, a part of the first piezoelectric layer 121 or the second piezoelectric layer 123 is not in contact with the output electrode layer 122. Therefore, a part of charges generated in the first piezoelectric layer 121 or the second piezoelectric layer 123 sometimes cannot be output from the output electrode layer 122. As a result, the charge Qy output from the output electrode layer 122 decreases. Note that the same applies to the output electrode layers 132 and 142.

The second sensor 13 has a function of outputting the charge Qz according to an external force (a compression/tensile force) applied (received) along the γ1 axis. The second sensor 13 is configured to output positive charges according to a compression force parallel to the γ1 axis and output negative charges according to a tensile force parallel to the γ1 axis.

The second sensor 13 includes a third piezoelectric layer (piezoelectric body) 131 including a third crystal axis CA3, a fourth piezoelectric layer (piezoelectric body) 133 provided to be opposed to the third piezoelectric layer 131 and including a fourth crystal axis CA4, and an output electrode layer (an internal layer) 132 provided between the third piezoelectric layer 131 and the fourth piezoelectric layer 133 and configured to output the charge Qz.

The third piezoelectric layer 131 is configured by a piezoelectric body including the third crystal axis CA3 oriented in the positive direction of the γ1 axis. When a compression force parallel to the γ1 axis is applied to the surface of the third piezoelectric layer 131, charges are induced in the third piezoelectric layer 131 by the piezoelectric effect. As a result, positive charges concentrate near the surface of the third piezoelectric layer 131 on the output electrode layer 132 side. Negative charges concentrate near the surface of the third piezoelectric layer 131 on the ground electrode layer 11 side. Similarly, when a tensile force parallel to the γ1 axis is applied to the surface of the third piezoelectric layer 131, negative charges concentrate near the surface of the third piezoelectric layer 131 on the output electrode layer 132 side. Positive charges concentrate near the surface of the third piezoelectric layer 131 on the ground electrode layer 11 side.

The fourth piezoelectric layer 133 is configured by a piezoelectric body including the fourth crystal axis CA4 oriented in the negative direction of the γ1 axis. When a compression force parallel to the γ1 axis is applied to the surface of the fourth piezoelectric layer 133, charges are induced in the fourth piezoelectric layer 133 by the piezoelectric effect. As a result, positive charges concentrate near the surface of the fourth piezoelectric layer 133 on the output electrode layer 132 side. Negative charges concentrate near the surface of the fourth piezoelectric layer 133 on the ground electrode layer 11 side. Similarly, when a tensile force parallel to the γ1 axis is applied to the surface of the fourth piezoelectric layer 133, negative charges concentrate near the surface of the fourth piezoelectric layer 133 on the output electrode layer 132 side. Positive charges concentrate near the surface of the fourth piezoelectric layer 133 on the ground electrode layer 11 side.

As a constituent material of the third piezoelectric layer 131 and the fourth piezoelectric layer 133, a constituent material same as the constituent material of the first piezoelectric layer 121 and the second piezoelectric layer 123 can be used. A piezoelectric layer that generates charges according to an external force (a compression/tensile force) perpendicular to the surface direction of the layer such as the third piezoelectric layer 131 and the fourth piezoelectric layer 133 can be formed of X-cut quartz.

The output electrode layer 132 has a function of outputting, as the charge Qz, positive charges or negative charges generated in the third piezoelectric layer 131 and the fourth piezoelectric layer 133. As explained above, when a compression force parallel to the γ1 axis is applied to the surface of the third piezoelectric layer 131 or the surface of the fourth piezoelectric layer 133, the positive charges concentrate near the output electrode layer 132. As a result, a positive charge Qz is output from the output electrode layer 132. On the other hand, when a tensile force parallel to the γ1 axis is applied to the surface of the third piezoelectric layer 131 or the surface of the fourth piezoelectric layer 133, the negative charges concentrate near the output electrode layer 132. As a result, a negative charge Qz is output from the output electrode layer 132.

The third sensor 14 has a function of outputting the charge Qx according to an external force (a shearing force) applied (received) along the α1 axis. The third sensor 14 is configured to output positive charges according to an external force applied along a positive direction of the α1 axis and output negative charges according to an external force applied along a negative direction of the α1 axis.

The third sensor 14 includes a fifth piezoelectric layer (piezoelectric body) 141 including a fifth crystal axis CA5, a sixth piezoelectric layer (piezoelectric body) 143 provided to be opposed to the fifth piezoelectric layer 141 and including a sixth crystal axis CA6, and an output electrode layer (an internal layer) 142 provided between the fifth piezoelectric layer 141 and the sixth piezoelectric layer 143 and configured to output the charge Qx.

The fifth piezoelectric layer 141 is configured by a piezoelectric body including the fifth crystal axis CA5 oriented in the negative direction of the α1 axis. When an external force is applied to the surface of the fifth piezoelectric layer 141 along the positive direction of the α1 axis, charges are induced in the fifth piezoelectric layer 141 by the piezoelectric effect. As a result, positive charges concentrate near the surface of the fifth piezoelectric layer 141 on the output electrode layer 142 side. Negative charges concentrate near the surface of the fifth piezoelectric layer 141 on the ground electrode layer 11 side. Similarly, when an external force along the negative direction of the α1 axis is applied to the surface of the fifth piezoelectric layer 141, negative charges concentrate near the surface of the fifth piezoelectric layer 141 on the output electrode layer 142 side. Positive charges concentrate near the surface of the fifth piezoelectric layer 141 on the ground electrode layer 11 side.

The sixth piezoelectric layer 143 is configured by a piezoelectric body including the sixth crystal axis CA6 oriented in the positive direction of the α1 axis. When an external force along the positive direction of the α1 axis is applied to the surface of the sixth piezoelectric layer 143, charges are induced in the sixth piezoelectric layer 143 by the piezoelectric effect. As a result, positive charges concentrate near the surface of the sixth piezoelectric layer 143 on the output electrode layer 142 side. Negative charges concentrate near the surface of the sixth piezoelectric layer 143 on the ground electrode layer 11 side. Similarly, when an external force along the negative direction of the α1 axis is applied to the surface of the sixth piezoelectric layer 143, negative charges concentrate near the surface of the sixth piezoelectric layer 143 on the output electrode layer 142 side. Positive charges concentrate near the surface of the sixth piezoelectric layer 143 on the ground electrode layer 11 side.

As a constituent material of the fifth piezoelectric layer 141 and the sixth piezoelectric layer 143, a constituent material same as the constituent material of the first piezoelectric layer 121 and the second piezoelectric layer 123 can be used. A piezoelectric layer that generates charges according to an external force (a shearing force) applied along the surface direction of the layer such as the fifth piezoelectric layer 141 and the sixth piezoelectric layer 143 can be formed of Y-cut quartz like the first piezoelectric layer 121 and the second piezoelectric layer 123.

The output electrode layer 142 has a function of outputting, as the charge Qx, positive charges or negative charges generated in the fifth piezoelectric layer 141 and the sixth piezoelectric layer 143. As explained above, when an external force along the positive direction of the α1 axis is applied to the surface of the fifth piezoelectric layer 141 or the surface of the sixth piezoelectric layer 143, the positive charges concentrate near the output electrode layer 142. As a result, a positive charge Qx is output from the output electrode layer 142. On the other hand, when an external force along the negative direction of the α1 axis is applied to the surface of the fifth piezoelectric layer 141 or the surface of the sixth piezoelectric layer 143, the negative charges concentrate near the output electrode layer 142. As a result, a negative charge Qx is output from the output electrode layer 142.

In this way, the first sensor 12, the second sensor 13, and the third sensor 14 are laminated such that force detecting directions of the sensors are orthogonal to one another. Consequently, the sensors can respectively induce charges according to force components orthogonal to one another. Therefore, the charge output element 10 can output the three charges Qx, Qy, and Qz according to the respective external forces along the three axes (the α1 (X) axis, the β1 (Y) axis, and the γ1 (Z) axis).

As shown in FIGS. 5A to 6B, the output electrode layers 122, 132, and 142 and the ground electrode layers 11 are formed in square shapes in plan view. The lengths of the sides of the output electrode layers 122, 132, and 142 and the ground electrode layers 11 are respectively smaller than the lengths of the sides of the piezoelectric layers 121, 123, 131, 133, 141, and 143.

As shown in FIG. 5A, in the output electrode layer 122, when viewed from the γ1 axis side, a side 122*d* on an α1 axis positive side is located further on an α1 axis negative side than a side 121*d* on the α1 axis positive side of the first piezoelectric layer 121. A side 122*b* on the α1 axis negative side is located further on the α1 axis positive side than a side 121*b* on the α1 axis negative side of the first piezoelectric layer 121. A side 122*c* on a β1 axis positive side is located further on a β1 axis negative side than a side 121*c* on the β1 axis positive side of the first piezoelectric layer 121. When viewed from the γ1 axis side, a side 122*a* on the β1 axis negative side of the output electrode layer 122 overlaps a side 121*a* on the β1 axis negative side of the first piezoelectric layer 121.

As shown in FIG. 5B, in the output electrode 132, when viewed from the γ1 axis side, a side 132*d* on the α1 axis positive side is located further on the α1 axis negative side than a side 131*d* on the α1 axis positive side of the third piezoelectric layer 131. A side 132*c* on the β1 axis positive side is located further on the β1 axis negative side than a side 131*c* on the β1 axis positive side of the third piezoelectric layer 131. A side 132*a* on the β1 axis negative side is located further on the β1 axis positive side than a side 131*a* on the β1 axis negative side of the third piezoelectric layer 131. When viewed from the γ1 axis side, a side 132*b* on the α1 axis negative side of the output electrode layer 132 overlaps a side 131*b* on the α1 axis negative side of the third piezoelectric layer 131.

As shown in FIG. 6A, in the output electrode layer 142, when viewed from the γ1 axis side, a side 142*d* on the α1 axis positive side is located further on the α1 axis negative side than a side 141*d* on the α1 axis positive side of the fifth piezoelectric layer 141. A side 142*b* on the α1 axis negative side is located further on the α1 axis positive side than a side 141*b* on the α1 axis negative side of the fifth piezoelectric layer 141. A side 141*b* on the β1 axis negative side is located further on the β1 axis positive side than a side 142*a* on the β1 axis negative side of the fifth piezoelectric layer 141. When viewed from the γ1 axis side, a side 142*c* on the β1 axis positive side of the output electrode layer 142 overlaps a side 141*c* on the β1 axis positive side of the fifth piezoelectric layer 141.

As shown in FIG. 6B, in each of the ground electrode layers 11, when viewed from the γ1 axis side, a side 11*b* on the α1 axis negative side is located further on the α1 axis positive side than the side 121*b* on the α1 axis negative side of the first piezoelectric layer 121. A side 11*c* on the β1 axis positive side is located further on the β1 axis negative side than the side 121*c* on the β1 axis positive side of the first piezoelectric layer 121. A side 11*a* on the β1 axis negative side is located further on the β1 axis positive side than the side 121*a* on the β1 axis negative side of the first piezoelectric layer 121. When viewed from the γ1 axis side, a side 11*d* on the α1 axis positive side of each of the ground electrode layers 11 overlaps the side 121*d* on the α1 axis positive side of the first piezoelectric layer 121.

Note that, in this embodiment, the thicknesses of the output electrode layers 122, 132, and 142 and the ground electrode layers 11 are preferably equal to or larger than 20 nm and equal to or smaller than 100 nm. Consequently, it is possible to attain a reduction in the thickness of the charge output element 10.

With such a configuration, as shown in FIGS. 7 and 8, conductive paste 64a provided on the side surface on the α1 axis negative side of the charge output element 10 is electrically connected to only the output electrode layer 122. Conductive paste 64b provided on the side surface on the β1 axis positive side of the charge output element 10 is electrically connected to only the output electrode layer 132. Conductive paste 64c provided on the side surface on the α1 axis positive side of the charge output element 10 is electrically connected to only the output electrode layer 142. Conductive paste 64g provided on the side surface on the β1 axis negative side of the charge output element 10 is electrically connected to only the ground electrode layers 11. Consequently, in the output electrode layers 122, 132, and 142 and the ground electrode layers 11, short-circuit via the conductive pastes (conductive members) 64a, 64b, 64c, and 64d is prevented.

Sensor Device

The sensor device 6 includes the charge output element 10 and the package 60 that houses the charge output element 10.

The package 60 includes a supporting member (a first member) 61 including a recess 650 and a lid member (a second member) 62 joined to the supporting member 61. The charge output element 10 is arranged on a bottom surface 651 of the recess 650. In this arrangement state, the recess 650 is sealed by the lid member 62. Consequently, it is possible to protect the charge output element 10 and provide the force detecting device 1A having high reliability. Note that the upper surface of the charge output element 10 is in contact with the lid member 62. The lid member 62 of the package 60 is arranged on the upper side, that is, the second board 3 side. The supporting member 61 is arranged on the lower side, that is, the first board 2 side. The supporting member 61 is fixed to the analog circuit board 4. With this configuration, the supporting member 61 and the lid member 62 are sandwiched and pressurized by the projection 21 and the second board 3. The charge output element 10 is sandwiched and pressurized by the supporting member 61 and the lid member 62.

The recess 650 includes a step section 653, which is a portion whose depth (depth in an A1 axis direction) changes stepwise. A surface parallel to the A1 axis of the step section 653 is a first surface 654. A surface crossing the A1 axis is a second surface 612.

On the second surface 612, four terminals (output terminals) 63a, 63b, 63c, and 63g formed in a film shape and electrically connected to the charge output element 10 are provided. The terminal 63a is electrically connected to the output electrode layer 122. The terminal 63b is electrically connected to the output electrode layer 132. The terminal 63c is electrically connected to the output electrode layer 142. The terminal 63g is electrically connected to the ground electrode layers 11. The terminals 63a, 63b, 63c, and 63g have substantially the same configurations. Therefore, the terminal 63a is representatively explained below.

The terminal 63a includes a portion 633 exposed in the recess 650 and a portion 634 embedded in the supporting member 61 and partially exposed to the outer side of the package 60.

The portion 633 is electrically connected to the output electrode layer 122 via the conductive paste 64a explained below. On the other hand, the portion 634 is electrically connected to the analog circuit board 4 via a not-shown wire. Consequently, the charge output element 10 and the analog circuit board 4 are electrically connected.

A constituent material of the terminals 63 is not particularly limited as long as the terminals 63 have electric conductivity. For example, the terminals 63 can be formed of a metal film obtained by laminating films of nickel, gold, silver, copper, and the like on a metalized layer (a base layer) of chrome or tungsten.

In this embodiment, the lid member 62 is formed in a tabular shape. A part between a center section 625 and an outer circumference section 626 is bent, whereby the center section 625 projects toward the second board 3. The shape of the center section 625 is not particularly limited. However, in this embodiment, the center section 625 is formed in a shape same as the shape of the charge output element 10, that is, a square shape in plan view of the first board 2. Note that both of the upper surface and the lower surface of the center section 625 of the lid member 62 are planes.

A constituent material of the supporting member 61 is not particularly limited. For example, an insulative material such as ceramics can be used. A constituent material of the lid member 62 is not particularly limited. For example, various metal materials such as stainless steel can be used. Note that the constituent material of the supporting member 61 and the constituent material of the lid member 62 may be the same or may be different.

The shape of the package 60 is not particularly limited. However, in this embodiment, the package 60 is formed in a square shape in plan view of the first board 2. Examples of other shapes of the package 60 in plan view include polygonal shapes such as a pentagonal shape, a circular shape, and an elliptical shape. When the shape of the package 60 is a polygonal shape, for example, corners of the polygonal shape may be rounded or may be obliquely cut out.

Conversion Output Circuits

The conversion output circuits 90a, 90b, and 90c are connected to the charge output element 10. The conversion output circuit 90a has a function of converting the charge Qx output from the charge output element 10 into the voltage Vx. The conversion output circuit 90b has a function of converting the charge Qz output from the charge output element 10 into the voltage Vz. The conversion output circuit 90c has a function of converting the charge Qy output from the charge output element 10 into the voltage Vy. The conversion output circuits 90a, 90b, and 90c are the same. Therefore, the conversion output circuit 90c is representatively explained below.

The conversion output circuit 90c has a function of converting the charge Qy output from the charge output element 10 into the voltage Vy and outputting the voltage Vy. The conversion output circuit 90c includes an operational amplifier 91, a capacitor 92, and a switching element 93. A first input terminal (a minus input) of the operational amplifier 91 is connected to the output electrode layer 122 of the charge output element 10. A second input terminal (a plus input) of the operational amplifier 91 is earthed to the ground (the reference potential point). An output terminal of the operational amplifier 91 is connected to the external-force detection circuit 40. The capacitor 92 is connected between the first input terminal and the output terminal of the operational amplifier 91. The switching element 93 is connected between the first input terminal and the output terminal of the operational amplifier 91 and connected to the capacitor 92 in parallel. The switching element 93 is connected to a driving circuit (not shown in the figure). The switching element 93 executes a switching operation according to ON and OFF signals from the driving circuit.

When the switching element 93 is turned off, the charge Qy output from the charge output element 10 is stored in the capacitor 92 having capacitance Cl and output to the external-force detection circuit 40 as the voltage Vy. Subsequently, when the switching element 93 is turned on, both terminals of the capacitor 92 are short-circuited. As a result, the charge Qy stored in the capacitor 92 is discharged and decreases to 0 coulomb. The voltage V output to the external-force detection circuit 40 decreases to 0 volt. Turning on the switching element 93 is referred to as resetting the conversion output circuit 90c. Note that the voltage Vy output from an ideal conversion output circuit 90c is proportional to an accumulated amount of the charge Qy output from the charge output element 10.

The switching element 93 is, for example, a semiconductor switching element such as a MOSFET (Metal Oxide Semiconductor Field Effect Transistor). Since the semiconductor switching element is small and light compared with a mechanical switch, the semiconductor switching element is advantageous for a reduction in the size and a reduction in the weight of the force detecting device 1A. A representative example is explained below in which the MOSFET is used as the switching element 93.

The switching element 93 includes a drain electrode, a source electrode, and a gate electrode. One of the drain electrode and the source electrode of the switching element 93 is connected to the first input terminal of the operational amplifier 91. The other of the drain electrode and the source electrode is connected to the output terminal of the operational amplifier 91. A gate electrode of the switching element 93 is connected to a driving circuit (not shown in the figure).

The same driving circuit may be connected to the switching elements 93 of the conversion output circuits 90a, 90b, and 90c or different driving circuits may be respectively connected to the switching elements 93. ON/OFF signals all synchronizing with one another are input to the switching elements 93 from the driving circuit. Consequently, the operations of the switching elements 93 of the conversion output circuits 90a, 90b, and 90c synchronize with one another. That is, ON/OFF timings of the switching elements 93 of the conversion output circuits 90a, 90b, and 90c coincide with one another.

External-Force Detection Circuit

The external-force detection circuit 40 has a function of detecting an applied external force on the basis of the voltage Vx output from the conversion output circuit 90a, the voltage Vz output from the conversion output circuit 90b, and the voltage Vy output from the conversion output circuit 90c. The external-force detection circuit 40 includes an A/D converter 401 connected to the conversion output circuits 90a, 90b, and 90c and an arithmetic unit 402 connected to the A/D converter 401.

The A/D converter 401 has a function of converting the voltages Vx, Vy, and Vz from analog signals into digital signals. The voltages Vx, Vy, and Vz converted into the digital signals by the A/D converter 401 are input to the arithmetic unit 402.

That is, when an external force for shifting the relative positions of the first board 2 and the second board 3 from each other in the α1 (X) axis direction is applied, the A/D converter 401 outputs the voltage Vx. Similarly, when an external force for shifting the relative positions of the first board 2 and the second board 3 from each other in the β1 (Y) axis direction is applied, the A/D converter 401 outputs the voltage Vy. When an external force for shifting the relative positions of the first board 2 and the second board 3 from each other in the γ1 (Z) axis direction is applied, the A/D converter 401 outputs the voltage Vz.

The arithmetic unit 402 applies, to the voltages Vx, Vy, and Vz converted into the digital signals, kinds of processing such as correction for eliminating differences in sensitivities among the conversion output circuits 90a, 90b, and 90c. The arithmetic unit 402 outputs three signals proportional to accumulation amounts of the charges Qx, Qy, and Qz output from the charge output element 10. The three signals correspond to three axial forces (a shearing force and compression/tensile forces) applied to the charge output element 10. Therefore, the force detecting device 1A can detect the three axial forces applied to the charge output elements 10.

As shown in FIGS. 1 and 2, in the force detecting device 1A, the projection 21 is provided on the first board 2. The projection 21 is present on the inner side of the first board 2 and the second board 3. The surface of the first board 2 and the surface of the second board 3 are opposed to be spaced apart from each other. Note that an upper surface (a surface opposed to the second board 3) 211 of the projection 21 is a plane. The projection 21 may be formed integrally with the first board 2 or may be formed separately from the first board 2. Note that a constituent material of the projection 21 is not particularly limited and can be the same as, for example, the material of the first board 2.

The position of the projection 21 is not particularly limited. However, in this embodiment, the projection 21 is arranged in the center section of the first board 2.

The shape of the projection 21 is not particularly limited. However, in this embodiment, the projection 21 is formed in a shape same as the shape of the charge output element 10, that is, a square shape in plan view of the first board 2. Note that, examples of other shapes of the projections 21 in plan view include polygonal shapes such as a square shape and a pentagonal shape and an elliptical shape.

A hole 411, into which the projection 21 is inserted, is formed in a part of the analog circuit board 4 where the charge output element 10 is arranged, that is, the center section of the analog circuit board 4. The hole 411 is a through-hole through which the analog circuit board 4 is pierced. The shape of the hole 411 is not particularly limited. However, in this embodiment, the hole 411 is formed in a shape same as the shape of the projection 21, that is, a square shape in plan view of the first board 2. Note that the analog circuit board 4 is supported by the projection 21.

Similarly, a hole 51, into which the projection 21 is inserted, is formed in a part of the digital circuit board 5 where the charge output element 10 is arranged, that is, the center section of the digital circuit board 5. The shape of the hole 51 is not particularly limited. However, in this embodiment, the hole 51 is formed in a shape same as the shape of the projection 21, that is, a square shape in plan view of the first board 2. Note that the digital circuit board 5 is supported by the projection 21.

Note that, in the analog circuit board 4, two holes 412, through which the two pressurizing bolts 71 are inserted, are formed. Similarly, in the digital circuit board 5, two holes 52, through which the two pressurizing bolts 71 are inserted, are formed.

The projection 21 is inserted into the hole 411 of the analog circuit board 4 and the hole 51 of the digital circuit board 5 and projects toward the charge output element 10. The sensor device 6 is sandwiched by the projection 21 and the second board 3. Consequently, the charge output element 10 is sandwiched by the projection 21 and the second board 3 via the package 60. Note that a lower surface (a surface opposed to the first board 2) of the second board 3 is a plane. The lower surface 36 is in contact with the center section of the lid member 62 of the sensor device 6. The upper surface 211 of the projection 21 is in contact with the supporting member 61.

The dimension of the projection 21 is not particularly limited. However, in plan view of the first board 2, the area of the projection 21 is preferably equal to or larger than the area of the charge output element 10 and more preferably larger than the area of the charge output element 10. Note that, in the configuration shown in the figure, the area of the projection 21 is larger than the area of the charge output element 10. The charge output element 10 is arranged within the projection 21 in plan view of the first board 2 (viewed from a direction perpendicular to the first board 2). The center line of the charge output element 10 and the center line of the projection 21 coincide with each other. In this case, the charge output element 10 only has to not protrude from the projection 21 in plan view of the first board 2. Consequently, it is possible to apply pressurization to the entire charge output element 10. In force detection, an external force is applied to the entire charge output element 10. It is possible to perform more accurate force detection.

The first board 2 and the second board 3 are fixed by the two pressurizing bolts 71. Note that the "fixing" by the pressurizing bolts 71 is performed while allowing predetermined amounts of mutual movements of the two fixing targets. Specifically, the first board 2 and the second board 3 are fixed by the two pressurizing bolts 71 while being allowed to move in the surface direction of the second board 3 by predetermined amounts each other. Note that this applies to the other embodiments.

The pressurizing bolts 71 are respectively arranged such that heads 715 thereof are set on the second board 3 side. The pressurizing bolts 71 are inserted from holes 35 formed in the second board 3 and inserted through the holes 412 of the analog circuit board 4 and the holes 52 of the digital circuit board 5. Male screws 716 of the pressurizing bolts 71 are screwed with female screws 25 formed in the first board 2. Pressure, that is, pressurization, in the Z-axis direction (see FIG. 4) of a predetermined magnitude is applied to the charge output element 10 by the pressurizing bolts 71. Note that the magnitude of the pressurization is not particularly limited and is set as appropriate.

The positions of the pressurizing bolts 71 are not particularly limited. However, in this embodiment, the pressurizing bolts 71 are arranged at equal angle intervals (180° intervals) along the circumferential direction of the first board 2, the second board 3, the analog circuit board 4, and the digital circuit board 5, that is, to be opposed to each other via the charge output element 10 in plan view of the second board 3. Consequently, the first board 2 and the second board 3 are fixed in a well-balanced state. Pressurization can be applied to the charge output elements 10 in a well-balanced state. Note that the number of the pressurizing bolts 71 is not limited to two and may be three or more.

Note that a constituent material of the pressurizing bolts 71 is not particularly limited. For example, various resin materials, various metal materials, and the like can be used.

As shown in FIG. 8, on side surfaces of the charge output element 10 of the sensor device 6, four conductive pastes 64a, 64b, 64c, and 64g are provided.

The conductive paste 64a has electric conductivity and is in contact with the side surface on the β1 axis negative side of the charge output element 10 and the terminal 63a. Consequently, the output electrode layer 122 and the terminal 63a are electrically connected.

The conductive paste 64b has electric conductivity and is in contact with the side surface on the α1 axis negative side of the charge output element 10 and the terminal 63b. Consequently, the output electrode layer 132 and the terminal 63b are electrically connected.

The conductive paste 64c has electric conductivity and is in contact with the side surface on the β1 axis positive side of the charge output element 10 and the terminal 63c. Consequently, the output electrode layer 142 and the terminal 63c are electrically connected.

The conductive paste 64g has electric conductivity and is in contact with the side surface on the α1 axis positive side of the charge output element 10 and the terminal 63g. Consequently, the ground electrode layers 11 and the terminal 63g are electrically connected.

The conductive pastes 64a, 64b, 64c, and 64g are explained in detail below. However, the conductive pastes 64a, 64b, 64c, and 64g have substantially the same configurations. Therefore, the conductive paste 64a is representatively explained.

As shown in FIGS. 7 and 8, the conductive paste 64a is configured by first conductive paste 65 provided on the side surface of the charge output element 10 and second conductive paste 66 for connecting the first conductive paste 65 and the terminal 63a. The first conductive paste 65 and the second conductive paste 66 are provided in no-contact with the bottom surface 651 of the recess 650 of the package 60. That is, the first conductive paste 65 and the second conductive paste 66 are suspended between the charge output element 10 and the package 60. With such a configuration, the first conductive paste 65 and the second conductive paste 66 are in contact with the package 60 only in necessary portions. Therefore, it is also possible to arrange an electrode on the bottom surface 651 of the recess 650. The conductive pastes 64a, 64b, 64c, and 64g can be deformed in the α1 axis direction, the β1 axis direction, and the γ1 axis direction.

Note that the first conductive paste 65 is an example of the "first conductive member" in the aspect of the invention. The second conductive paste 66 is an example of the "second conductive member" in the aspect of the invention.

For example, according to the deformation (variation) of the charge output element 10, compression stress, tensile stress, torsional stress, shearing stress, or the like (hereinafter simply referred to as "stress") sometimes occurs in the conductive paste 64a. It is likely that the conductive paste 64a is ruptured (disconnected) by the stress. However, in this invention, the modulus of elasticity (Young's modulus (modulus of longitudinal elasticity), the modulus of rigidity (modulus of traverse elasticity), and the modulus of volume elasticity) of the second conductive paste 66 is lower than the modulus of elasticity of the first conductive paste 65. Consequently, even when the stress occurs in the conductive paste 64a, the second conductive paste 66 having low modulus of elasticity is moderately elastically deformed and can absorb the stress. That is, the second conductive paste 66 can function as an interfering section that absorbs the stress. Therefore, it is possible to suppress or prevent the conductive paste 64 from being ruptured (disconnected) by the stress.

The Young's modulus of the first conductive paste 65 is preferably equal to or higher than 3.4 GPa and equal to or lower than 5.0 GPa and more preferably equal to or higher than 4.0 GPa and equal to or lower than 4.4 GPa. Consequently, it is possible to further attain the effect. It is possible to effectively maintain a state in which the first conductive paste 65 and the charge output element 10 are bonded.

On the other hand, the Young's modulus of the second conductive paste 66 is preferably equal to or higher than 0.1 GPa and equal to or lower than 0.2 GPa and more preferably equal to or higher than 0.14 GPa and equal to or lower than 0.16 GPa. Consequently, it is possible to further attain the effect. It is possible to prevent a crack from occurring near the package 60.

As explained above, each of the conductive pastes 64 is configured by the first conductive paste 65 and the second conductive paste 66 having the modulus of elasticity lower than the modulus of elasticity of the first conductive paste 65. Therefore, it is possible to attain high adhesiveness between the conductive paste 64 and the charge output element 10 and prevention of rupture due to the stress.

As explained above, the second conductive paste 66 is connected to the step section 653. Consequently, the second conductive paste 66 can be provided across the first surface 654 and the second surface 612. Therefore, since the second conductive paste 66 is in contact with the two surfaces in different directions, it is possible to increase the contact area with the package 60 as much as possible. As a result, although the second conductive paste 66 has the modulus of elasticity lower than the modulus of elasticity of the first conductive paste 65, it is possible to sufficiently secure bonding strength between the second conductive paste 66 and the package 60.

The first conductive paste 65 and the second conductive paste 66 can be formed of, for example, a material (a paste material) obtained by dispersing a conductive filler such as metal particles in an adhesive of a resin material. The content percentage of the conductive filler in the material forming the first conductive paste 65 is higher than the content percentage of the conductive filler of the material forming the second conductive paste 66. As explained above, the output electrode layers 122, 132, and 142 and the ground electrode layers 11 formed in the relatively thin film shape and the first conductive paste 65 can be surely electrically connected. Further, the content percentage of the conductive filler of the second conductive paste 66 is lower than the content percentage of the conductive filler of the first conductive paste 65. However, since the contact area of the second conductive paste 66 and the portion 633 of the terminal 63a is relatively large, the second conductive paste 66 and the terminal 63a are surely electrically connected. Further, when the package 60 is formed of a resin material, by setting the content percentage of the filler of the second conductive paste 66 relatively small, it is possible to improve affinity of the second conductive paste 66 and the package 60. Consequently, it is possible to improve the bonding strength between the second conductive paste 66 and the package 60.

The first conductive paste 65 and the second conductive paste 66 may be formed of the same material or may be formed of different materials. As the resin material, for example, polyolefin, polyvinyl chloride, polystyrene, ABS resin, nylon (polyamide), ethylene-vinyl acetate copolymer, polyester, acrylic resin, epoxy resin, and urethane resin can be used. As a constituent material of the conductive filler, for example, a metal material such as silver can be used.

Note that, for example, the conductive filler may be formed in a spherical shape or may be formed in a flake shape.

As explained above, in the sensor device 6, the conductive paste 64 is configured by the first conductive paste 65 and the second conductive paste 66 having the modulus of elasticity lower than the modulus of elasticity of the first conductive paste 65. Therefore, even when stress occurs in the conductive paste 64, the second conductive paste 66 can absorb the stress. Therefore, it is possible to suppress or prevent the conductive paste 64 from being ruptured. As a result, it is possible to obtain the sensor device 6 and the force detecting device 1A having high reliability.

Second Embodiment

Figure 9:
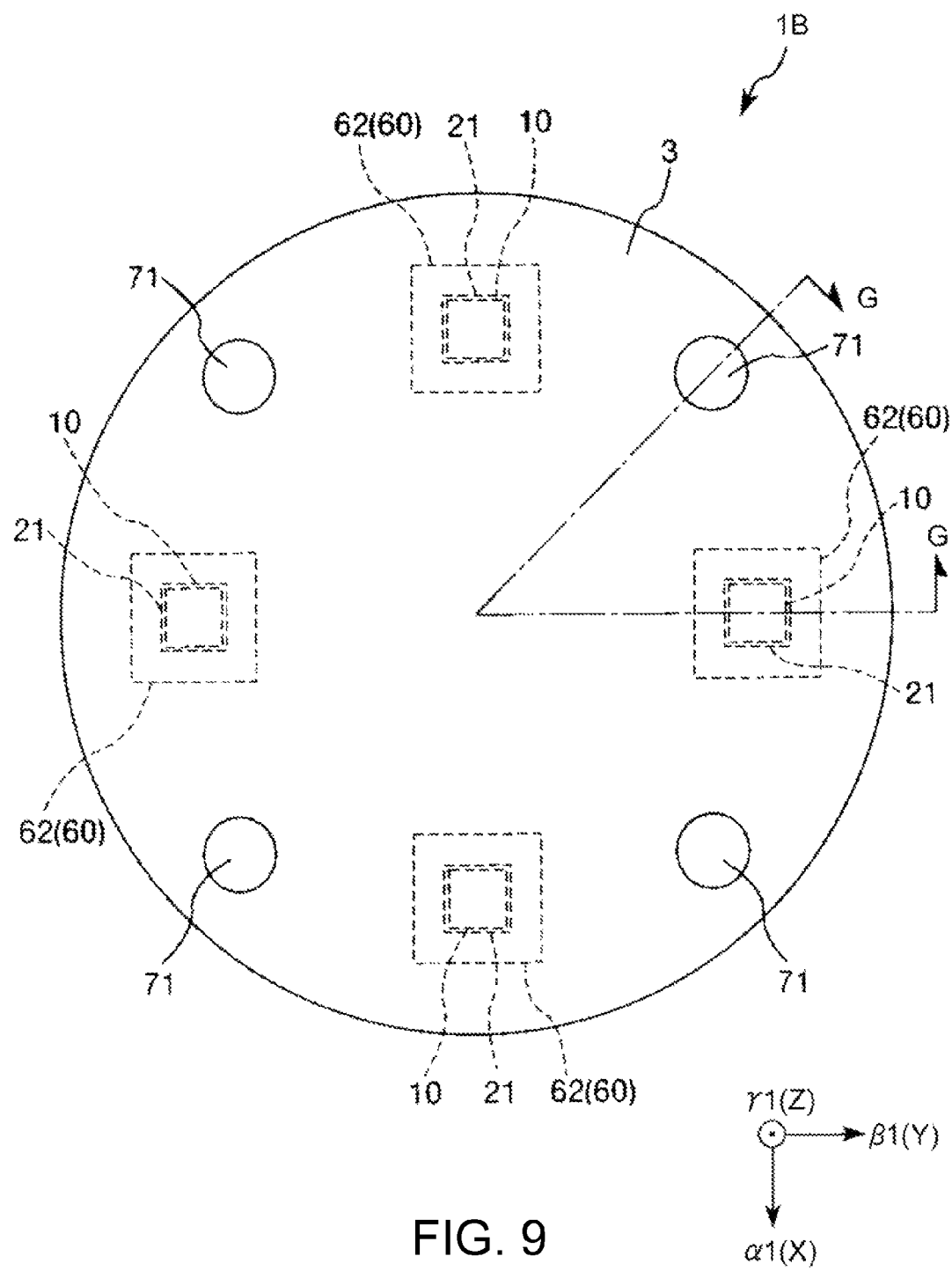
FIG. 9 is a plan view showing a force detecting device in a second embodiment of the invention.
Figure 10:
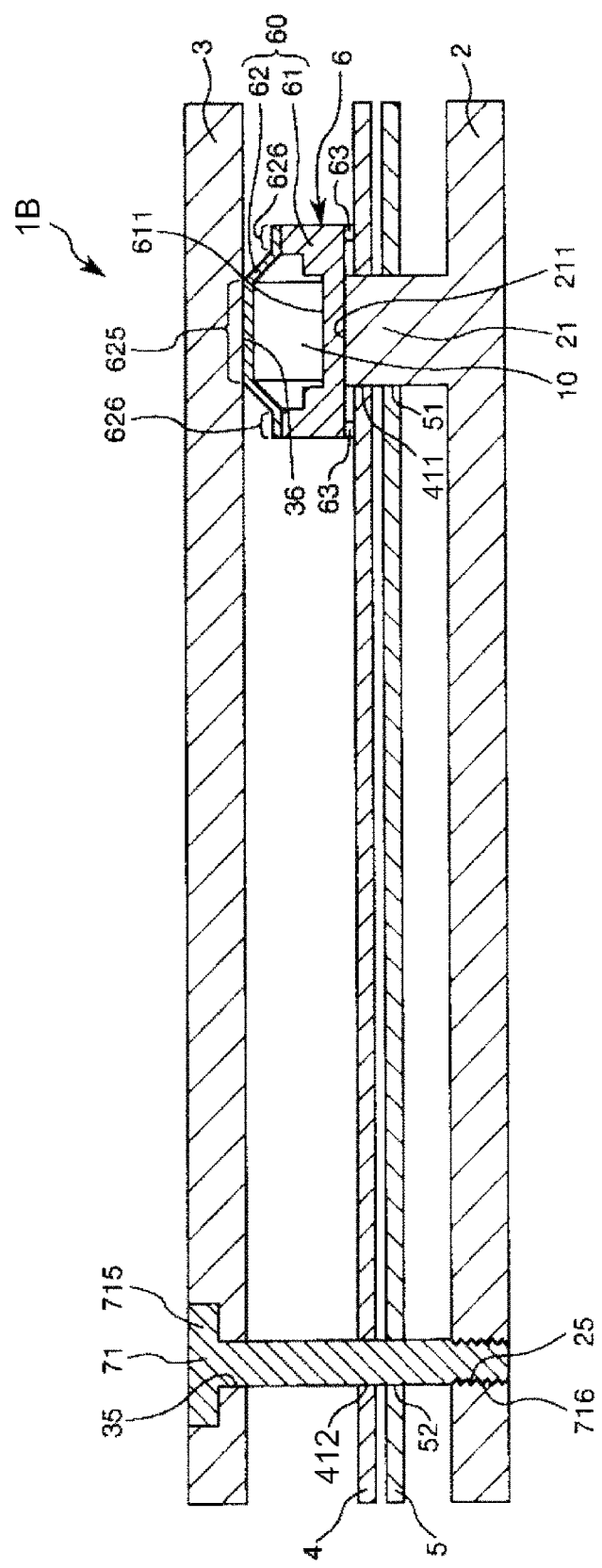
FIG. 10 is a sectional view taken along line G-G in FIG. 9.
Figure 11:
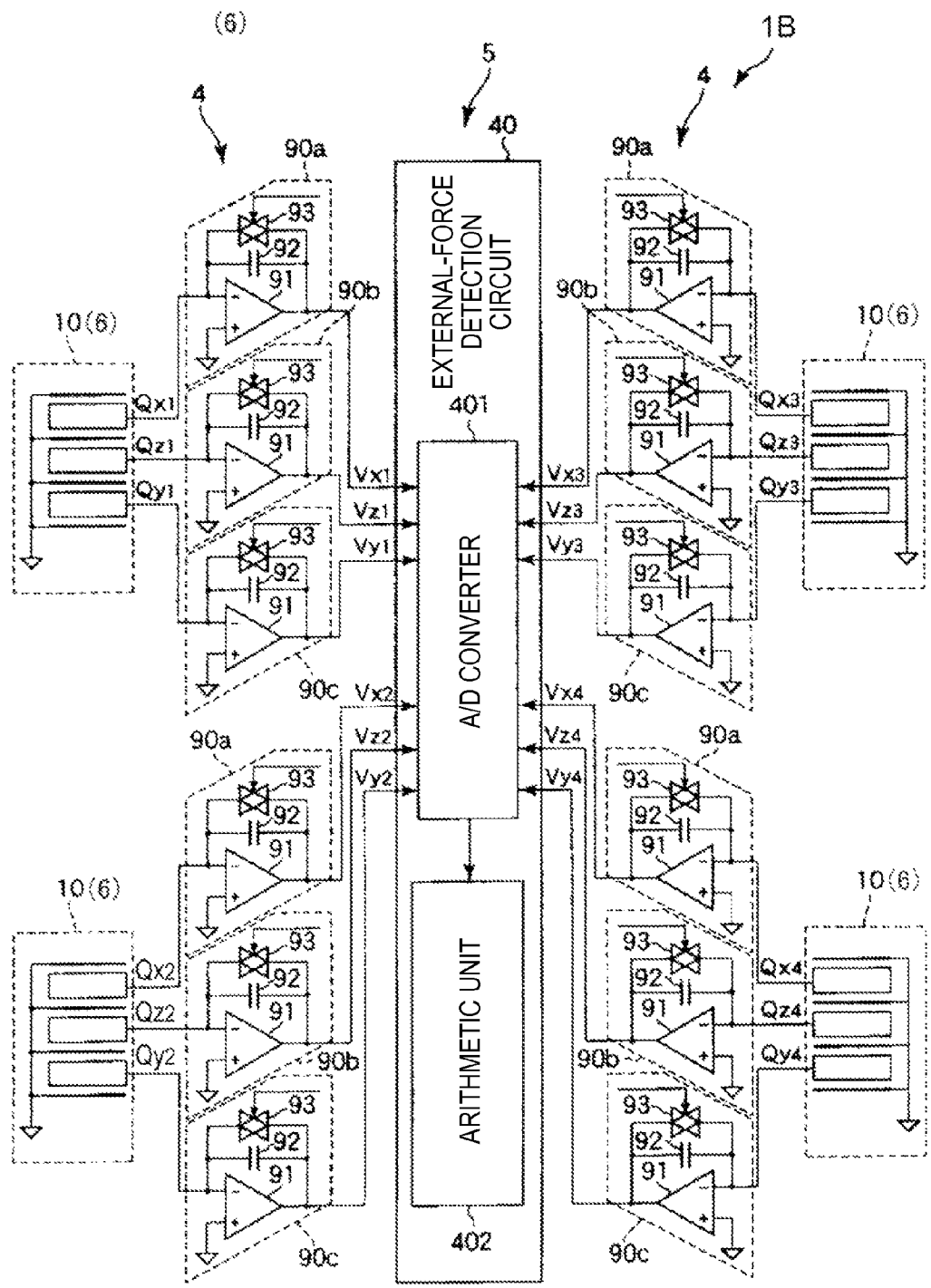
FIG. 11 is a circuit diagram schematically showing the force detecting device shown in FIG. 9.

FIG. 9 is a plan view showing a force detecting device in a second embodiment of the invention. FIG. 10 is a sectional view taken along line G-G in FIG. 9. FIG. 11 is a circuit diagram schematically showing the force detecting device shown in FIG. 9.

Differences of the second embodiment from the first embodiment are mainly explained below. Explanation of similarities is omitted.

Overview of the Force Detecting Device

A force detecting device 1B in the second embodiment shown in FIGS. 9 and 10 has a function of detecting an external force (including a moment), that is, a function of detecting six axial forces (translational force components (shearing forces) in x, y, and z-axis directions and rotational force components (moments) about x, y, and z axes).

As shown in FIGS. 9 and 10, the force detecting device 1B includes four sensor devices 6 and four pressurizing bolts 71. The positions of the sensor devices 6 are not particularly limited. However, in this embodiment, the sensor devices 6, that is, the charge output elements 10 are arranged at equal angle intervals (90° intervals) along the circumferential direction of the first board 2, the second board 3, and the analog circuit board 4. Consequently, it is possible to uniformly detect an external force. It is possible to detect the six axial forces. Further, in this embodiment, all the charge output elements 10 face the same direction. However, the directions of the charge output elements 10 are not limited to this.

On the first board 2, four projections 21 are provided to correspond to the sensor devices 6. Since the projection 21 is explained above in the first embodiment, explanation of the projections 21 is omitted.

The number of the sensor devices 6 is not limited to four and may be, for example, two, three, or five or more. However, the number of the sensor devices 6 is preferably two or more and more preferably three or more. Note that, if the force detecting device 1B includes at least three sensor devices 6, the force detecting device 1B can detect the six axial forces. When there are three sensor devices 6, since the number of the sensor devices 6 is small, it is possible to reduce the weight of the force detecting device 1B. When there are four sensor devices 6 as shown in the figure, the six axial forces can be calculated by extremely simple calculation explained below. Therefore, it is possible to simplify the arithmetic unit 402.

Conversion Output Circuit

As shown in FIG. 11, the conversion output circuits 90a, 90b, and 90c are respectively connected to the charge output elements 10. The conversion output circuits 90a, 90b, and 90c are the same as the conversion output circuit 90 in the first embodiment. Therefore, explanation of the conversion output circuits 90a, 90b, and 90c is omitted.

External-Force Detection Circuit

The external-force detection circuit 40 includes a function of detecting an applied external force on the basis of voltages Vx1, Vx2, Vx3, and Vx4 output from the conversion output circuits 90a, voltages Vz1, Vz2, Vz3, and Vz4 output from the conversion output circuits 90b, and voltages Vy1, Vy2, Vy3, and Vy4 output from the conversion output circuits 90c. The external-force detection circuit 40 includes the A/D converter 401 connected to the conversion output circuits 90a, 90b, and 90c and the arithmetic unit 402 connected to the A/D converter 401.

The A/D converter 401 has a function of converting the voltages Vx1, Vy1, Vz1, Vx2, Vy2, Vz2, Vx3, Vy3, Vz3, Vx4, Vy4, and Vz4 from analog signals into digital signals. The voltages Vx1, Vy1, Vz1, Vx2, Vy2, Vz2, Vx3, Vy3, Vz3, Vx4, Vy4, and Vz4 converted into the digital signals by the A/D converter 401 are input to the arithmetic unit 402.

That is, when an external force for shifting the relative positions of the first board 2 and the second board 3 from each other in the α1 (X) axis direction is applied, the A/D converter 401 outputs the voltages Vx1, Vx2, Vx3, and Vx4. Similarly, when an external force for shifting the relative positions of the first board 2 and the second board 3 from each other in the β1 (Y) axis direction is applied, the A/D converter 401 outputs the voltages Vy1, Vy2, Vy3, and Vy4. When an external force for shifting the relative positions of the first board 2 and the second board 3 from each other in the γ1 (Z) axis direction is applied, the A/D converter 401 outputs the voltages Vz1, Vz2, Vz3, and Vz4.

The first board 2 and the second board 3 are capable of performing relative displacement for relatively rotating about the x axis each other, relative displacement for relatively rotating about the y axis each other, and relative displacement for relatively rotating about the z axis each other and capable of transmitting external forces involved in the rotations to the charge output elements 10.

The arithmetic unit 402 has a function of calculating a translational force component Fx in the x-axis direction, a translational force component Fy in the y-axis direction, a translational force component Fz in the z-axis direction, a rotational force component Mx about the x axis, a rotational force component My about the y axis, and a rotational force component Mz about the z axis on the basis of the voltages Vx1, Vy1, Vz1, Vx2, Vy2, Vz2, Vx3, Vy3, Vz3, Vx4, Vy4, and Vz4. The force components can be calculated by expressions described below.

$Fx=Vx1+Vx2+Vx3+Vx4$ $Fy=Vy1+Vy2+Vy3+Vy4$ $Fz=Vz1+Vz2+Vz3+Vz4$ $Mx=b\times(Vz4-Vz2)$ $My=a\times(Vz3-Vz1)$ $Mz=b\times(Vx2-Vx4)+a\times(Vy1-Vy3)$ where, a and b are constants.

In this way, the force detecting device 1B can detect the six axial forces.

Note that the arithmetic unit 402 can perform, for example, correction for eliminating a difference in sensitivity among the conversion output circuits 90a, 90b, and 90c.

As shown in FIGS. 9 and 10, the first board 2 and the second board 3 are fixed by the four pressurizing bolts 71. Note that the number of the pressurizing bolts 71 is not limited to four and may be, for example, two, three, or five or more.

The positions of the pressurizing bolts 71 are not particularly limited. However, in this embodiment, the pressurizing bolts 71 are arranged at equal angle intervals (90° intervals) along the circumferential direction of the first board 2, the second board 3, the analog circuit board 4, and the digital circuit board 5. Consequently, the first board 2 and the second board 3 are fixed in a well-balanced state. Pressurization can be applied to the charge output elements 10 in a well-balanced state.

With the force detecting device 1B, it is possible to obtain effects same as the effects in the first embodiment.

Third Embodiment

Figure 12:
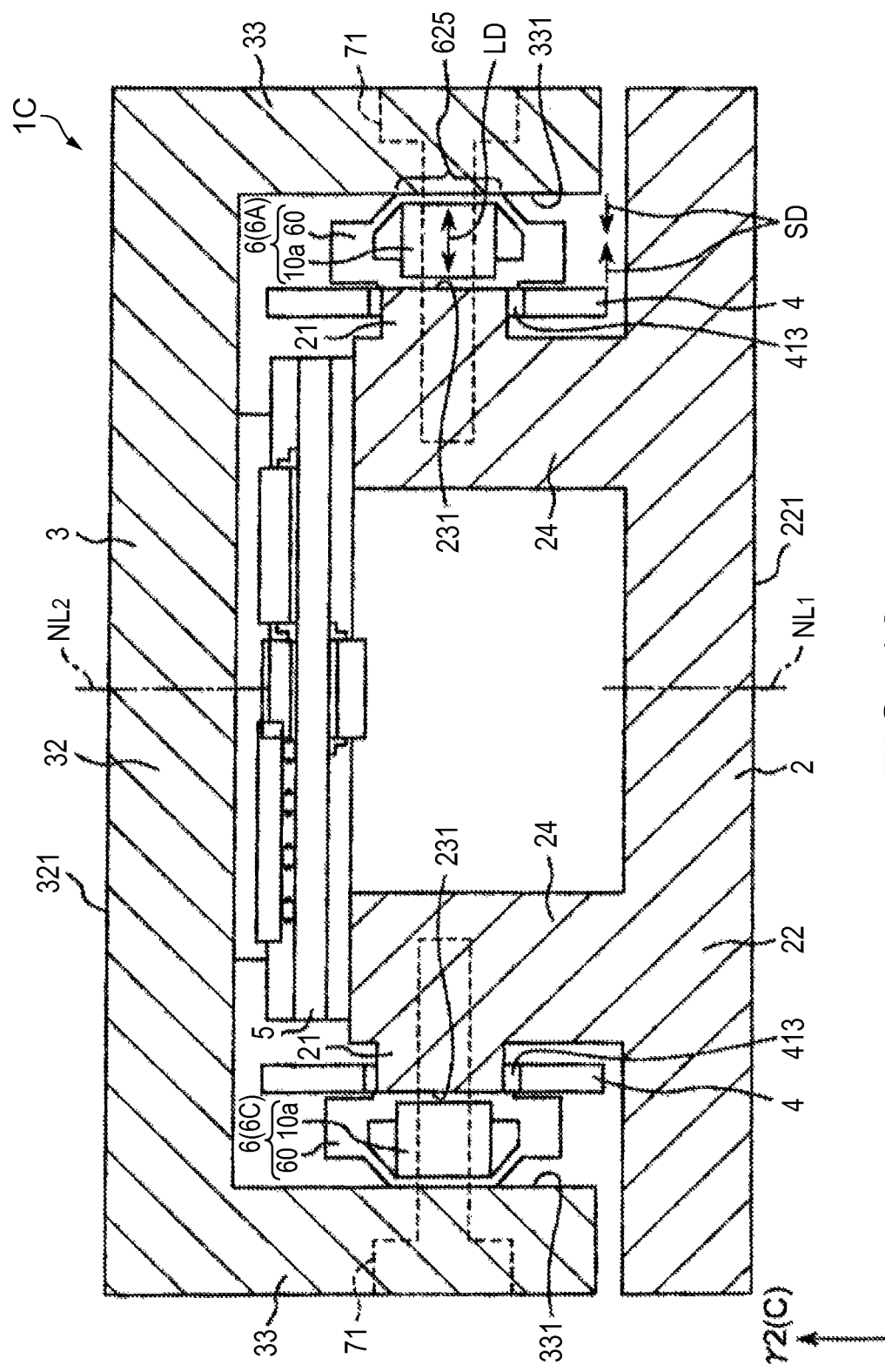
FIG. 12 is a sectional view showing a force detecting device in a third embodiment of the invention.
Figure 13:
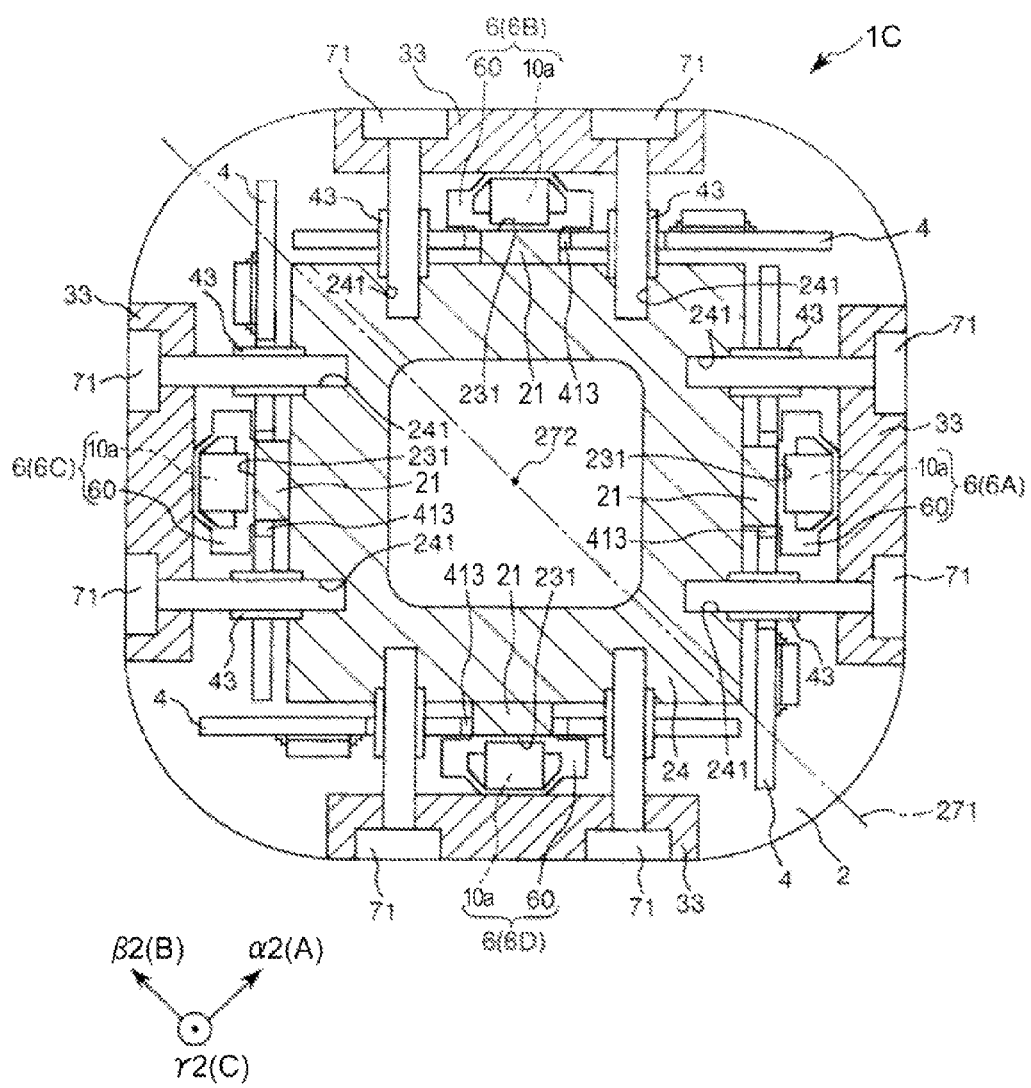
FIG. 13 is a plan view of the force detecting device shown in FIG. 12.
Figure 14:
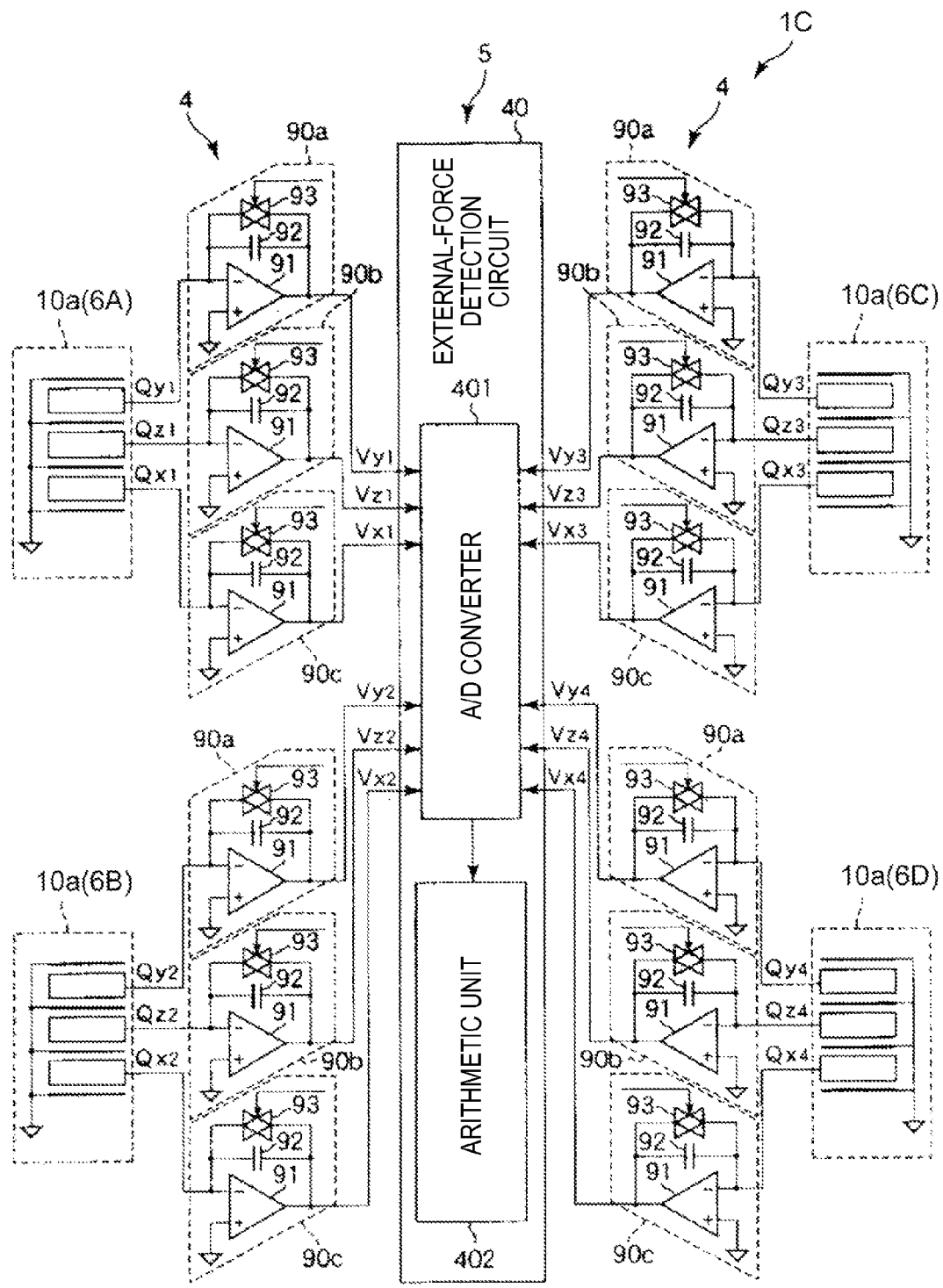
FIG. 14 is a circuit diagram schematically showing the force detecting device shown in FIG. 12.
Figure 15:
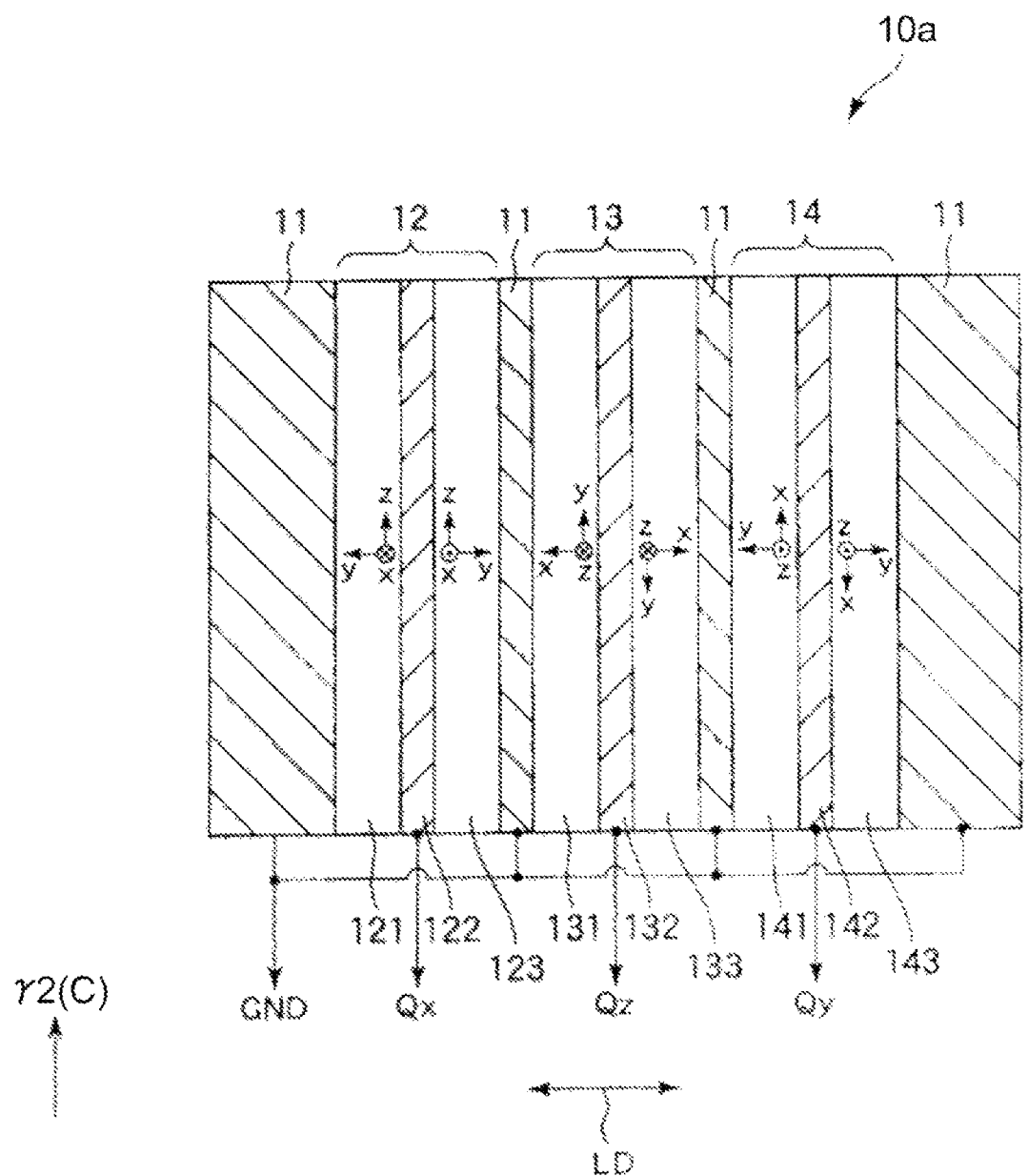
FIG. 15 is a sectional view schematically showing a charge output element included in the force detecting device shown in FIG. 12.
Figure 16:
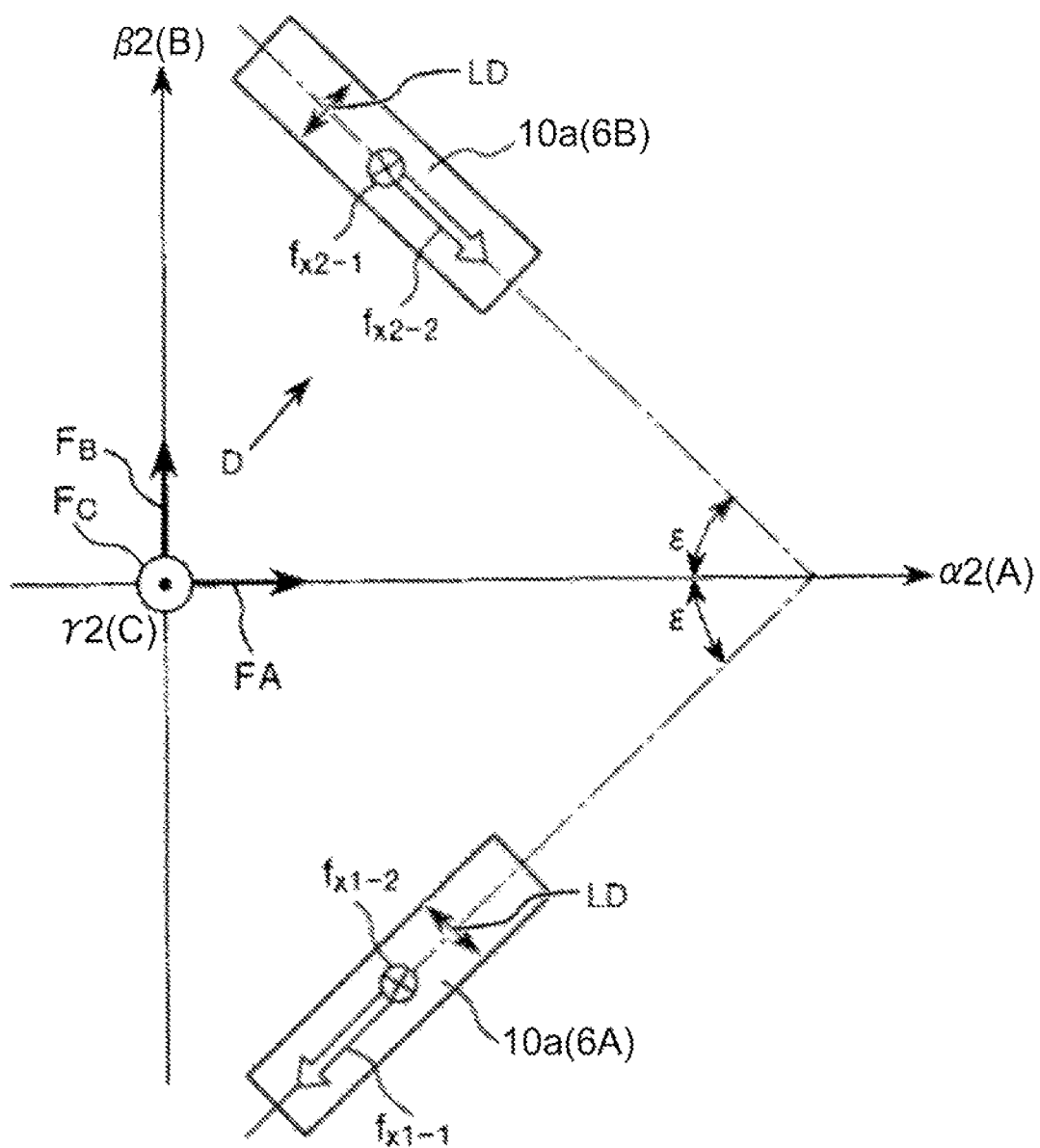
FIG. 16 is a schematic diagram showing an action state of a force detected by the charge output element of the force detecting device shown in FIG. 12.
Figure 17:
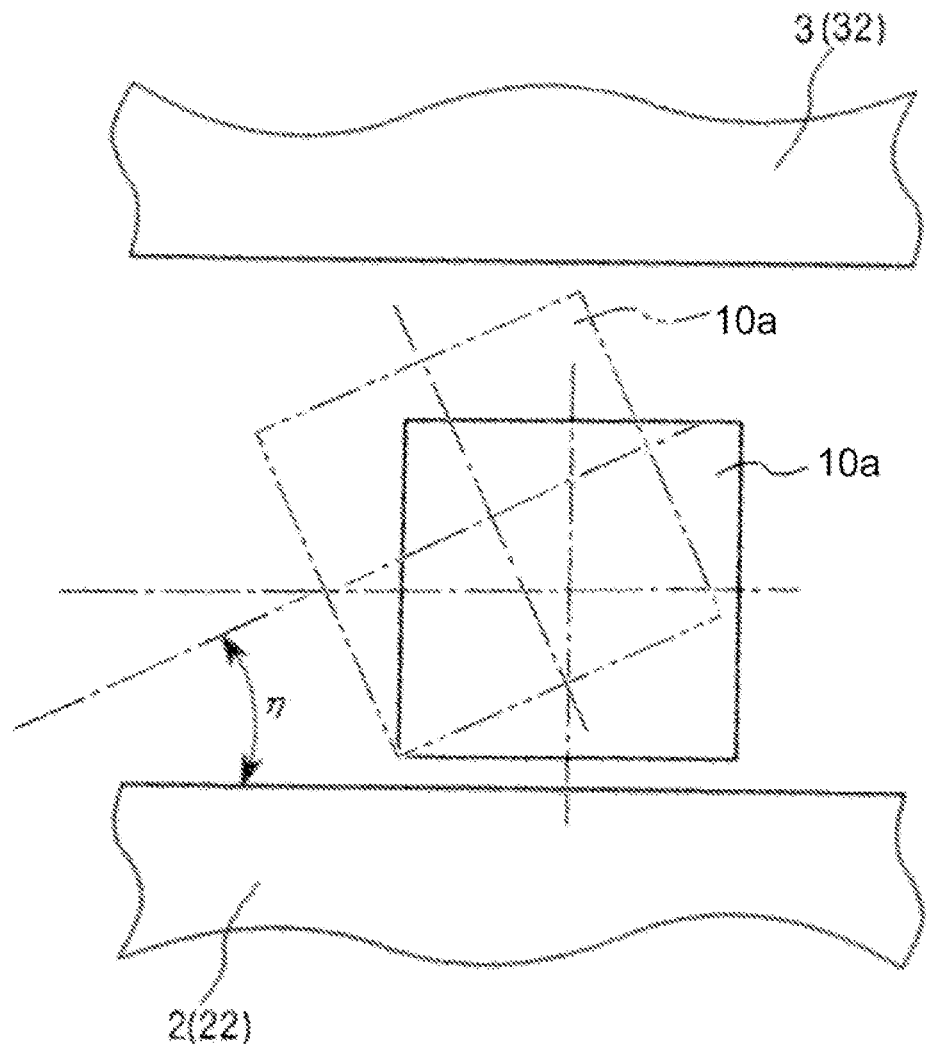
FIG. 17 is a diagram of the charge output element viewed from an arrow D direction in FIG. 16.
Figure 18:
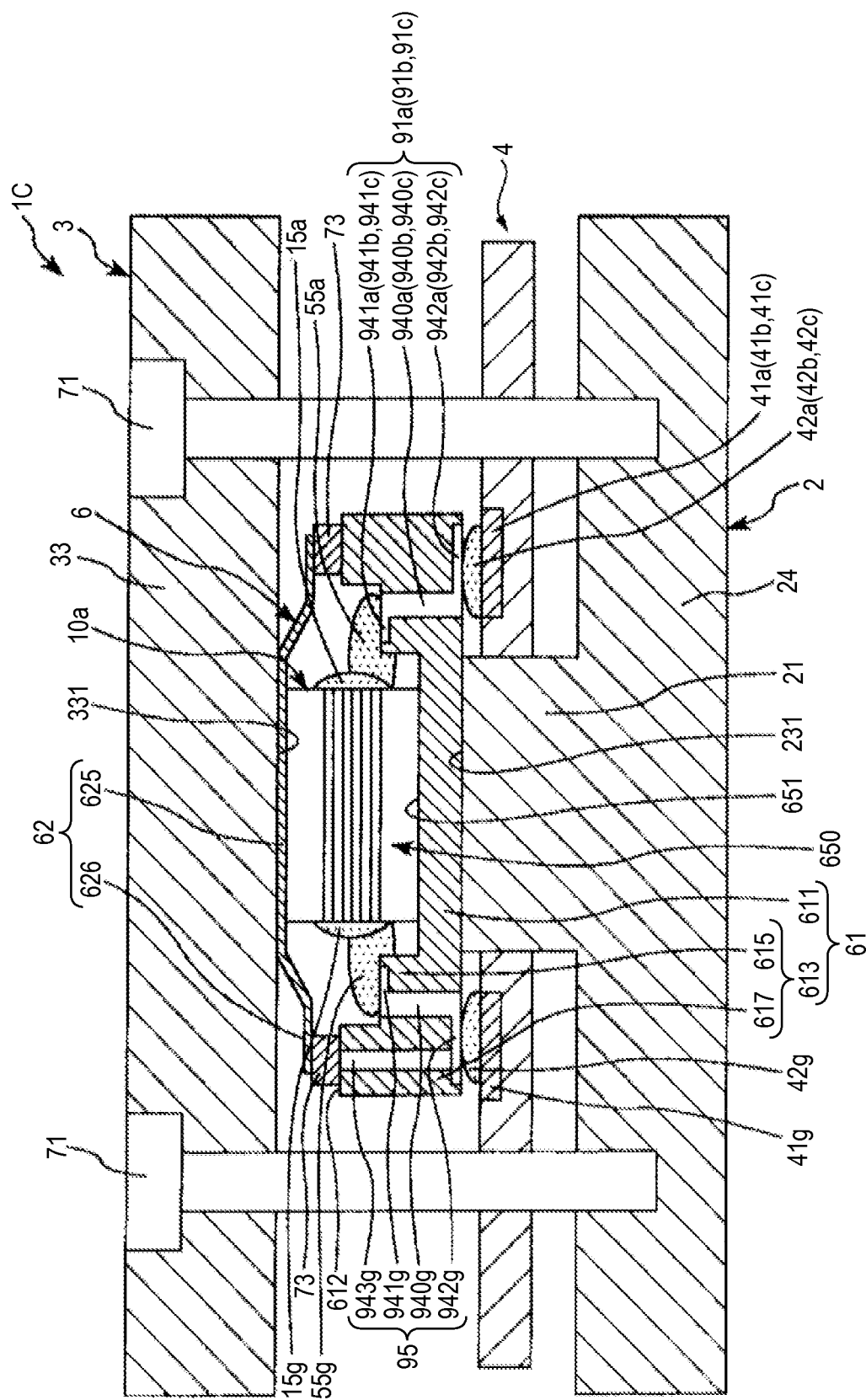
FIG. 18 is a partially enlarged detailed view of the vicinity of the charge output element of the force detecting device shown in FIG. 12.
Figure 19:
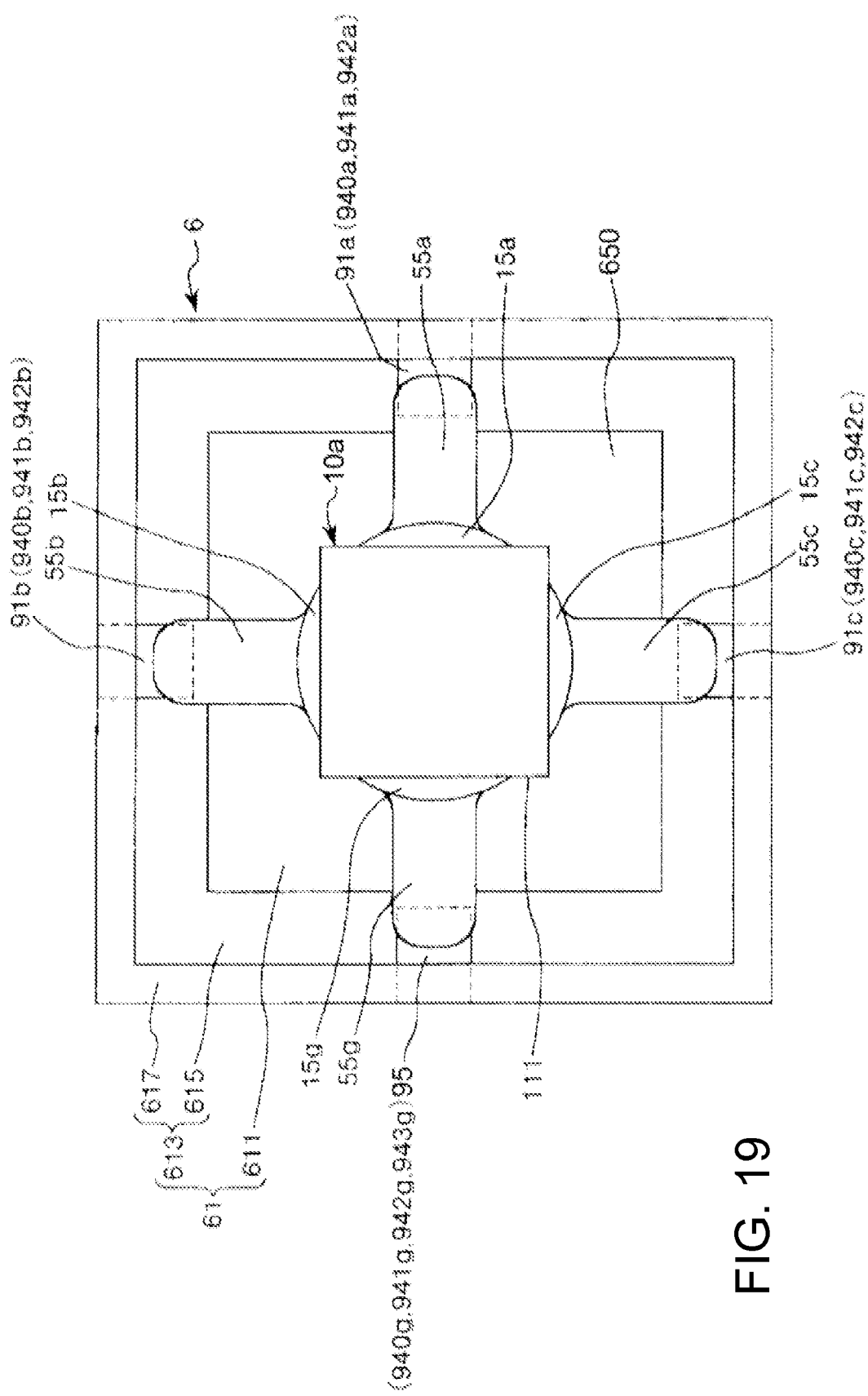
FIG. 19 is a plan view of the charge output element shown in FIG. 18.

FIG. 12 is a sectional view showing a force detecting device in a third embodiment of the invention. FIG. 13 is a plan view of the force detecting device shown in FIG. 12. FIG. 14 is a circuit diagram schematically showing the force detecting device shown in FIG. 12. FIG. 15 is a sectional view schematically showing a charge output element included in the force detecting device shown in FIG. 12. FIG. 16 is a schematic diagram showing an action state of a force detected by the charge output element of the force detecting device shown in FIG. 12. FIG. 17 is a diagram of the charge output element viewed from an arrow D direction in FIG. 16. FIG. 18 is a partially enlarged detailed view of the vicinity of the charge output element of the force detecting device shown in FIG. 12. FIG. 19 is a plan view of the charge output element shown in FIG. 18.

Note that, in the following explanation, the upper side in FIG. 12 is referred to as "up" or "upward" and the lower side in the figure is referred to as "down" or "downward".

In FIGS. 13 and 16, an α2 axis, a β2 axis, and a γ2 axis are shown as three axes orthogonal to one another. In FIGS. 12 and 15, only the γ2 axis among the three axes is shown. A direction parallel to the α2 (A) axis is referred to as "α2 (A)-axis direction", a direction parallel to the β2 (B) axis is referred to as "β2 (B)-axis direction", and a direction parallel to the γ2 (C) axis is referred to as "γ2 (C)-axis direction". A plane defined by the α2 axis and the β2 axis is referred to as "αβ plane", a plane defined by the β2 axis and γ2 axis is referred to as "βγ plane", and a plane defined by the α2 axis and the γ2 axis is referred to as "αγ plane". In the α2 direction, the β2 direction, and the γ2 direction, an arrow distal end side is set as "+ (positive) side" and an arrow proximal end side is set as "− (negative) side".

Overview of the Force Detecting Device

A force detecting device 1C shown in FIG. 12 has a function of detecting an external force applied to the force detecting device 1C, that is, six axial forces (translational force components in the α2, β2, and γ2 directions and rotational force components about the α2, β2, and γ2 axes).

The force detecting device 1C includes a first base section 2 functioning as a first board, a second base section 3 arranged a predetermined space apart from the first base section 2 and functioning as a second board opposed to the first base section 2, the analog circuit board 4 housed (provided) between the first base section 2 and the second base section 3, the digital circuit board 5 housed (provided) between the first base section 2 and the second base section 3 and electrically connected to the analog circuit board 4, the four sensor devices (pressure detecting sections) 6 mounted on the analog circuit board 4 and including charge output elements (piezoelectric elements) 10a that output signals according to an external force and the packages (housing sections) 60 that house the charge output elements 10a, and eight pressurizing bolts (fixing members) 71.

The configurations of the sections of the force detecting device 1C are explained in detail below.

Note that, in the following explanation, as shown in FIG. 13, among the four sensor devices 6, the sensor device 6 located on the right side in FIG. 13 is referred to as "sensor device 6A" and the other sensor devices 6 are referred to as "sensor device 6B", "sensor device 6C", and "sensor device 6D" in counterclockwise order.

As shown in FIG. 12, the external shape of the first base section (base plate) 2 is a tabular shape. The plane shape of the first base section 2 is a rounded square shape. Note that the plane shape of the first base section 2 is not limited to the plane shape shown in the figure and may be, for example, a circular shape or polygonal shapes other than the square.

When the force detecting device 1C is fixed to, for example, a robot and used, a lower surface 221 of the first base section 2 functions as an attachment surface (a first attachment surface) for the robot (a measurement target).

The first base section 2 includes a bottom plate 22 and wall sections 24 erected upward from the bottom plate 22.

The wall sections 24 are formed in an "L" shape. The projections 21 are formed to project respectively on two surfaces facing outward. Top surfaces (first surfaces) 231 of the projections 21 are planes perpendicular to the bottom plate 22. In the projecting sections 21, female screws 241 that screw with the pressurizing bolts 71 explained below are provided (see FIG. 13).

As shown in FIG. 12, the second base section (the cover plate) 3 is arranged a predetermined space apart from the first board 2 to be opposed to the first board 2.

Like the first base section 2, the external shape of the second base section 3 is a tabular shape. The plane shape of the second base section 3 is preferably a shape corresponding to the plane shape of the first base section 2. In this embodiment, like the plan view shape of the first base section 2, the plan view shape of the second base section 3 is a square shape rounded at corners. The second base section 3 preferably has size enough for including the first base section 2.

When the force detecting device 1C is fixed to, for example, a robot and used, an upper surface (a second surface) 321 of the second base section 3 functions as an attachment surface (a second attachment surface) for an end effector (a measurement target) mounted on the robot. The upper surface 321 of the second base section 3 and the lower surface 221 of the first base section 2 are parallel to each other in a natural state in which an external force is not applied.

The second base section 3 includes a top plate 32 and sidewalls 33 formed at edge sections of the top plate 32 and projecting downward from the edge sections. Inner wall surfaces (second surfaces) 331 of the sidewalls 33 are planes perpendicular to the top plate 32. The sensor devices 6 are provided between the top surfaces 231 of the first base section 2 and the inner wall surfaces 331 of the second base section 3.

The first base section 2 and the second base section 3 are connected and fixed by the pressurizing bolts 71. As shown in FIG. 13, there are eight (a plurality of) pressurizing bolts 71. Among the eight pressurizing bolts 71, two pressurizing bolts 71 are arranged on both sides of each of the sensor devices 6. Note that the number of the pressurizing bolts 71 for one sensor device 6 is not limited to two and may be, for example, three or more.

A constituent material of the pressurizing bolts 71 is not particularly limited. For example, various resin materials, various metal materials, and the like can be used.

The first base section 2 and the second base section 3 connected by the pressurizing bolts 71 in this way form a housing space for housing the sensor devices 6A to 6D, the analog circuit board 4, and the digital circuit board 5. The housing space has a sectional shape of a circular shape or a square rounded at corners.

As shown in FIG. 12, the analog circuit boards 4 connected to the sensor devices 6 are provided between the first base section 2 and the second base section 3.

In parts of the analog circuit boards 4 where the sensor devices 6 (specifically, the charge output elements 10a) are formed, holes 413, into which the projections 21 of the first base section 2 are inserted, are formed. The holes 413 are through-holes that pierce through the analog circuit boards 4.

As shown in FIG. 13, through-holes, through which the pressurizing bolts 71 are inserted, are provided in the analog circuit boards 4. Pipes 43 formed of an insulating material such as a resin material are fixed to, for example, by fitting, portions (through-holes) of the analog circuit boards 4 through which the pressurizing bolts 71 are inserted.

As shown in FIG. 14, the analog circuit board 4 connected to the sensor device 6A includes the conversion output circuit 90a that converts a charge Qy1 output from the charge output element 10a of the mounted sensor device 6A into a voltage Vy1, the conversion output circuit 90b that converts a charge Qz1 output from the charge output element 10a into a voltage Vz1, and the conversion output circuit 90c that converts a charge Qx1 output from the charge output element 10a into a voltage Vx1.

The analog circuit board 4 connected to the sensor device 6B includes the conversion output circuit 90a that converts a charge Qy2 output from the charge output element 10a of the mounted sensor device 6B into a voltage Vy2, the conversion output circuit 90b that converts a charge Qz2 output from the charge output element 10a into a voltage Vz2, and the conversion output circuit 90c that converts a charge Qx2 output from the charge output element 10a into a voltage Vx2.

The analog circuit board 4 connected to the sensor device 6C includes the conversion output circuit 90a that converts a charge Qy3 output from the charge output element 10a of the mounted sensor device 6C into a voltage Vy3, the conversion output circuit 90b that converts a charge Qz3 output from the charge output element 10a into a voltage Vz3, and the conversion output circuit 90c that converts a charge Qx3 output from the charge output element 10a into a voltage Vx3.

The analog circuit board 4 connected to the sensor device 6D includes the conversion output circuit 90a that converts a charge Qy4 output from the charge output element 10a of the mounted sensor device 6D into a voltage Vy4, the conversion output circuit 90b that converts a charge Qz4 output from the charge output element 10a into a voltage Vz4, and the conversion output circuit 90c that converts a charge Qx4 output from the charge output element 10a into a voltage Vx4.

As shown in FIG. 12, between the first base section 2 and the second base section 3, the digital circuit board 5 connected to the analog circuit boards 4 is provided in a position different from the positions on the first base section 2 where the analog circuit boards 4 are provided. As shown in FIG. 14, the digital circuit board 5 includes the external-force detection circuit 40 including the A/D converter 401 connected to the conversion output circuits (conversion circuits) 90a, 90b, and 90c and the arithmetic unit (an arithmetic circuit) 402 connected to the A/D converter 401.

Note that constituent materials of the first base section 2, the second base section 3, parts other than elements and wires of the analog circuit boards 4, and parts other than elements and wires of the digital circuit board 5 are not particularly limited. For example, various resin materials and various metal materials can be used.

The first base section 2 and the second base section 3 are respectively formed of members, the external shapes of which are formed in tabular shapes. However, the external shapes of the first base section 2 and the second base section 3 are not limited to this. For example, one base section may be configured by a member formed in a tabular shape and the other base section may be configured by a member formed in a block shape.

Sensor Devices

The sensor devices 6 are explained in detail.

As shown in FIGS. 12 and 13, the sensor device 6A is sandwiched by the top surface 231 of one projection 21 among the four projections 21 of the first base section 2 and the inner wall surface 331 opposed to the top surface 231. Like the sensor device 6A, the sensor device 6B is sandwiched by the top surface 231 of one projection 21 different from the projections 21 and the inner wall surface 331 opposed to the top surface 231. The sensor device 6C is sandwiched by the top surface 231 of one projection 21 different from the projections 21 and the inner wall surface 331 opposed to the top surface 231. The sensor device 6D is sandwiched by the top surface 231 of one projection 21 different from the projections 21 and the inner wall surface 331 opposed to the top surface 231.

Note that, in the following explanation, a direction in which the sensor devices 6A to 6D are sandwiched by the first base section 2 and the second base section 3 is referred to as "sandwiching direction SD". A direction in which the sensor device 6A among the sensor devices 6A to 6D is sandwiched is sometimes referred to as first sandwiching direction. A direction in which the sensor device 6B is sandwiched is sometimes referred to as second sandwiching direction. A direction in which the sensor device 6C is sandwiched is sometimes referred to as third sandwiching direction. A direction in which the sensor device 6D is sandwiched is sometimes referred to as fourth sandwiching direction.

Note that, in this embodiment, as shown in FIG. 12, the sensor devices 6 are provided on the second base section (the sidewall 33) sides of the analog circuit boards 4. However, the sensor devices 6 may be provided on the first base section 2 sides of the analog circuit boards 4.

As shown in FIG. 13, the sensor device 6A and the sensor device 6B and the sensor device 6C and the sensor device 6D are respectively arranged symmetrically with respect to a center axis 271 extending along the β2 axis of the first base section 2. That is, the sensor devices 6A to 6D are arranged at equal angle intervals around a center 272 of the first base section 2. It is possible to uniformly detect an external force by arranging the sensor devices 6A to 6D in this way.

Note that the arrangement of the sensor devices 6A to 6D is not limited to the arrangement shown in the figures. However, the sensor devices 6A to 6D are preferably arranged in positions separated from the center section (the center 272) of the second base section 3 as much as possible viewed from the upper surface 321 of the second base section 3. Consequently, it is possible to stably detect an external force applied to the force detecting device 1C.

In this embodiment, all the sensor devices 6A to 6D are mounted to face the same direction. However, the directions of the sensor devices 6A to 6D may be different from one another.

The sensor devices 6 arranged in this way include, as shown in FIG. 12, the charge output elements 10a and the packages 60 that house the charge output elements 10a. In this embodiment, the sensor devices 6A to 6D have the same configuration.

Charge Output Elements

The charge output elements 10a included in the sensor devices 6 are explained in detail below. Note that the packages that house the charge output elements 10a are explained in detail later.

The charge output element 10a has a function of outputting charges according to an external force applied to the force detecting device 1C, that is, an external force applied to at least one base section of the first base section 2 and the second base section 3.

Note that the charge output elements 10a included in the sensor devices 6A to 6D have the same configuration. Therefore, one charge output element 10a is mainly explained.

As shown in FIG. 15, the charge output element 10a included in the sensor device 6 includes the ground electrode layers 11, the first sensor 12, the second sensor 13, and the third sensor 14.

The first sensor 12 has a function of outputting the charge Qx (any one of the charges Qx1, Qx2, Qx3, and Qx4) according to an external force (a shearing force). The second sensor 13 has a function of outputting the charge Qz (the charge Qz1, Qz2, Qz3, or Qz4) according to an external force (a compression/tensile force). The third sensor 14 has a function of outputting the charge Qy (the charge Qy1, Qy2, Qy3, or Qy4) according to an external force (a shearing force).

In the charge output element 10a included in the sensor device 6, the ground electrodes 11 and the sensors 12, 13, and 14 are alternately laminated in parallel. In the following explanation, a direction in which the ground electrodes 11 and the sensors 12, 13, and 14 are laminated is referred to as "laminating direction LD". The laminating direction LD is a direction orthogonal to a normal $NL_2$ of the upper surface 321 (a normal $NL_1$ of the lower surface 221). The laminating direction LD is parallel to the sandwiching direction SD.

The shape of the charge output element 10a is not particularly limited. However, in this embodiment, the charge output element 10a is formed in a square shape viewed from a direction perpendicular to the inner wall surfaces 331 of the sidewalls 33. Note that examples of other external shapes of the charge output elements 10a include other polygonal shapes such as a pentagonal shape, a circular shape, and an elliptical shape.

The ground electrode layers 11, the first sensor 12, the second sensor 13, and the third sensor 14 are explained in detail below.

The ground electrode layers 11 are electrodes earthed to the ground (a reference potential point). A material forming the ground electrode layers 11 is not particularly limited. However, for example, gold, titanium, aluminum, copper, iron, nickel, or alloys including these kinds of metal are preferable. Among these materials, in particular, it is preferable to use stainless steel, which is an iron alloy. The ground electrode layers 11 formed of the stainless steel have excellent durability and corrosion resistance.

The first sensor 12 has a function of outputting the charge Qx according to an external force (a shearing force) of the first detection direction in a direction orthogonal to the laminating direction LD (the first sandwiching direction), that is, same as the direction of the normal $NL_2$ (the normal $NL_1$). That is, the first sensor 12 is configured to output positive charges or negative charges according to the external force.

The first sensor 12 includes the first piezoelectric layer (a first detection plate) 121, the second piezoelectric layer (the first detection plate) 123 provided to be opposed to the first piezoelectric layer 121, and the output electrode layer 122 provided between the first piezoelectric layer 121 and the second piezoelectric layer 123.

The first piezoelectric layer 121 is configured by a Y-cut quartz plate and has an x axis, a y axis, and a z axis, which are crystal axes orthogonal to one another. The y axis is an axis extending along the thickness direction of the first piezoelectric layer 121. The x axis is an axis extending along a paper surface depth direction in FIG. 15. The z axis is an axis extending along the up down direction in FIG. 15.

In the following explanation, a distal end side of these arrows shown in the figure is represented as "+ (positive)" and a proximal end side is represented as "− (negative)". A direction parallel to the x axis is referred to as "x-axis direction", a direction parallel to the y axis is referred to as "y-axis direction", and a direction parallel to the z axis is referred to as "z-axis direction". Note that the same applies to the second piezoelectric layer 123, the third piezoelectric layer 131, the fourth piezoelectric layer 133, the fifth piezoelectric layer 141, and the sixth piezoelectric layer 143 explained below.

The first piezoelectric layer 121 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along a positive direction of the x axis is applied to the surface of the first piezoelectric layer 121, charges are induced in the first piezoelectric layer 121 by the piezoelectric effect. As a result, positive charges concentrate near the surface of the first piezoelectric layer 121 on the output electrode layer 122 side. Negative charges concentrate near the surface of the first piezoelectric layer 121 on the ground electrode layer 11 side. Similarly, when an external force along a negative direction of the x axis is applied to the surface of the first piezoelectric layer 121, negative charges concentrate near the surface of the first piezoelectric layer 121 on the output electrode layer 122 side. Positive charges concentrate near the surface of the first piezoelectric layer 121 on the ground electrode layer 11 side.

The second piezoelectric layer 123 is also configured by a Y-cut quartz plate and has an x axis, a y axis, and a z axis, which are crystal axes orthogonal to one another. The y axis is an axis extending along the thickness direction of the second piezoelectric layer 123. The x axis is an axis extending along the paper surface depth direction in FIG. 15. The z axis is an axis extending along the up down direction in FIG. 15.

Like the first piezoelectric layer 121, the second piezoelectric layer 123 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force (a shearing force) along a positive direction of the x axis is applied to the surface of the second piezoelectric layer 123, charges are induced in the second piezoelectric layer 123 by the piezoelectric effect. As a result, positive charges concentrate near the surface of the second piezoelectric layer 123 on the output electrode layer 122 side. Negative charges concentrate near the surface of the second piezoelectric layer 123 on the ground electrode layer 11 side. Similarly, when an external force along a negative direction of the x axis is applied to the surface of the second piezoelectric layer 123, negative charges concentrate near the surface of the second piezoelectric layer 123 on the output electrode layer 122 side. Positive charges concentrate near the surface of the second piezoelectric layer 123 on the ground electrode layer 11 side.

The output electrode layer 122 has a function of outputting, as the charge Qx, positive charges or negative charges generated in the first piezoelectric layer 121 and the second piezoelectric layer 123. As explained above, when an external force along the positive direction of the x axis is applied to the surface of the first piezoelectric layer 121 or the surface of the second piezoelectric layer 123, the positive charges concentrate near the output electrode layer 122. As a result, a positive charge Qx is output from the output electrode layer 122. On the other hand, when an external force along the negative direction of the x axis is applied to the surface of the first piezoelectric layer 121 or the surface of the second piezoelectric layer 123, the negative charges concentrate near the output electrode layer 122. As a result, a negative charge Qx is output from the output electrode layer 122.

Since the first sensor 12 includes the first piezoelectric layer 121 and the second piezoelectric layer 123, compared with when the first sensor 12 is configured by only one of the first piezoelectric layer 121 and the second piezoelectric layer 123 and the output electrode layer 122, it is possible to increase the positive charges or the negative charges concentrating near the output electrode layer 122. As a result, it is possible to increase the charge Qx output from the output electrode layer 122. Note that the same applies to the second sensor 13 and the third sensor 14 explained below.

The size of the output electrode layer 122 is preferably equal to or larger than the size of the first piezoelectric layer 121 and the second piezoelectric layer 123. When the output electrode layer 122 is smaller than the first piezoelectric layer 121 or the second piezoelectric layer 123, a part of the first piezoelectric layer 121 or the second piezoelectric layer 123 is not in contact with the output electrode layer 122. Therefore, a part of charges generated in the first piezoelectric layer 121 or the second piezoelectric layer 123 sometimes cannot be output from the output electrode layer 122. As a result, the charge Qx output from the output electrode layer 122 decreases. Note that the same applies to the output electrode layers 132 and 142.

The second sensor 13 has a function of outputting the charge Qz according to an external force (a compression/tensile force). That is, the second sensor 13 is configured to output positive charges according to a compression force and output negative charges according to a tensile force.

The second sensor 13 includes the third piezoelectric layer (a third detection plate) 131, the fourth piezoelectric layer (the third detection plate) 133 provided to be opposed to the third piezoelectric layer 131, and the output electrode layer 132 provided between the third piezoelectric layer 131 and the fourth piezoelectric layer 133.

The third piezoelectric layer 131 is configured by an X-cut quartz plate and has an x axis, a y axis, and a z axis orthogonal to one another. The x axis is an axis extending along the thickness direction of the third piezoelectric layer 131. The y axis is an axis extending along the up down direction in FIG. 15. The z axis is an axis extending along the paper surface depth direction in FIG. 15.

When a compression force parallel to the x axis is applied to the surface of the third piezoelectric layer 131, charges are induced in the third piezoelectric layer 131 by the piezoelectric effect. As a result, positive charges concentrate near the surface of the third piezoelectric layer 131 on the output electrode layer 132 side. Negative charges concentrate near the surface of the third piezoelectric layer 131 on the ground electrode layer 11 side. Similarly, when a tensile force parallel to the x axis is applied to the surface of the third piezoelectric layer 131, negative charges concentrate near the surface of the third piezoelectric layer 131 on the output electrode layer 132 side. Positive charges concentrate near the surface of the third piezoelectric layer 131 on the ground electrode layer 11 side.

The fourth piezoelectric layer 133 is also configured by an X-cut quartz plate and has an x axis, a y axis, and a z axis orthogonal to one another. The x axis is an axis extending along the thickness direction of the fourth piezoelectric layer 133. The y axis is an axis extending along the up down direction in FIG. 15. The z axis is an axis extending along the paper surface depth direction in FIG. 15.

When a compression force parallel to the x axis is applied to the surface of the fourth piezoelectric layer 133, charges are induced in the fourth piezoelectric layer 133 by the piezoelectric effect. As a result, positive charges concentrate near the surface of the fourth piezoelectric layer 133 on the output electrode layer 132 side. Negative charges concentrate near the surface of the fourth piezoelectric layer 133 on the ground electrode layer 11 side. Similarly, when a tensile force parallel to the x axis is applied to the surface of the fourth piezoelectric layer 133, negative charges concentrate near the surface of the fourth piezoelectric layer 133 on the output electrode layer 132 side. Positive charges concentrate near the surface of the fourth piezoelectric layer 133 on the ground electrode layer 11 side.

The output electrode layer 132 has a function of outputting, as the charge Qz, positive charges or negative charges generated in the third piezoelectric layer 131 and the fourth piezoelectric layer 133. As explained above, when a compression force parallel to the x axis is applied to the surface of the third piezoelectric layer 131 or the surface of the fourth piezoelectric layer 133, the positive charges concentrate near the output electrode layer 132. As a result, a positive charge Qz is output from the output electrode layer 132. On the other hand, when a tensile force parallel to the x axis is applied to the surface of the third piezoelectric layer 131 or the surface of the fourth piezoelectric layer 133, the negative charges concentrate near the output electrode layer 132. As a result, a negative charge Qz is output from the output electrode layer 132.

The third sensor 14 has a function of outputting the charge Qy according to an external force (a shearing force) of the second detection direction in a direction orthogonal to the laminating direction LD (the second sandwiching direction) and crossing a first detection direction of an external force acting when the first sensor 12 outputs the charge Qx. That is, the third sensor 14 is configured to output positive charges or negative charges according to the external force.

The third sensor 14 includes the fifth piezoelectric layer (a second detection plate) 141, the sixth piezoelectric layer (the second detection plate) 143 provided to be opposed to the fifth piezoelectric layer 141, and the output electrode layer 142 provided between the fifth piezoelectric layer 141 and the sixth piezoelectric layer 143.

The fifth piezoelectric layer 141 is configured by a Y-cut quartz plate and has an x axis, a y axis, and a z axis, which are crystal axes orthogonal to one another. The y axis is an axis extending along the thickness direction of the fifth piezoelectric layer 141. The x axis is an axis extending along the up down direction in FIG. 15. The z axis is an axis extending along the paper surface depth direction in FIG. 15.

The fifth piezoelectric layer 141 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along a positive direction of the x axis is applied to the surface of the fifth piezoelectric layer 141, charges are induced in the fifth piezoelectric layer 141 by the piezoelectric effect. As a result, positive charges concentrate near the surface of the fifth piezoelectric layer 141 on the output electrode layer 142 side. Negative charges concentrate near the surface of the fifth piezoelectric layer 141 on the ground electrode layer 11 side. Similarly, when an external force along a negative direction of the x axis is applied to the surface of the fifth piezoelectric layer 141, negative charges concentrate near the surface of the fifth piezoelectric layer 141 on the output electrode layer 142 side. Positive charges concentrate near the surface of the fifth piezoelectric layer 141 on the ground electrode layer 11 side.

The sixth piezoelectric layer 143 is also configured by a Y-cut quartz plate and has an x axis, a y axis, and a z axis, which are crystal axes orthogonal to one another. The y axis is an axis extending along the thickness direction of the sixth piezoelectric layer 143. The x axis is an axis extending along the up down direction in FIG. 15. The z axis is an axis extending along the paper surface depth direction in FIG. 15.

Like the fifth piezoelectric layer 141, the sixth piezoelectric layer 143 formed of quartz has excellent characteristics such as a wide dynamic range, high rigidity, a high specific frequency, and high load resistance. The Y-cut quartz plate generates charges according to an external force (a shearing force) applied along the surface direction of the Y-cut quartz plate.

When an external force along a positive direction of the x axis is applied to the surface of the sixth piezoelectric layer 143, charges are induced in the sixth piezoelectric layer 143 by the piezoelectric effect. As a result, positive charges concentrate near the surface of the sixth piezoelectric layer 143 on the output electrode layer 142 side. Negative charges concentrate near the surface of the sixth piezoelectric layer 143 on the ground electrode layer 11 side. Similarly, when an external force along a negative direction of the x axis is applied to the surface of the sixth piezoelectric layer 143, negative charges concentrate near the surface of the sixth piezoelectric layer 143 on the output electrode layer 142 side. Positive charges concentrate near the surface of the sixth piezoelectric layer 143 on the ground electrode layer 11 side.

In the charge output element 10*a*, when viewed from the laminating direction LD, the x axes of the first piezoelectric layer 121 and the second piezoelectric layer 123 and the x axes of the fifth piezoelectric layer 141 and the sixth piezoelectric layer 143 cross each other. When viewed from the laminating direction LD, the z axes of the first piezoelectric layer 121 and the second piezoelectric layer 123 and the z axes of the fifth piezoelectric layer 141 and the sixth piezoelectric layer 143 cross each other.

The output electrode layer 142 has a function of outputting, as the charge Qy, positive charges or negative charges generated in the fifth piezoelectric layer 141 and the sixth piezoelectric layer 143. As explained above, when an external force along the positive direction of the x axis is applied to the surface of the fifth piezoelectric layer 141 or the surface of the sixth piezoelectric layer 143, the positive charges concentrate near the output electrode layer 142. As a result, a positive charge Qy is output from the output electrode layer 142. On the other hand, when an external force along the negative direction of the x axis is applied to the surface of the fifth piezoelectric layer 141 or the surface of the sixth piezoelectric layer 143, the negative charges concentrate near the output electrode layer 142. As a result, a negative charge Qy is output from the output electrode layer 142.

As explained above, in the charge output element 10a, the first sensor 12, the second sensor 13, and the third sensor 14 are laminated such that force detecting directions of the sensors are orthogonal to one another. Consequently, the sensors can respectively induce charges according to force components orthogonal to one another. Therefore, the charge output element 10a can output the three charges Qx, Qy, and Qz according to the respective external forces along the x axis, the y axis, and the z axis.

As explained above, the charge output element 10a can output the charge Qz. However, in the force detecting device 1C, it is preferable not to use the charge Qz when calculating the external forces. That is, the force detecting device 1C is preferably used as a device that detects a shearing force without detecting compression and tensile forces. Consequently, it is possible to reduce a noise component due to a temperature change of the force detecting device 1C.

A reason why it is preferably not to use the charge Qz during the external force detection is explained with reference to an example in which the force detecting device 1C is used in an industrial robot including an arm mounted with an end effector. In this case, the first base section 2 or the second base section 3 is heated, thermally expanded, and deformed by heat transfer from heat generation sources such as motors provided in the arm and the end effector. According to the deformation, pressurization to the charge output element 10a changes from a predetermined value. The change in the pressurization to the charge output element 10a is included as a noise component due to the temperature change of the force detecting device 1C to such a degree as to considerably affect the charge Qz.

Therefore, the charge output element 10a detects only the charges Qx and Qy generated by the application of a shearing force without using the charge Qz generated by the application of compression and tensile forces. Consequently, it is possible to further reduce the influence due to the fluctuation in temperature.

Note that the output charge Qz is used for, for example, adjustment of the pressurization by the pressurizing bolts 71.

In this embodiment, all the piezoelectric layers (the first piezoelectric layer 121, the second piezoelectric layer 123, the third piezoelectric layer 131, the fourth piezoelectric layer 133, the fifth piezoelectric layer 141, and the sixth piezoelectric layer 143) are formed of quartz. However, the piezoelectric layers may be formed of piezoelectric materials other than quartz. Examples of the piezoelectric materials other than quartz include topaz, barium titanate, lead titanate, lead zirconate titanate (PZT: $Pb(Zr, Ti)O_3$), lithium niobate, and lithium tantalate. However, the piezoelectric layers are preferably formed of quartz. This is because a piezoelectric layer formed of quartz has excellent characteristics such as a wide dynamic range, high rigidity, a high specific frequency, and high load resistance.

As explained above, the first base section 2 and the second base section 3 are fixed by the pressurizing bolts 71.

In the fixing by the pressurizing bolts 71, in a state in which the sensor devices 6 are arranged between the top surface 231 and the inner wall surface 331, the pressurizing bolts 71 are inserted from the sidewall 33 side of the second base section 3 toward the projection 21 of the first base section 2. Males screws (not shown in the figure) of the pressurizing bolts 71 are screwed in the female screws 241 formed in the first base section 2. In this way, pressure, that is, pressurization, of predetermined magnitude is applied to the charge output element 10a together with the package 60, which houses the charge output element 10a, by the first base section 2 and the second base section 3.

Note that the first base section 2 and the second base section 3 are fixed by the two pressurizing bolts 71 while being capable of being displaced (moving) by predetermined amounts each other. Since the first base section 2 and the second base section 3 are fixed to be capable of being displaced by the predetermined amounts each other, when a shearing force acts on the charge output element 10a according to the application of an external force (a shearing force) to the force detecting device 1C, a frictional force surely occurs between the layers forming the charge output element 10a. Therefore, it is possible to surely detect charges. A pressurizing direction by the pressurizing bolts 71 is a direction parallel to the laminating direction LD.

As shown in FIG. 16, in the charge output element 10a having such a configuration, the laminating direction LD inclines at an inclination angle $\epsilon$ with respect to the $\alpha 2$ axis. Specifically, the x axis of the first sensor 12 and the z axis of the third sensor 14 incline at the inclination angle $\epsilon$ with respect to the $\alpha 2$ axis. Therefore, in this embodiment, the $\alpha 2$ axis is a bisector that bisects an angle formed by the charge output element 10a of the sensor device 6A and the charge output element 10a of the sensor device 6B.

As shown in FIG. 17, when an angle formed by the x axis of the first sensor 12 and the bottom plate 22 of the first base section 2 is represented as $\eta$, the charge output elements 10a are allowed to tilt to a degree in which the angle $\eta$ satisfies $0°\eta<90°$. Note that FIG. 17 is a diagram of the charge output element 10a viewed from an arrow D direction in FIG. 16. The charge output element 10a inclined at the angle $\eta$ with respect to the $\alpha 2$ axis (the lower surface 221 of the bottom plate 22) is indicated by an imaginary line (an alternate long and two short dashes line).

Conversion Output Circuits

The conversion output circuit 90a, the conversion output circuit 90b, and the conversion output circuit 90c included in the analog circuit boards 4 are explained in detail.

As shown in FIG. 14, the conversion output circuits 90c convert any one of the charges Qx1 to Qx4 (the charge Qx) into any one of the voltages Vx1 to Vx4 (representatively referred to as "voltage Vx"). The conversion output circuits 90b convert any one of the charges Qz1 to Qz4 (the charge Qz) into any one of the voltages Vz1 to Vz4 (representatively referred to as "voltage Vz"). The conversion output circuits 90a convert any one of the charges Qy1 to Qy4 (the charge Qy) into any one of the voltages Vy1 to Vy4 (representatively referred to as "voltage Vy").

The configuration and the like of the conversion output circuits 90a, 90b, and 90c are explained in detail below. However, since the conversion output circuits 90a, 90b, and 90c have the same configuration, the conversion output circuit 90c is representatively explained below.

As shown in FIG. 14, the conversion output circuit 90c has a function of converting the charge Qx output from the charge output element 10a into the voltage Vx and outputting the voltage Vx. The conversion output circuit 90c includes the operational amplifier 91, the capacitor 92, and the switching element 93. The first input terminal (the minus input) of the operational amplifier 91 is connected to the output electrode layer 122 of the charge output element 10a. The second input terminal (the plus input) of the operational amplifier 91 is earthed to the ground (the reference potential point). Then the output terminal of the operational amplifier 91 is connected to the external-force detection circuit 40. The capacitor 92 is connected between the first input terminal and the output terminal of the operational amplifier 91. The switching element 93 is connected between the first input terminal and the output terminal of the operational amplifier 91 and connected to the capacitor 92 in parallel.

The switching element 93 is connected between the first input terminal and the output terminal of the operational amplifier 91 and connected to the capacitor 92 in parallel. A driving circuit (not shown in the figure) is connected to the switching element 93. The switching element 93 executes a switching operation according to ON and OFF signals from the driving circuit.

When the switching element 93 is off, the charge Qx output from the charge output element 10a is stored in the capacitor 92 having the capacitance C1 and output to the external-force detection circuit 40 as the voltage Vx. Subsequently, when the switching element 93 is turned on, both terminals of the capacitor 92 is short-circuited. As a result, the charge Qx stored in the capacitor 92 is discharged and decreases to 0 coulomb. The voltage V output to the external-force detection circuit 40 decreases to 0 volt. Turning on the switching element 93 is referred to as resetting the conversion output circuit 90c. Note that the voltage Vx output from an ideal conversion output circuit 90c is proportional to an accumulated amount of the charge Qx output from the charge output element 10a.

The switching element 93 is, for example, a MOSFET (Metal Oxide Semiconductor Field Effect Transistor). Besides, the switching element 93 is a semiconductor switch, an MEMS switch, or the like. Since such a switch is small and light compared with a mechanical switch, the switch is advantageous for a reduction in the size and a reduction in the weight of the force detecting device 1C. A representative example is explained below in which the MOSFET is used as the switching element 93. Note that, as shown in FIG. 14, such a switch is mounted on the conversion output circuit 90c and the conversion output circuits 90a and 90b. Besides, the switch can be mounted on the A/D converter 401 as well.

The switching element 93 includes a drain electrode, a source electrode, and a gate electrode. One of the drain electrode and the source electrode of the switching element 93 is connected to the first input terminal of the operational amplifier 91. The other of the drain electrode and the source electrode is connected to the output terminal of the operational amplifier 91. A gate electrode of the switching element 93 is connected to a driving circuit (not shown in the figure).

The same driving circuit may be connected to the switching elements 93 of the conversion output circuits 90a, 90b, and 90c or different driving circuits may be respectively connected to the switching elements 93. ON/OFF signals all synchronizing with one another are input to the switching elements 93 from the driving circuit. Consequently, the operations of the switching elements 93 of the conversion output circuits 90a, 90b, and 90c synchronize with one another. That is, ON/OFF timings of the switching elements 93 of the conversion output circuits 90a, 90b, and 90c coincide with one another.

External-Force Detection Circuit

The external-force detection circuit 40 included in the digital circuit board 5 is explained.

The external-force detection circuit 40 has a function of detecting an applied external force on the basis of the voltages Vy1, Vy2, Vy3, and Vy4 output from the conversion output circuits 90a, the voltages Vz1, Vz2, Vz3, and Vz4 output from the conversion output circuits 90b, and the voltages Vx1, Vx2, Vx3, and Vx4 output from the conversion output circuits 90c.

The external-force detection circuit 40 includes the A/D converter 401 connected to the conversion output circuits (conversion circuits) 90a, 90b, and 90c and the arithmetic unit (an arithmetic circuit) 402 connected to the A/D converter 401.

The A/D converter 401 has a function of converting the voltages Vx1, Vy1, Vz1, Vx2, Vy2, Vz2, Vx3, Vy3, Vz3, Vx4, Vy4, and Vz4 from analog signals into digital signals. The voltages Vx1, Vy1, Vz1, Vx2, Vy2, Vz2, Vx3, Vy3, Vz3, Vx4, Vy4, and Vz4 converted into the digital signals by the A/D converter 401 are input to the arithmetic unit 402.

The arithmetic unit 402 applies, to the voltages Vx, Vy, and Vz converted into the digital signals, kinds of processing such as correction for eliminating differences in sensitivities among the conversion output circuits 90a, 90b, and 90c. The arithmetic unit 402 outputs three signals proportional to accumulation amounts of the charges Qx, Qy, and Qz output from the charge output element 10a.

Force Detection in the α2-Axis, β2-Axis, and γ2-Axis Directions (a Force Detecting Method)

As explained above, the charge output elements 10a are set such that the laminating direction LD and the sandwiching direction SD are parallel to the first base section 2 (the bottom plate 22) and orthogonal to the normal $NL_2$ of the upper surface 321 (see FIG. 12).

A force $F_A$ in the α2-axis direction, a force $F_B$ in the β2-axis direction, and a force $F_C$ in the γ2-axis direction can be respectively represented by Expressions (1), (2), and (3) below. In expressions (1) to (3), "$fx_{1\text{-}1}$" represents a force applied in the x-axis direction of the first sensor 12 (the first detection plate) of the sensor device 6A, that is, a force calculated from the charge Qx1 (a first output). "$fx_{1\text{-}2}$" represents a force applied in the x-axis direction of the third sensor 14 (the second detection plate), that is, a force calculated from the charge Qy1 (a second output). "$fx_{2\text{-}1}$" represents a force applied in the x-axis direction of the first sensor 12 (the first detection plate) of the sensor device 6B, that is, a force calculated from the charge Qx2 (a third output). "$fx_{2\text{-}2}$" represents a force applied in the x-axis direction of the third sensor 14 (the second detection plate), that is, a force calculated from the charge Qy2 (a fourth output).

$$F_A = fx_{1-1} \cdot \cos\eta \cdot \cos\varepsilon - fx_{1-2} \cdot \sin\eta \cdot \cos\varepsilon - fx_{2-1} \cdot \cos\eta \cdot \cos\varepsilon + fx_{2-2} \cdot \sin\eta \cdot \cos\varepsilon \quad (1)$$

$$F_B = -fx_{1-1} \cdot \cos\eta \cdot \sin\varepsilon + fx_{1-2} \cdot \sin\eta \cdot \sin\varepsilon - fx_{2-1} \cdot \cos\eta \cdot \sin\varepsilon + fx_{2-2} \cdot \sin\eta \cdot \sin\varepsilon \quad (2)$$

$$F_C = -fx_{1-1} \cdot \sin\eta - fx_{1-2} \cdot \cos\eta - fx_{2-1} \cdot \sin\eta - fx_{2-2} \cdot \cos\eta \quad (3)$$

For example, in the case of the force detecting device 1C including the configuration shown in FIGS. 12 and 13, ε is 45° and η is 0°. When 45° is substituted in ε and 0° is substituted in η in Expressions (1) to (3), forces $F_A$ to $F_C$ are respectively calculated as shown below.

$$F_A = fx_{1-1}/\sqrt{2} - fx_{2-1}/\sqrt{2}$$

$$F_B = -fx_{1-1}/\sqrt{2} - fx_{2-1}/\sqrt{2}$$

$$F_C = -fx_{1-2} - fx_{2-2}$$

In this way, when detecting the forces $F_A$ to $F_C$, the force detecting device 1C can perform the detection without using the second sensor 13 (the charge Qz) that is easily affected by fluctuation in temperature, that is, on which noise is easily superimposed. Therefore, the force detecting device 1C is less easily affected by the fluctuation in temperature. For example, the influence of the fluctuation in temperature is reduced to 1/20 or less of the force detecting device in the past. Consequently, the force detecting device 1C can accurately stably detect the forces $F_A$ to $F_C$ even under an environment in which a temperature change is intense.

Note that translational forces $F_A$ to $F_C$ and rotational forces $M_A$ to $M_C$ of the entire force detecting device 1C in the embodiment are calculated on the basis of charges output from the charge output elements 10a. In this embodiment, the four charge output elements 10a are provided. However, if at least three charge output elements 10a are provided, it is possible to calculate the rotational forces $M_A$ to $M_C$.

A total weight of the force detecting device 1C having such a configuration is smaller than 1 Kg. Consequently, it is possible to reduce a load applied to a wrist to which the force detecting device 1C is attached and reduce a capacity of an actuator that drives the wrist. Therefore, it is possible to design the wrist to be small. Further, the weight of the force detecting device 1C is smaller than 20% of a maximum conveyance ability of a robot arm. Consequently, it is possible to facilitate control of the robot arm to which the force detecting device 1C is attached.

The package 60 that houses the charge output element 10a is explained in detail.

FIG. 18 is an enlarged longitudinal sectional view of the sensor device 6 (the charge output element 10a). FIG. 19 is a plan view of the sensor device 6 (the charge output element 10a) shown in FIG. 18. Note that, for convenience of explanation, in FIG. 18, the upper side is referred to as "up" or "upward" and the lower side in the figure is referred to as "down" or "downward". In FIG. 19, the second base section 3 is not shown.

Package

As shown in FIG. 18, the package 60 includes the supporting member (a supporting section) 61 including the recess 650 and the lid member (a conductive section) 62 joined to the supporting member 61. The charge output element 10a is hermetically sealed and blocked from the outside air by the package 60. Therefore, output charges are prevented from being unintentionally leaked by moisture or the like.

As shown in FIG. 18, the supporting member 61 is provided in contact with the top surface 231 of the projection 21 of the first base section 2. The supporting section 61 has a function of transmitting an external force applied to the first base section 2 to the charge output element 10a.

In this embodiment, a plan view shape of the supporting member 61 is a square shape but may be polygonal shape other than the square shape, a circular shape, an elliptical shape, and the like. Corners of the supporting member 61 may be rounded or may be obliquely cut out.

The supporting member 61 includes a bottom section 611 set in contact with the projection 21 and formed in a tabular shape and a sidewall section 613 erected from the bottom section 611 and formed in a square cylindrical shape. The charge output element 10a is provided in the recess 650 to be separated from an inner wall surface of the sidewall section 613.

The sidewall section 613 includes a configuration in which an outer wall section 617 provided along the outer circumference of the bottom section 611 and an inner wall section 615 located on the inner side of the outer wall section 617 and having height (length in the β2-axis direction) smaller than the height of the outer wall section 617 are integrally formed.

The lid member 62 is joined to the upper surface (the second surface of the supporting member 61) 612 of the outer wall section 617 via a seal ring 73 formed of, for example, gold, titanium, aluminum, copper, iron, or alloys containing these kinds of metal.

The lid member 62 is provided in contact with the second base section 3, and has a function of transmitting an external force applied to the second base section 3 to the charge output element 10a. Note that, the lid member 62 is in contact with the upper surface of the charge output element 10a.

The lid member 62 is formed in a dish shape as a whole by bending (or curving) and deforming the member such that the center section 625 thereof projects from the outer circumference section 626 toward the second base section 3. With such a configuration, the center section 625 of the lid member 62 is in contact with the inner wall surface 331 of the second base section 3. Note that a plan view shape of the center section 625 is not particularly limited. However, in this embodiment, the plan view shape of the center section 625 is a shape corresponding to the plan view shape of the charge output element 10a, that is, a square shape.

Since the first base section 2 and the second base section 3 are fixed by the pressurizing bolts 71, the supporting member 61 and the lid member 62 are sandwiched in the sandwiching direction SD and pressurized by the top surface 231 of the projection 21 and the inner wall surface 331 of the sidewall 33. Further, the charge output element 10a is also sandwiched in the sandwiching direction SD and pressurized by the supporting member 61 and the lid member 62 (see FIGS. 12 and 18).

In the package 60, first to third output wiring sections 91a, 91b, and 91c that respectively transmit, to the analog circuit board 4, the three charges Qx, Qy, and Qz output from the charge output element 10a and a ground wiring section 95 that grounds (earths) the charge output element 10a to the second base section 3 are provided.

On four side surfaces of the charge output element 10a, as shown in FIG. 19, a side surface electrode 15a for extracting the charge Qx, a side surface electrode 15b for extracting the charge Qy, a side surface electrode 15c for extracting the charge Qz, and a side surface electrode (a ground electrode) 15g for connecting (grounding) the charge output element 10a to the reference potential are respectively provided. Note that the side surface electrodes are formed on the side surface of the charge output element 10a by, for example, a sputtering method, a plating method, or an application method.

The side surface electrode 15a is electrically connected to the first output wiring section 91a via an electric connection section 55a. The side surface electrode 15b is electrically connected to the second output wiring section 91b via an electric connection section 55b. The side surface electrode 15c is electrically connected to the third output wiring section 91c via an electric connection section 55c. The side wall electrode 15g is electrically connected to the ground wiring section 95 via an electric connection section 55g. Note that the electric connection sections 55a, 55b, 55c, and 55g can be formed of conductive pastes such as Ag paste, Cu paste, and Au paste. However, the electric connection sections 55a, 55b, 55c, and 55g are preferably formed of the Ag paste because the Ag paste is easily acquired and is excellent in handlability.

The electric connection sections 55a, 55b, 55c, and 55g are provided in no-contact with the bottom surface 651 of the recess 650 of the package 60 and suspended between the charge output element 10a and the package 60 (see FIG. 18). Consequently, the electric connection sections 55a, 55b, 55c, and 55g can be deformed in the α2-axis direction, the β2-axis direction, and the γ2-axis direction. Therefore, even when the charge output element 10a is deformed, it is possible to prevent cracks or the like from occurring in the electric connection sections 55a, 55b, 55c, and 55g.

On the other hand, on the analog circuit board 4, as shown in FIG. 18, a signal wire 41a connected to the conversion output circuit 90a, a signal wire 41b connected to the conversion output circuit 90b, a signal wire 41c connected to the conversion output circuit 90c, and a ground wire 41g connected to the conversion output circuits 90a to 90c are provided.

The signal wire 41a is electrically connected to the first output wiring section 91a via an electric connection section 42a. The signal wire 41b is electrically connected to a second output wiring section 91b via the electric connection section 42b. The signal wire 41c is electrically connected to the third output wiring section 91c via the electric connection section 42c. The ground wire 41g is electrically connected to the ground wiring section 95 via the electric connection section 42g. Note that the electric connection sections 42a, 42b, 42c, and 42g can be formed of conductive pastes such as Ag paste, Cu paste, and Au paste.

The first to third output wiring sections 91a to 91c and the ground wiring section 95 are explained in order below. Note that, since the configurations of the first to third output wiring sections 91a to 91c are the same, the first output wiring section 91a is representatively explained.

As shown in FIG. 18, the first output wiring section 91a includes a conductor post 940a provided in a through-hole that pierces through the inner wall section 615 of the supporting member 61 in the thickness direction, an upper side electrode plate 941a connected to the upper end of the conductor post 940a and embedded in the upper surface of the inner wall section 615, and a lower side electrode plate 942a connected to the lower end of the conductor post 940a and embedded in the lower surface of the inner wall section 615. With such a configuration, a longitudinal sectional shape of the first output wiring section 91a is a shape such as an S shape (an L shape).

The upper side electrode plate 941a is exposed in the recess 650 from the upper surface of the inner wall section 615. The electric connection section 55a is connected to the upper side electrode plate 941a. On the other hand, the lower side electrode plate 942a is exposed to the outside from the lower surface of the package 60. The electric connection section 42a is connected to the lower side electrode plate 942a.

Note that the first output wiring section 91a (the conductor post 940a, the upper side electrode plate 941a, and the lower side electrode plate 942a) only has to have electric conductivity. For example, the first output wiring section 91a can be configured by laminating films of nickel, gold, silver, and copper on a metalized layer (abase layer) of chrome, tungsten, or the like.

The second output wiring section 91b includes a configuration same as the configuration of the first output wiring section 91a and includes a conductor post 940b, an upper side electrode plate 941b, and a lower side electrode plate 942b.

The upper side electrode plate 941b is exposed in the recess 650 from the upper surface of the inner wall section 615. The electric connection section 55b is connected to the upper side electrode plate 941b. On the other hand, the lower side electrode plate 942b is exposed to the outside from the lower surface of the package 60. The electric connection section 42b is connected to the lower electrode plate 942b.

The third output wiring section 91c includes a configuration same as the configuration of the first output wiring section 91a and includes a conductor post 940c, an upper side electrode plate 941c, and a lower side electrode plate 942c.

The upper side electrode plate 941c is exposed in the recess 650 from the upper surface of the inner wall section 615. The electric connection section 55c is connected to the upper side electrode plate 941c. On the other hand, the lower side electrode plate 942c is exposed to the outside from the lower surface of the package 60. The electric connection section 42c is connected to the lower electrode plate 942c.

The ground wiring section 95 includes a conductor post 940g provided in a through-hole that pierces through the inner wall section 615 of the supporting member 61 in the thickness direction, an upper side electrode plate 941g connected to the upper end of the conductor post 940g and embedded on the upper surface of the inner wall section 615, a lower side electrode plate 942g connected to the lower end of the conductor post 940g and embedded in the lower surface of the inner wall section 615, and a conductor post 943g connected to the lower side electrode plate 942g and provided in a through-hole that pierces through the outer wall section 617 of the supporting member 61 in the thickness direction. With such a configuration, a longitudinal sectional shape of the ground wiring section 95 is a U shape.

The upper side electrode plate 941g is exposed in the recess 650 from the upper surface of the inner wall section 615. The electric connection section 55g is connected to the upper side electrode plate 941g. On the other hand, the lower side electrode plate 942g is exposed to the outside from the lower surface of the package 60. The electric connection section 42g is connected to the lower electrode plate 942g.

The ground wiring section 95 (the conductor post 940g, the upper side electrode plate 941g, the lower side electrode plate 942g, and the conductor post 943g) also only has to have electric conductivity. Like the first output wiring section 91a, for example, the ground wiring section 95 can be configured by laminating films of nickel, gold, silver, and copper on a metalized layer (abase layer) of chrome, tungsten, or the like.

Note that, as explained above, the seal ring 73 is also formed of a metal material and has electric conductivity. The electric connection section 55g and the electric connection section 42g are also formed of conductive paste and have electric conductivity. Therefore, the seal ring 73, the electric connection section 55g, and the electric connection section 42g are considered to configure a part of the ground wiring section 95.

The charge output element 10a and the analog circuit board 4 are electrically connected (earthed) to the second base section 3 via the ground wiring section 95 and the lid member 62 having such configurations. In this case, the potential of the second base section 3 can be set as a reference potential of the charge output element 10a. In this way, it is possible to simplify structure by earthing both of the charge output element 10a and the analog circuit board 4 through one route. Note that it goes without saying that the analog circuit board 4 and the charge output element 10a can be earthed through separate routes.

As explained above, the second base section 3 is fixed to the first base section 2 by the pressurizing bolts 71. Therefore, when the pressurizing bolts 71 and the second base section 3 are formed of a material having electric conductivity, the charge output element 10a and the analog circuit board 4 are electrically connected (earthed) to the first base section 2. In this case, the potential of the first base section 2 can be set as the reference potential of the charge output element 10a.

As explained above, the ground wiring section (a wiring section) 95 is provided in the package 60 (the supporting member 61). Therefore, when the second base section 3 is viewed from the opposite side of the charge output element 10a, the ground wiring section (the wiring section) 95 is arranged to be included in the second base section 3. That is, the ground wiring section (the wiring section) 95 is provided to be supported by the package 60 (the supporting member 61) on the inside of the force detecting device 1C. With such a configuration, for example, even if the charge output element 10a is deformed (varies), it is possible to suitably prevent or suppress the ground wiring section 95 from being ruptured (disconnected) and reduce occurrence of a connection failure. In particular, since the sections (the members) configuring the ground wiring section 95 are not members formed in a linear shape such as a copper wire having a diameter smaller than one hundred micrometers, it is possible to surely prevent disconnection from occurring.

The ground wiring section 95 is not exposed to the outside of the first base section 2 and the second base section 3 (the force detecting device 1C). Therefore, when the force detecting device 1C is incorporated in a robot (a machine tool), such an inconvenience that the force detecting device 1C interferes with other members and the ground wiring section 95 is ruptured does not occur.

Fourth Embodiment

Figure 20:
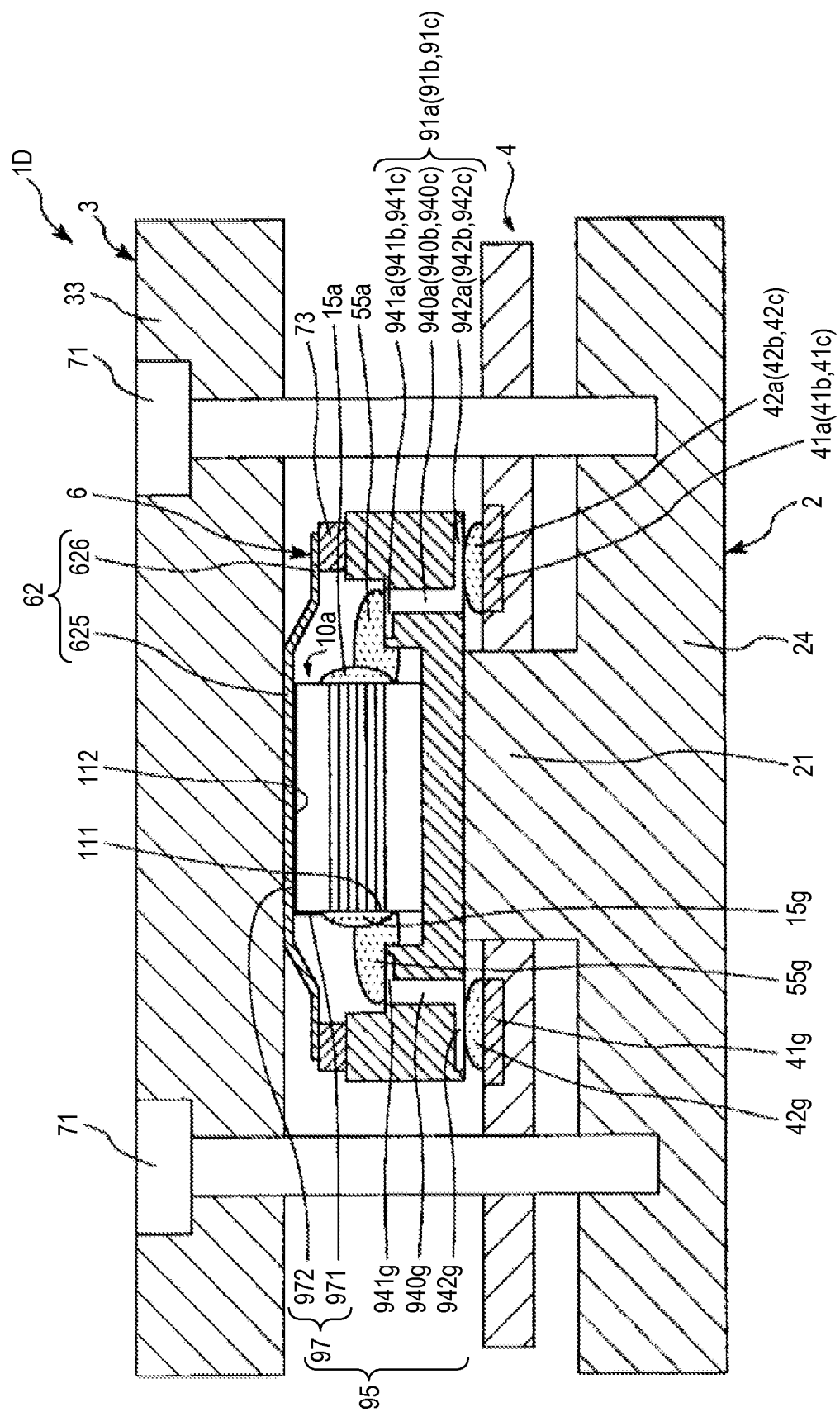
FIG. 20 is a sectional view showing a force detecting device in a fourth embodiment of the invention.

FIG. 20 is a sectional view of a force detecting device in a fourth embodiment of the invention. Note that FIG. 20 is a partially enlarged detailed view of the vicinity of a charge output element included in the force detecting device in the fourth embodiment.

The fourth embodiment of the invention is explained below with reference to the figures. Differences from the third embodiment are mainly explained. Explanation of similarities is omitted.

This embodiment is the same as the third embodiment except that the configuration of a ground wiring section is different.

The ground wiring section 95 shown in FIG. 20 includes, instead of the conductor post 943g, between the charge output element 10a and the lid member 62, a conductive layer 97 set in contact with the charge output element 10a and the lid member 62 and connected to the side surface electrode 15g.

The conductive layer 97 is formed in a sheet shape and provided in the charge output element 10a to extend from a side surface 111 to an upper surface 112 of the charge output element 10a. A cross sectional shape of the conductive layer 97 is an L shape.

The conductive layer 97 is in contact with the side surface electrode 15g in a side surface side portion 971 provided on the side surface 111 and is in contact with the lid member 62 in an upper surface side portion 972 provided on the upper surface 112 of the charge output element 10a.

With such a configuration, the charge output element 10a is electrically connected to (set in) the second base section 3 via the conductive layer 97 and the lid member 62.

The analog circuit board 4 is electrically connected to (set in) the base section 3 via the electric connection section 42a, the lower side electrode plate 942g, the conductor post 940g, the upper side electrode plate 941g, the electric connection section 55g, the side surface electrode 15g, the conductive layer 97, and the lid member 62.

A force detecting device 1D in the forth embodiment including the configuration explained above attains action and effects same as the action and the effects of the force detecting device 1C in the third embodiment.

Fifth Embodiment (A Single-Arm Robot)

A single-arm robot, which is an example of a robot in a fifth embodiment of the invention, is explained with reference to FIG. 21.

Figure 21:
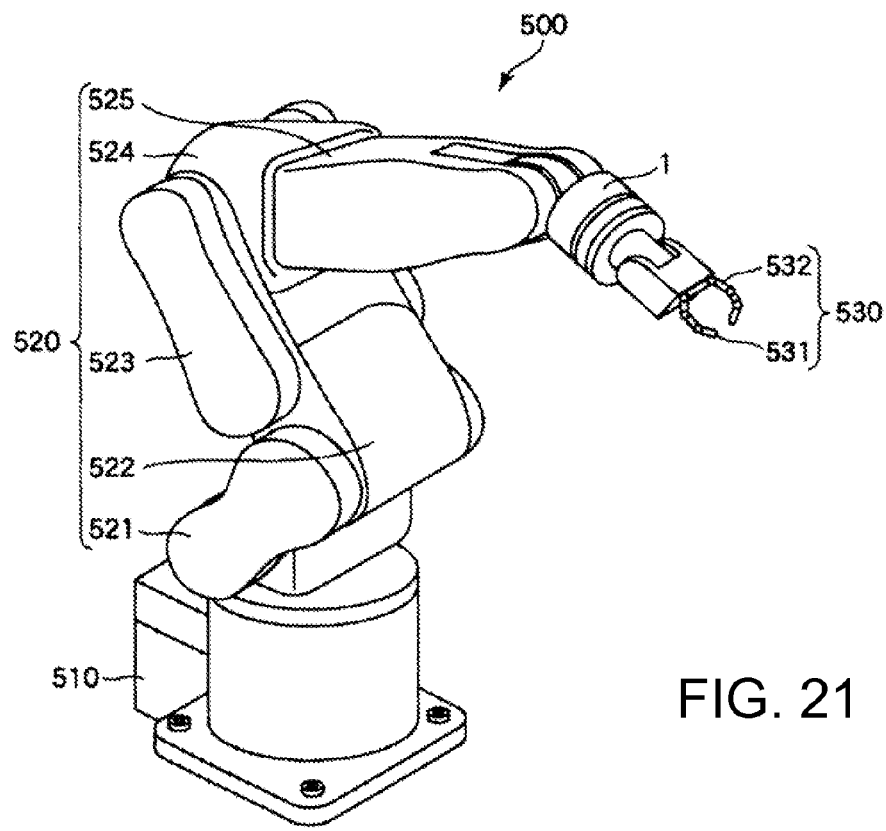
FIG. 21 is a diagram showing an example of a single-arm robot including the force detecting device in a fifth embodiment of the invention.

FIG. 21 is a diagram of an example of a single-arm robot including a force detecting device in the fifth embodiment of the invention. A single-arm robot 500 shown in FIG. 21 includes a base 510, an arm 520, an end effector 530 provided on the distal end side of the arm 520, and a force detecting device 1 provided between the arm 520 and the end effector 530.

Note that, as the force detecting device 1, any one of the force detecting device 1A in the first embodiment, the force detecting device 1B in the second embodiment, the force detecting device 1C in the third embodiment, and the force detecting device 1D in the fourth embodiment is used.

The base 510 has a function of housing an actuator (not shown in the figure) that generates power for turning the arm 520, a control unit (not shown in the figure) that controls the actuator, and the like. The base 510 is fixed to, for example, a floor, a wall, a ceiling, or a movable wagon.

The arm 520 includes a first arm element 521, a second arm element 522, a third arm element 523, a fourth arm element 524, and a fifth arm element 525. The arm 520 is configured by turnably coupling arms adjacent to one another. The arm 520 rotates or bends in a complex manner about coupling sections of the arm elements to be driven according to the control by the control section.

The end effector 530 has a function of gripping a target object. The end effector 530 includes a first finger 531 and a second finger 532. After reaching a predetermined operation position according to the driving of the arm 520, the end effector 530 can grip the target object by adjusting a clearance between the first finger 531 and the second finger 532.

Note that the end effector 530 is a hand. However, in the invention, the end effector 530 is not limited to the hand. Other examples of the end effector include an instrument for component inspection, an instrument for component conveyance, an instrument for component machining, an instrument for component assembly, and a measuring device. The same applies to end effectors in other embodiments.

The force detecting device 1 has a function of detecting an external force applied to the end effector 530. The single-arm robot 500 can execute more precise work by feeding back a force detected by the force detecting device 1 to the control unit of the base 510. The single-arm robot 500 can detect, according to the force detected by the force detecting device 1, for example, contact of the end effector 530 with an obstacle. Therefore, the single-arm robot 500 can easily perform an obstacle avoiding operation, a target object damage avoiding operation, and the like, which are difficult in the position control in the past. The single-arm robot 500 can more safely execute work.

Note that, in the configuration shown in the figure, the arm 520 is configured by the five arm elements in total. However, the invention is not limited to this. A configuration in which the arm 520 is configured by one arm element, a configuration in which the arm 520 is configured by two to four arm elements, and a configuration in which the arm 520 is configured by six or more arm elements are also within the scope of the invention.

Sixth Embodiment (A Double-Arm Robot)

A double-arm robot, which is an example of a robot in a sixth embodiment of the invention, is explained below with reference to FIG. 22.

Figure 22:
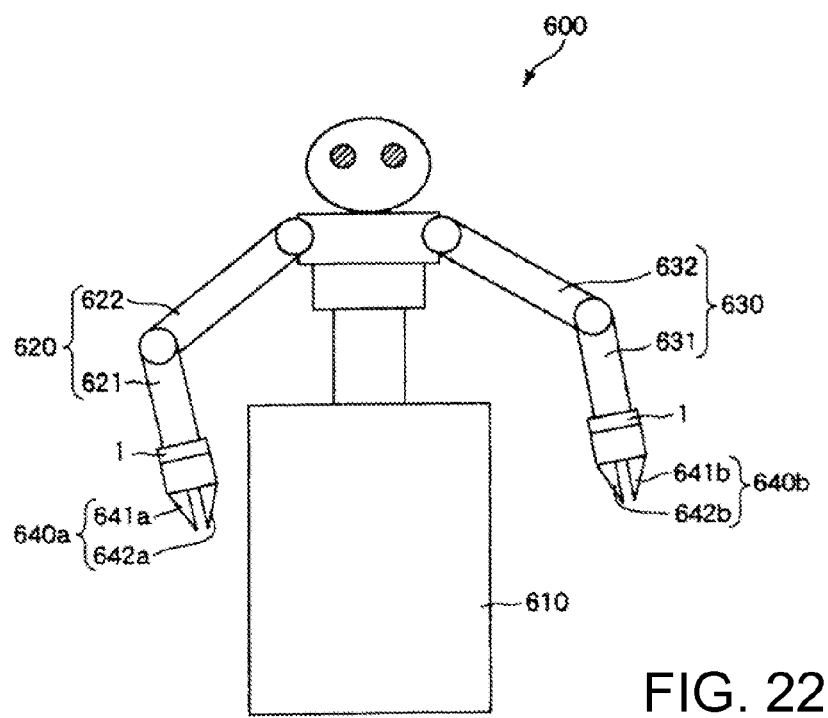
FIG. 22 is a diagram showing an example of a double-arm robot including a force detecting device in a sixth embodiment of the invention.

FIG. 22 is a diagram of an example of a double-arm robot including a force detecting device in the sixth embodiment of the invention. A double-arm robot 600 shown in FIG. 22 includes a base 610, a first arm 620, a second arm 630, a first end effector 640a provided on the distal end side of the first arm 620, a second end effector 640b provided on the distal end side of the second arm 630, and force detecting devices 1 provided between the first arm 620 and the first end effector 640a and between the second arm 630 and the second end effector 640b.

Note that, as the force detecting devices 1, any one of the force detecting device 1A in the first embodiment, the force detecting device 1B in the second embodiment, the force detecting device 1C in the third embodiment, and the force detecting device 1D in the fourth embodiment is used.

The base 610 has a function of housing an actuator (not shown in the figure) that generates power for turning the first arm 620 and the second arm 630, a control unit (not shown in the figure) that controls the actuator, and the like. The base 610 is fixed to, for example, a floor, a wall, a ceiling, or a movable wagon.

The first arm 620 is configured by turnably coupling a first arm element 621 and a second arm element 622. The second arm 630 is configured by turnably coupling a first arm element 631 and a second arm element 632. The first arm 620 and the second arm 630 rotate or bend in a complex manner about coupling sections of the arm elements to be driven according to the control by the control section.

The first and second end effectors 640a and 640b have a function of gripping a target object. The first end effector 640a includes a first finger 641a and a second finger 642a. The second end effector 640b includes a first finger 641b and a second finger 642b. After reaching a predetermined operation position according to the driving of the first arm 620, the first end effector 640a can grip the target object by adjusting a clearance between the first finger 641a and the second finger 642a. Similarly, after reaching a predetermined operation position according to the driving of the second arm 630, the second end effector 640b can grip the target object by adjusting a clearance between the first finger 641b and the second finger 642b.

The force detecting devices 1 have a function of detecting external forces applied to the first and second end effectors 640a and 640b. The double-arm robot 600 can more precisely execute work by feeding back forces detected by the force detecting devices 1 to the control unit of the base 610. The double-arm robot 600 can detect, according to the forces detected by the force detecting devices 1, for example, contact of the first and second end effectors 640a and 640b with an obstacle. Therefore, the double-arm robot 600 can easily perform an obstacle avoiding operation, a target object damage avoiding operation, and the like, which are difficult in the position control in the past. The double-arm robot 600 can more safely execute work.

Note that, in the configuration shown in the figure, the double-arm robot 600 includes the two arms. However, the invention is not limited to this. The double-arm robot 600 including three or more arms is also within the scope of the invention.

Seventh Embodiment (An Electronic Component Inspecting Apparatus and an Electronic Component Conveying Apparatus)

An electronic component inspecting apparatus and an electronic component conveying apparatus in a seventh embodiment of the invention are explained with reference to FIGS. 23 and 24.

Figure 23:
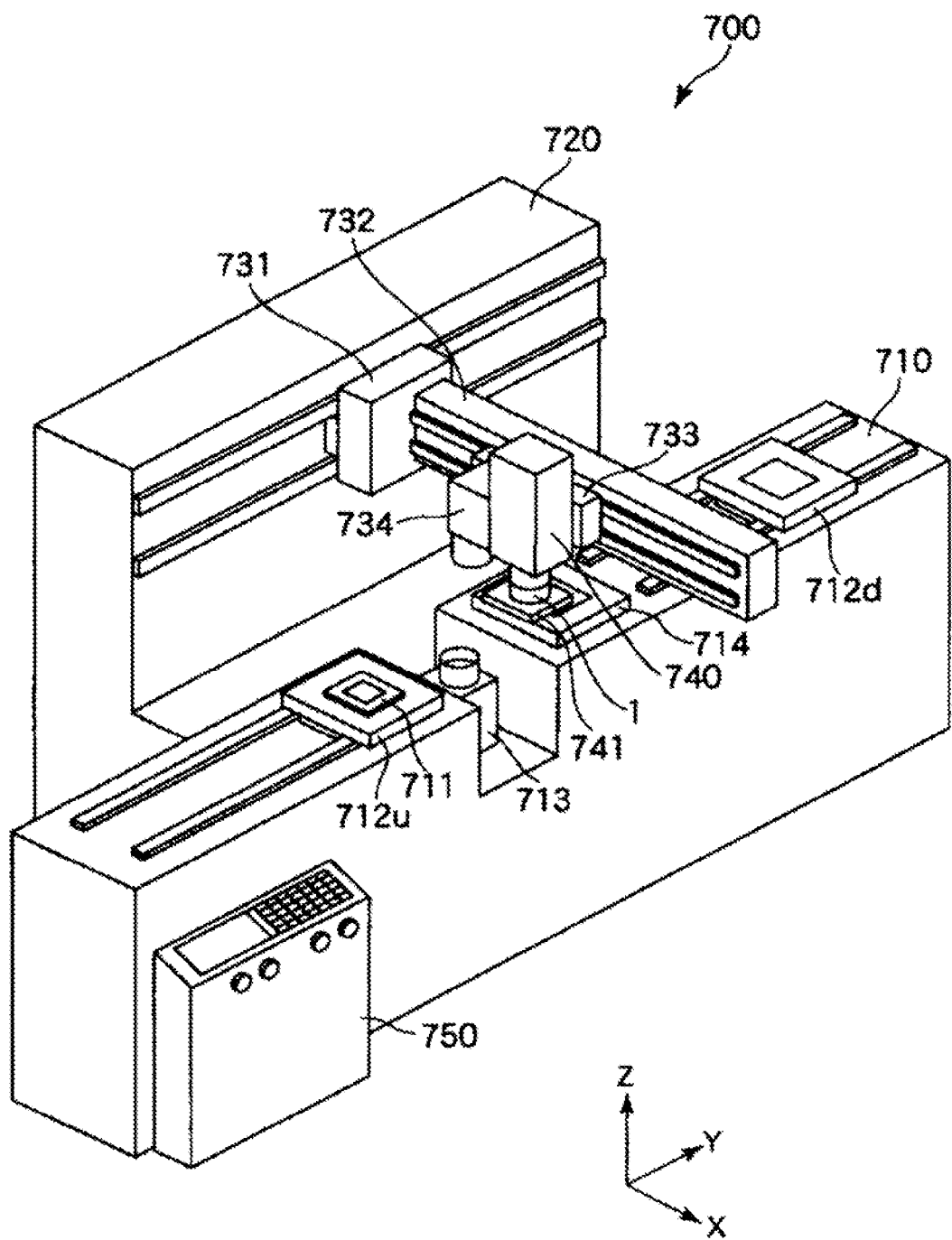
FIG. 23 is a diagram showing an example of an electronic component inspecting apparatus and an electronic component conveying apparatus including a force detecting device in a seventh embodiment of the invention.

FIG. 23 is a diagram showing an example of an electronic component inspecting apparatus and an electronic component conveying apparatus including a force detecting device in the seventh embodiment of the invention. FIG. 24 is a diagram showing an example of the electronic component conveying apparatus including the force detecting device in the seventh embodiment of the invention.

An electronic component inspecting apparatus 700 shown in FIG. 23 includes a base 710 and a supporting table 720 erected on a side surface of the base 710. On the upper surface of the base 710, an upstream side stage 712u on which an inspection target electronic component 711 is placed and conveyed and a downstream side stage 712d on which the inspected electronic component 711 is placed and conveyed are provided. Between the upstream side stage 712u and the downstream side stage 712d, an image pickup device 713 for checking the posture of the electronic component 711 and an inspection table 714 on which the electronic component 711 is set to inspect electric characteristics are provided. Note that examples of the electronic component 711 include a semiconductor, a semiconductor wafer, display devices such as an LCD and an OLED, a liquid crystal device, various sensors, an inkjet head, and various MEMS devices.

In the supporting table 720, a Y stage 731 is provided to be movable in a direction (a Y direction) parallel to the upstream side stage 712u and the downstream side stage 712d of the base 710. An arm section 732 is extended from the Y stage 731 in a direction (an X direction) toward the base 710. On a side surface of the arm section 732, an X stage 733 is provided to be movable in the X direction. In the X stage 733, an image pickup camera 734 and an electronic component conveying apparatus 740 incorporating a Z stage movable in the up down direction (a Z direction) are provided. A gripping section 741 that grips the electronic component 711 is provided at the distal end side of the electronic component conveying apparatus 740. The force detecting device 1 is provided between the distal end of the electronic component conveying apparatus 740 and the gripping section 741. Further, on the front surface side of the base 710, a control device 750 that controls the operation of the entire electronic component inspecting apparatus 700 is provided.

Note that, as the force detecting device 1, any one of the force detecting device 1A in the first embodiment, the force detecting device 1B in the second embodiment, the force detecting device 1C in the third embodiment, and the force detecting device 1D in the fourth embodiment is used.

The electronic component inspecting apparatus 700 performs inspection of the electronic component 711 as explained below. First, the inspection target electronic component 711 is placed on the upstream side stage 712u and moved to near the inspection table 714. Subsequently, the electronic component inspecting apparatus 700 moves the Y stage 731 and the X stage 733 to move the electronic component conveying apparatus 740 to a position right above the electronic component 711 placed on the upstream side stage 712*u*. In this case, the electronic component inspecting apparatus 700 can check the position of the electronic component 711 using the image pickup camera 734. The electronic component inspecting apparatus 700 lowers the electronic component conveying apparatus 740 using the Z stage incorporated in the electronic component conveying apparatus 740. After gripping the electronic component 711 with the gripping section 741, the electronic component inspecting apparatus 700 directly moves the electronic component conveying apparatus 740 to above the image pickup device 713. The electronic component inspecting apparatus 700 checks the posture of the electronic component 711 using the image pickup device 713. The electronic component inspecting apparatus 700 adjusts the posture of the electronic component 711 using a fine adjustment mechanism incorporated in the electronic component conveying apparatus 740. After moving the electronic component conveying apparatus 740 to above the inspection table 714, the electronic component inspecting apparatus 700 moves the Z stage incorporated in the electronic component conveying apparatus 740 and sets the electronic component 711 on the inspection table 714. Since the posture of the electronic component 711 is adjusted using the fine adjustment mechanism in the electronic component conveying apparatus 740, it is possible to set the electronic component 711 in a correct position of the inspection table 714. After finishing the inspection of the electric characteristics of the electronic component 711 using the inspection table 714, the electronic component inspecting apparatus 700 lifts the electronic component 711 from the inspection table 714. The electronic component inspecting apparatus 600 moves the Y stage 731 and the X stage 733, moves the electronic component conveying apparatus 740 to over the downstream side stage 712*d*, and places the electronic component 711 on the downstream side stage 712*d*. Finally, the electronic component inspecting apparatus 700 moves the downstream side stage 712*d* and conveys the electronic component 711, for which the inspection ends, to a predetermined position.

Figure 24:
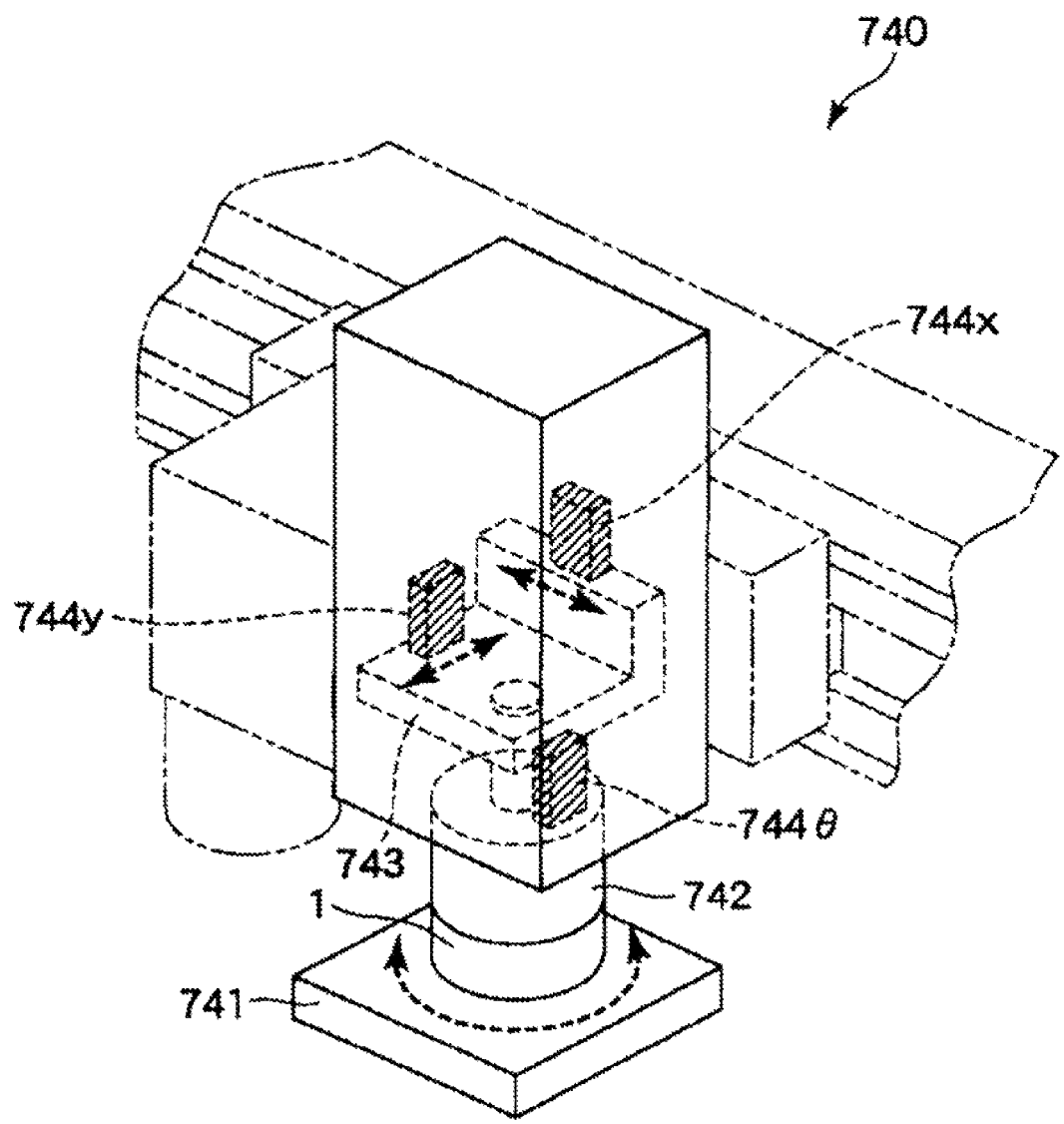
FIG. 24 is a diagram showing an example of the electronic component conveying apparatus including the force detecting device in the seventh embodiment of the invention.

FIG. 24 is a diagram showing the electronic component conveying apparatus 740 including the force detecting device 1. The electronic component conveying apparatus 740 includes a griping section 741, the force detecting device 1 connected to the gripping section 741, a rotating shaft 742 connected to the gripping section 741 via the force detecting device 1, and a fine adjustment plate 743 turnably attached to the rotating shaft 742. The fine adjustment plate 743 is movable in the X direction and the Y direction while being guided by a guide mechanism (not shown in the figure).

A piezoelectric motor 744θ for a rotating direction is mounted to face an end face of the rotating shaft 742. A driving projection (not shown in the figure) of the piezoelectric motor 744θ is pressed against the end face of the rotating shaft 742. Therefore, by causing the piezoelectric motor 744θ to operate, it is possible to rotate the rotating shaft 742 (and the gripping section 741) in a θ direction by any angle. A piezoelectric motor 744*x* for the X direction and a piezoelectric motor 744*y* for the Y direction are provided to face the fine adjustment plate 743. Driving projections (not shown in the figure) of the piezoelectric motor 744*x* and the piezoelectric motor 744*y* are pressed against the surface of the fine adjustment plate 743. Therefore, by causing the piezoelectric motor 744*x* to operate, it is possible to move the fine adjustment plate 743 (and the gripping section 741) in the X direction by any distance. Similarly, by causing the piezoelectric motor 744*y* to operate, it is possible to move the fine adjustment plate 743 (and the gripping section 741) in the Y direction by any distance.

The force detecting device 1 has a function of detecting an external force applied to the gripping section 741. The electronic component conveying apparatus 740 and the electronic component inspecting apparatus 700 can more precisely execute work by feeding back a force detected by the force detecting device 1 to the control device 750. The electronic component conveying apparatus 740 and the electronic component inspecting apparatus 700 can detect, according to the force detected by the force detecting device 1, for example, contact of the gripping section 741 with an obstacle. Therefore, the electronic component conveying apparatus 740 and the electronic component inspecting apparatus 700 can easily perform an obstacle avoiding operation, a target object damage avoiding operation, and the like, which are difficult in the position control in the past. The electronic component conveying apparatus 740 and the electronic component inspecting apparatus 700 can execute safer work.

Eighth Embodiment (A Component Machining Apparatus)

A component machining apparatus in an eight embodiment of the invention is explained below with reference to FIG. 25.

Figure 25:
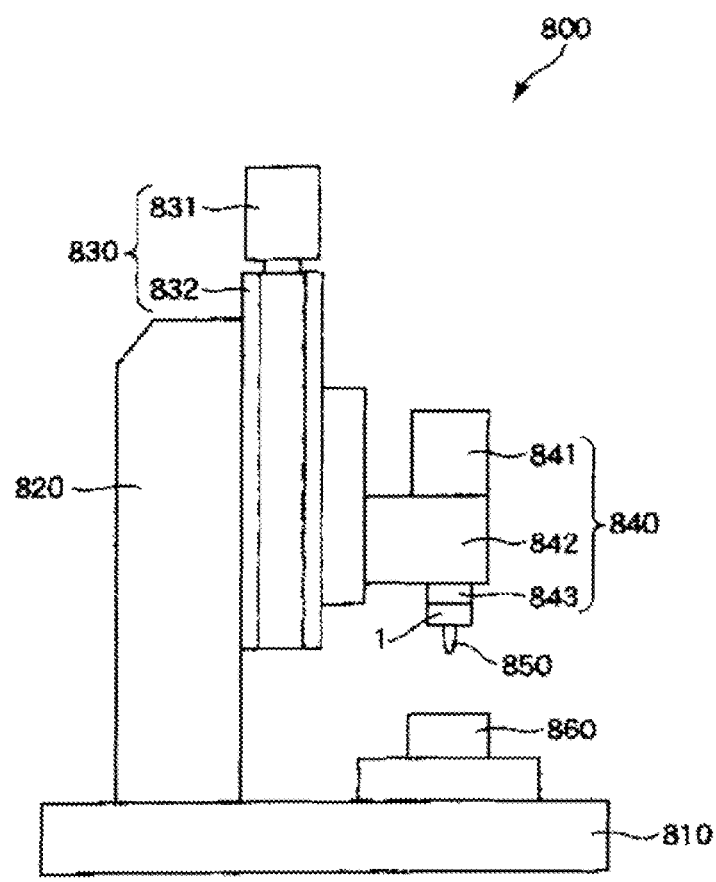
FIG. 25 is a diagram showing an example of a component machining apparatus including a force detecting device in an eighth embodiment of the invention.

FIG. 25 is a diagram showing an example of a component machining apparatus including a force detecting device in the eighth embodiment of the invention. A component machining apparatus 800 shown in FIG. 25 includes a base 810, a column 820 formed to stand on the upper surface of the base 810, a feeding mechanism 830 provided on a side surface of the column 820, a tool displacing section 840 vertically movably attached to the feeding mechanism 830, the force detecting device 1 connected to the tool displacing section 840, and a tool 850 mounted on the tool displacing section 840 via the force detecting device 1.

Note that, as the force detecting device 1, any one of the force detecting device 1A in the first embodiment, the force detecting device 1B in the second embodiment, the force detecting device 1C in the third embodiment, and the force detecting device 1D in the fourth embodiment is used.

The base 810 is a table for placing and fixing a component to be machined 860. The column 820 is a pillar for fixing the feeding mechanism 830. The feeding mechanism 830 has a function of lifting and lowering the tool displacing section 840. The feeding mechanism 830 includes a feeding motor 831 and a guide 832 that lifts and lowers the tool displacing section 840 on the basis of an output from the feeding motor 831. The tool displacing section 840 has a function of applying displacement such as rotation or vibration to the tool 850. The tool displacing section 840 includes a displacing motor 841, a tool attaching section 843 provided at the distal end of a spindle (not shown in the figure) coupled to the displacing motor 841, and a holding section 842 that holds the spindle attached to the tool displacing section 840. The tool 850 is attached to the tool attaching section 843 of the tool displacing section 840 via the force detecting device 1. The tool 850 is used for machining the component to be machined 860 according to the displacement applied from the tool displacing section 840. The tool 850 is not particularly limited. However, the tool 850 is, for example, a wrench, a Phillips head screwdriver, a flathead screwdriver, a cutter, a circular saw, a nipper, an auger, a drill, or a milling cutter.

The force detecting device 1 has a function of detecting an external force applied to the tool 850. The component machining apparatus 800 can more precisely execute component machining work by feeding back an external force detected by the force detecting device 1 to the feeding motor 831 and the displacing motor 841. The component machining apparatus 800 can detect, according to the external force detected by the force detecting device 1, for example, contact of the tool 850 with an obstacle. Therefore, the component machining apparatus 800 can urgently stop when an obstacle or the like comes into contact with the tool 850. The component machining apparatus 800 can execute safer component machining work.

Ninth Embodiment (A Mobile Body)

A mobile body in a ninth embodiment of the invention is explained with reference to FIG. 26.

Figure 26:
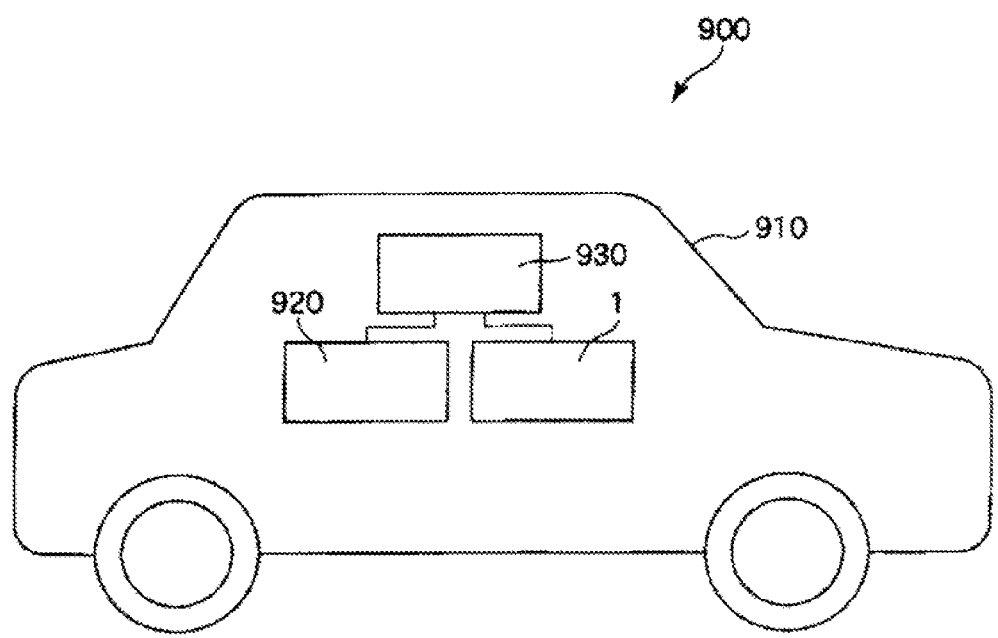
FIG. 26 is a diagram showing an example of a mobile body including a force detecting device in a ninth embodiment of the invention.

FIG. 26 is a diagram showing an example of a mobile body including a force detecting device in the ninth embodiment of the invention. A mobile body 900 shown in FIG. 26 can move with given power. The mobile body 900 is not particularly limited. However, the mobile body 900 is, for example, vehicles such as an automobile, a motorcycle, an airplane, a ship, and a train and robots such as a bipedal walking robot and a wheel moving robot.

The mobile body 900 includes a main body 910 (e.g., a housing of a vehicle or a main body of a robot), a power unit 920 that supplies power for moving the main body 910, the force detecting device 1 that detects an external force generated by the movement of the main body 910, and a control unit 930.

Note that, as the force detecting device 1, any one of the force detecting device 1A in the first embodiment, the force detecting device 1B in the second embodiment, the force detecting device 1C in the third embodiment, and the force detecting device 1D in the fourth embodiment is used.

When the main body 910 moves with power supplied from the power unit 920, vibration, acceleration, and the like occur according to the movement. The force detecting device 1 detects an external force due to the vibration, the acceleration, and the like that occurs according to the movement. The external force detected by the force detecting device 1 is transmitted to the control unit 930. The control unit 930 can execute control such as posture control, vibration control, and acceleration control by controlling the power unit 920 and the like according to the external force transmitted from the force detecting device 1.

The sensor device, the force detecting device, the robot, the electronic component conveying apparatus, the electronic component inspecting apparatus, and the component machining apparatus in the embodiments of the invention are explained above with reference to the drawings. However, the invention is not limited to the embodiments. The components of the units can be replaced with any components having the same functions. Any other components may be added to the invention.

The invention may be a combination of any two or more components (characteristics) in the embodiments.

In the invention, the package 60, that is, the first member (the supporting member 61) and the second member (the lid member 62) may be omitted.

In the invention, the charge output element 10 may protrude from the projection 21 in plan view of the first board (the first base section) 2.

In the embodiments, as the element that outputs a signal according to an external force, the element including the piezoelectric body is used. However, in the invention, the element is not limited to this as long as an output changes according to an applied external force. Besides, examples of the element include an element including a pressure sensitive conductor.

In the invention, instead of the pressurizing bolt, for example, a bolt not having the function of applying pressurization to the element may be used. A fixing method other than the bolt may be adopted.

The robot according to the invention is not limited to an arm type robot (a robot arm) as long as the robot includes an arm. The robot may be robots of other types such as a scalar robot and a leg-type walking (mobile) robot.

The force detecting device (the sensor device) according to the invention is not limitedly applied to the robot, the electronic component conveying apparatus, the electronic component inspecting apparatus, the component machining apparatus, and the mobile body and can be applied to other apparatuses such as other conveying apparatuses, other inspecting apparatuses, measurement apparatuses such as a vibrometer, an accelerometer, a gravimeter, a dynamometer, a seismometer, and a climometer, and an input apparatus.

What is claimed is:
1. A sensor device comprising:
a plurality of piezoelectric bodies;
one of a plurality of internal electrodes formed between two of the plurality of piezoelectric bodies;
a package including an output terminal and configured to house the piezoelectric bodies;
a first conductive member electrically connected to the plurality of internal electrodes; and
a second conductive member configured to electrically connect the first conductive member and the output terminal and having a modulus of elasticity lower than a modulus of elasticity of the first conductive member.

2. The sensor device according to claim 1, wherein a Young's modulus of the first conductive member is equal to or higher than 3.4 GPa and equal to or lower than 5.0 GPa and a Young's modulus of the second conductive member is equal to or higher than 0.1 GPa and equal to or lower than 0.2 GPa.

3. The sensor device according to claim 1, wherein
the first conductive member and the second conductive member are formed of paste like materials including fillers having electric conductivity, and
a content percentage of the filler of the first conductive member is larger than a content percentage of the filler of the second conductive member.

4. The sensor device according to claim 1, wherein the internal electrode is formed in a film shape and the thickness of the internal electrode is equal to or larger than 20 nm and equal to or smaller than 100 nm.

5. The sensor device according to claim 1, wherein
the package includes a recess in which the piezoelectric bodies are housed and the depth of which changes stepwise, the recess including a step section in which the output terminal is provided, and
the second conductive material is connected to the step section.

6. A force detecting device comprising:
a sensor device including:
a plurality of piezoelectric bodies;
one of a plurality of internal electrodes formed between two of the plurality of piezoelectric bodies;

a package including an output terminal and configured to house the piezoelectric bodies;

a first conductive member electrically connected to the plurality of internal electrodes; and a second conductive member configured to electrically connect the first conductive member and the output terminal and having a modulus of elasticity lower than a modulus of elasticity of the first conductive member; and an external-force detection circuit configured to detect, on the basis of a voltage output from the sensor device, an external force applied to the sensor device.

7. A robot comprising:

at least one arm coupling body including a plurality of arms and configured by turnably coupling the arms adjacent to one another of the plurality of arms;

an end effector provided on a distal end side of the arm coupling body; and the force detecting device according to claim 6 provided between the arm coupling body and the end effector and configured to detect an external force applied to the end effector.

8. An electronic component conveying apparatus comprising:

a gripping section configured to grip an electronic component; and the force detecting device according to claim 6 configured to detect an external force applied to the gripping section.

9. An electronic component inspecting apparatus comprising:

a griping section configured to grip an electronic component;

an inspecting section configured to inspect the electronic component; and the force detecting device according to claim 6 configured to detect an external force applied to the gripping section.

10. A component machining apparatus comprising:

a tool displacing section configured to be mounted with a tool and displace the tool; and the force detecting device according to claim 6 configured to detect an external force applied to the tool.

* * * * *